(12) United States Patent
Matsuoka et al.

(10) Patent No.: US 12,075,581 B2
(45) Date of Patent: Aug. 27, 2024

(54) SUPPORTING BODY AND DISPLAY APPARATUS

(71) Applicant: SATURN LICENSING LLC, New York, NY (US)

(72) Inventors: Hiroki Matsuoka, Tokyo (JP); Masaki Fukano, Tokyo (JP); Toshiaki Takahashi, Tokyo (JP); Hiroyuki Takayama, Tokyo (JP); Makoto Kikuchi, Tokyo (JP); Tsuyoshi Iwatsuki, Tokyo (JP); Hiroaki Yokota, Tokyo (JP); Shigeya Kuwao, Tokyo (JP); Hiroyuki Suzukawa, Tokyo (JP)

(73) Assignee: SATURN LICENSING LLC, New York, NY (US)

( * ) Notice: Subject to any disclaimer, the term of this patent is extended or adjusted under 35 U.S.C. 154(b) by 234 days.

(21) Appl. No.: 17/757,905

(22) PCT Filed: Dec. 17, 2020

(86) PCT No.: PCT/JP2020/047296
§ 371 (c)(1),
(2) Date: Jun. 23, 2022

(87) PCT Pub. No.: WO2021/132041
PCT Pub. Date: Jul. 1, 2021

(65) Prior Publication Data
US 2023/0030565 A1 Feb. 2, 2023

(30) Foreign Application Priority Data

Dec. 26, 2019 (JP) ................................ 2019-235743
Oct. 6, 2020 (JP) ................................ 2020-169449

(51) Int. Cl.
*F16M 11/00* (2006.01)
*H05K 5/00* (2006.01)
*H05K 5/02* (2006.01)

(52) U.S. Cl.
CPC ......... *H05K 5/0234* (2013.01); *H05K 5/0018* (2022.08); *H05K 5/0204* (2013.01)

(58) Field of Classification Search
CPC .. H05K 5/0234; H05K 5/0018; H05K 5/0204; G02F 1/133308; G09F 9/00; H04N 5/64
See application file for complete search history.

(56) References Cited

U.S. PATENT DOCUMENTS

2002/0014619 A1* 2/2002 Christensen .............. E01F 9/70
256/25
2018/0302995 A1 10/2018 Hasegawa et al.
(Continued)

FOREIGN PATENT DOCUMENTS

EP 3389033 A1 10/2018
JP 2004-086046 A 3/2004
(Continued)

OTHER PUBLICATIONS

International Search Report and Written Opinion of PCT Application No. PCT/JP2020/047296, issued on Mar. 9, 2021, 10 pages of ISRWO.

*Primary Examiner* — Amy J. Sterling
(74) *Attorney, Agent, or Firm* — Richard LaPeruta

(57) ABSTRACT

There is provided a supporting body that is able to select a form of support to a display unit in accordance with a user's purpose or preference, an installation environment, or the like. The supporting body supports the display unit, and includes a first supporting unit and a second supporting unit that are detachably provided on the display unit, and a first form and a second form are configured to be selectable. In the first form, the first supporting unit is mounted at a first (Continued)

position of the display unit and the second supporting unit is mounted at a second position of the display unit. In the second form, the second supporting unit is mounted at the first position or a third position of the display unit, and the first supporting unit is mounted at the second position or a fourth position of the display unit.

23 Claims, 32 Drawing Sheets

(56) References Cited

U.S. PATENT DOCUMENTS

| | | | |
|---|---|---|---|
| 2021/0267078 A1* | 8/2021 | Wang | F16M 11/16 |
| 2021/0329802 A1* | 10/2021 | Kim | G02F 1/133308 |
| 2023/0284407 A1* | 9/2023 | Kim | H05K 5/0234 |
| | | | 361/807 |

FOREIGN PATENT DOCUMENTS

| | | |
|---|---|---|
| JP | 2010-015098 A | 1/2010 |
| JP | 2012-141385 A | 7/2012 |
| JP | 2013-030499 A | 2/2013 |
| JP | 2019-120709 A | 7/2019 |
| WO | 2017/098711 A1 | 6/2017 |
| WO | 2019/130658 A1 | 7/2019 |

* cited by examiner

[ FIG. 1A ]
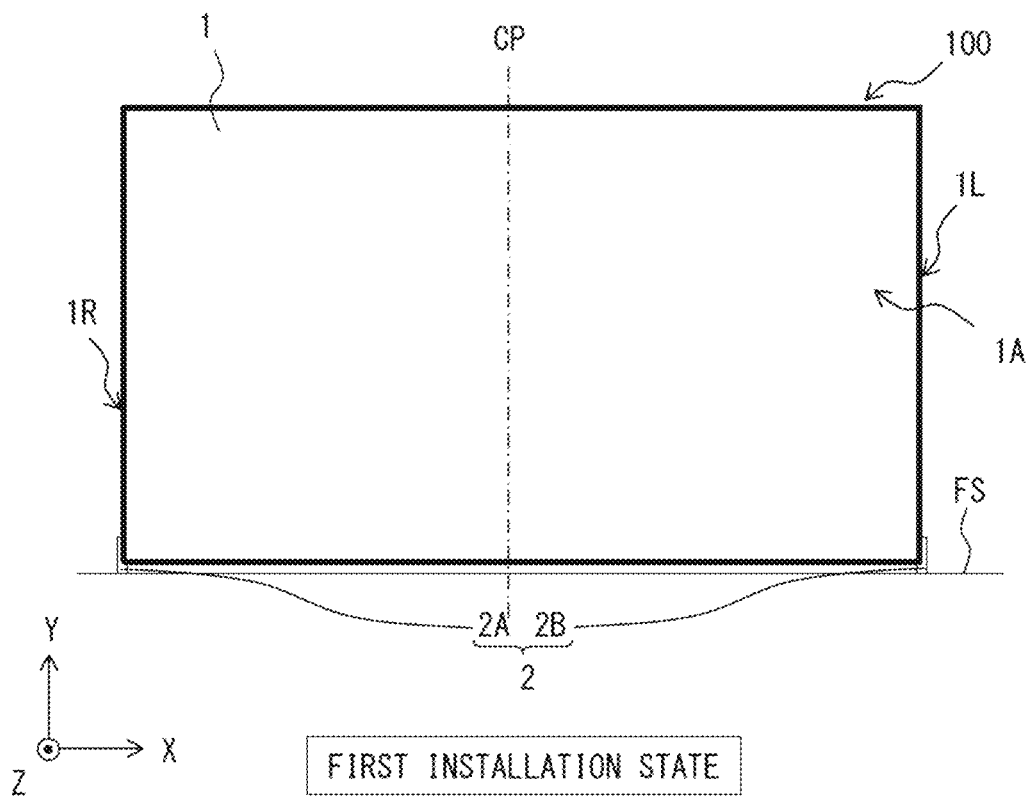
FIRST INSTALLATION STATE
[ FIG. 1B ]
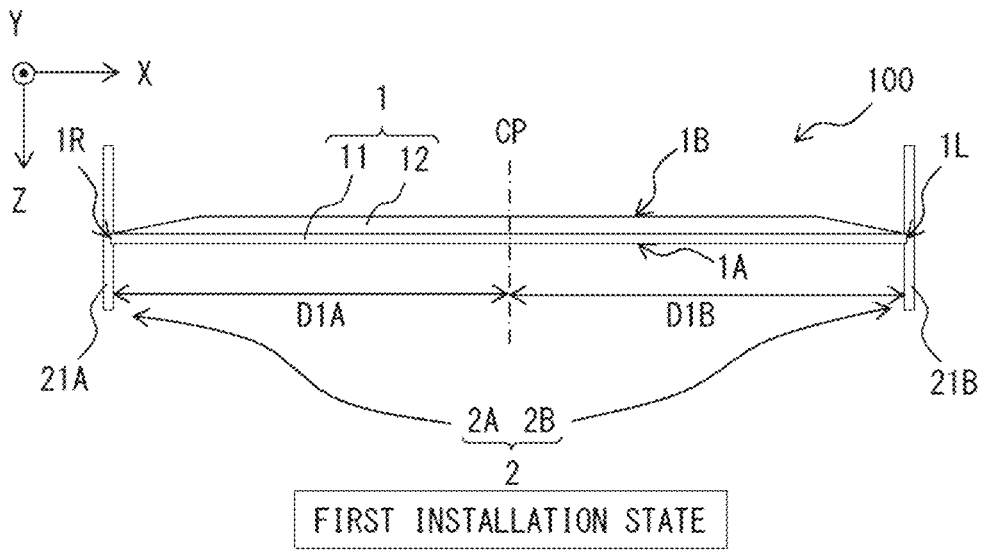
FIRST INSTALLATION STATE

[FIG. 2A]
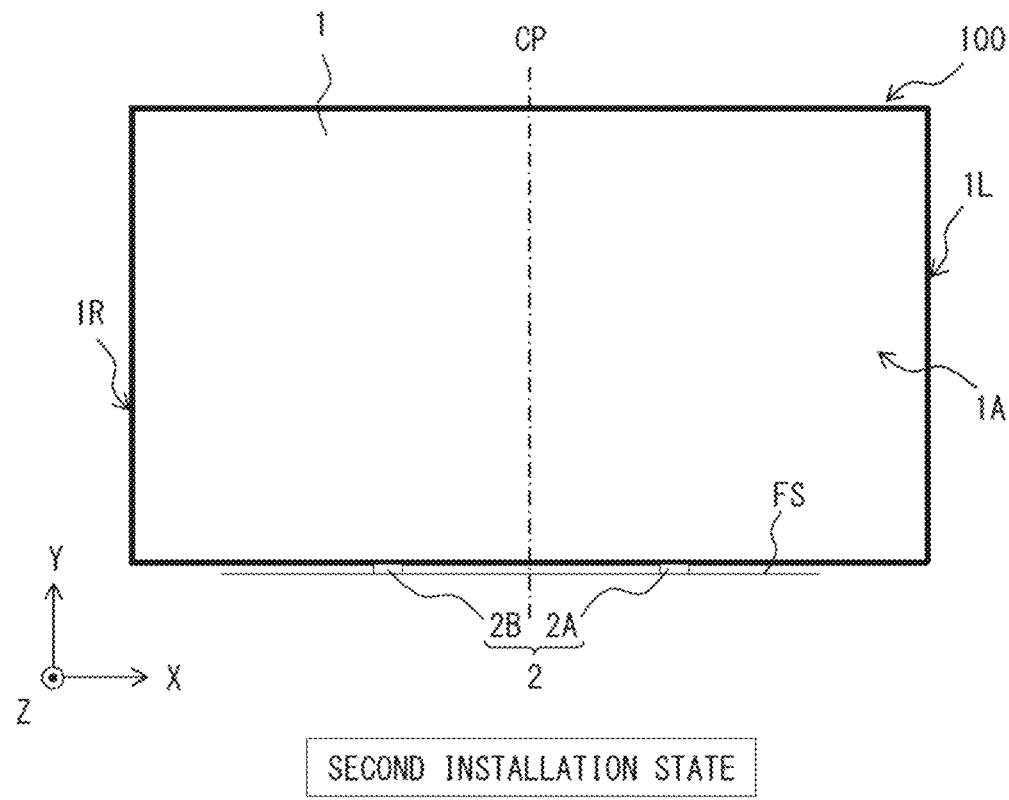
SECOND INSTALLATION STATE
[FIG. 2B]
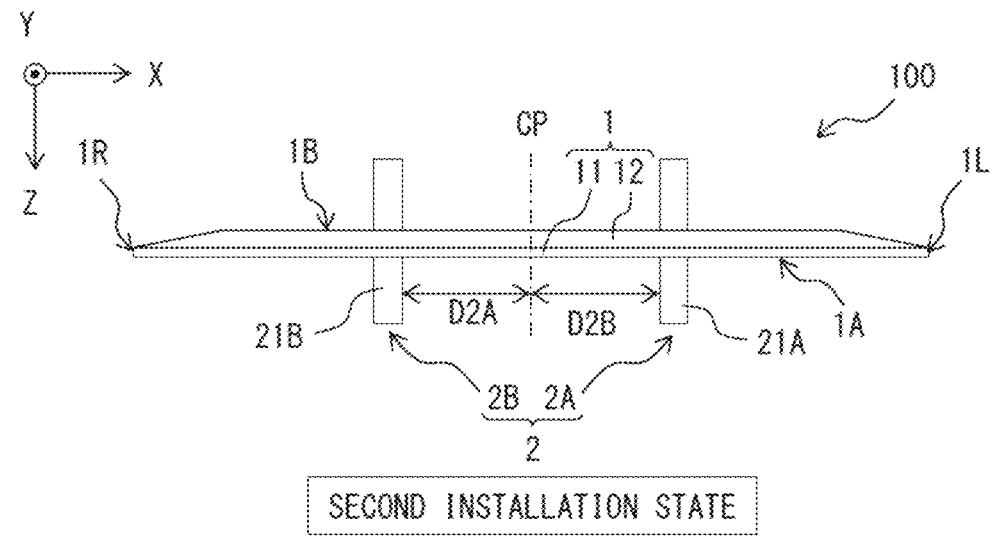
SECOND INSTALLATION STATE

[ FIG. 3 ]
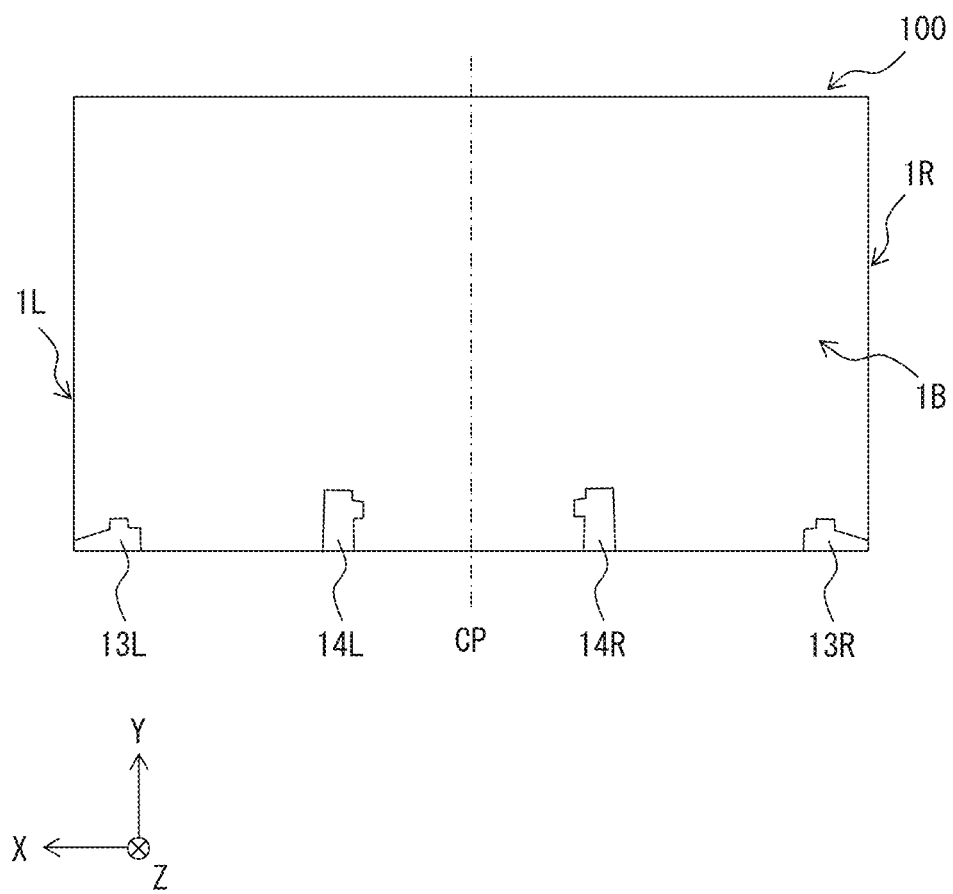

[FIG. 4A]
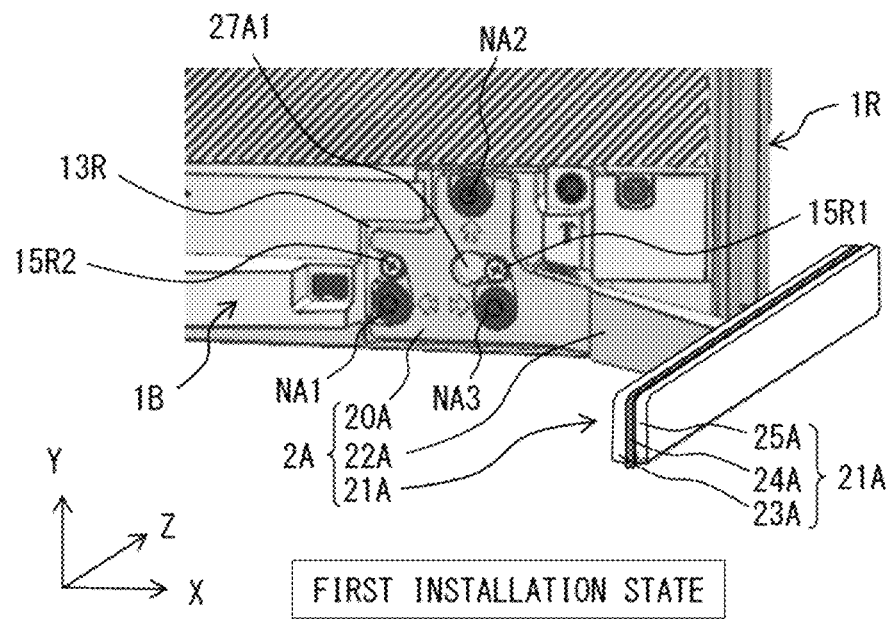
FIRST INSTALLATION STATE
[FIG. 4B]
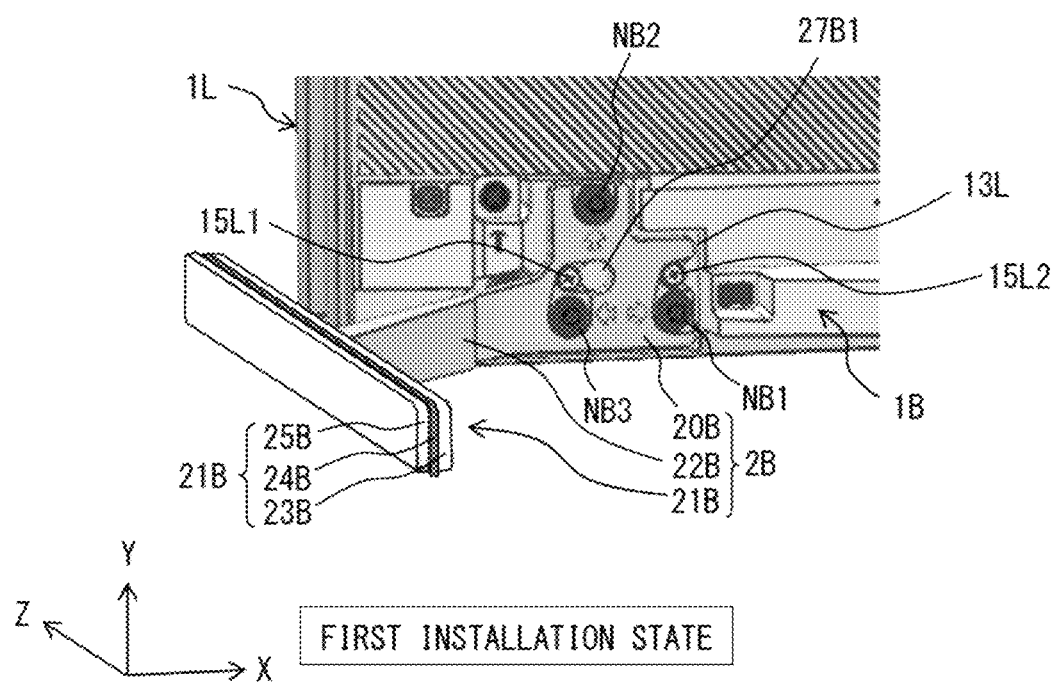
FIRST INSTALLATION STATE

[FIG. 5A]
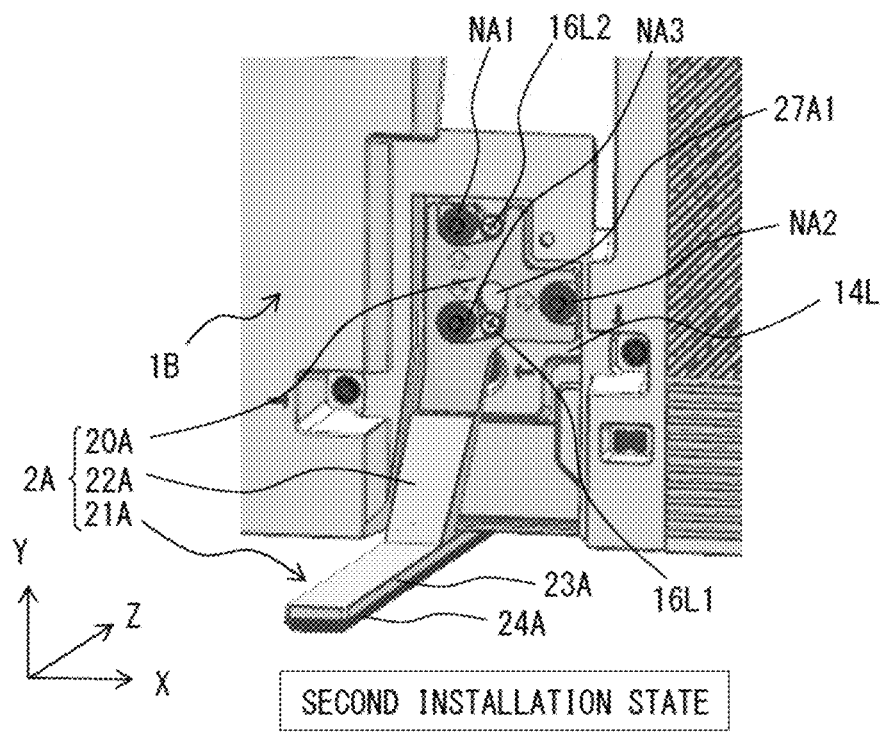
SECOND INSTALLATION STATE
[FIG. 5B]
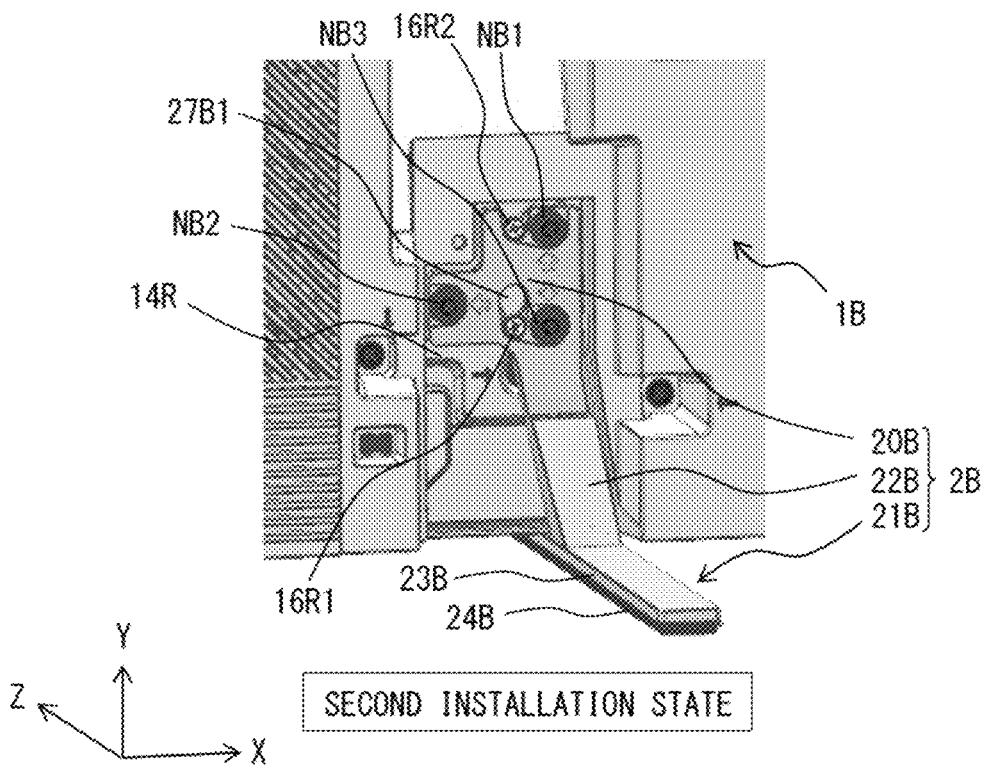
SECOND INSTALLATION STATE

[ FIG. 6A ]
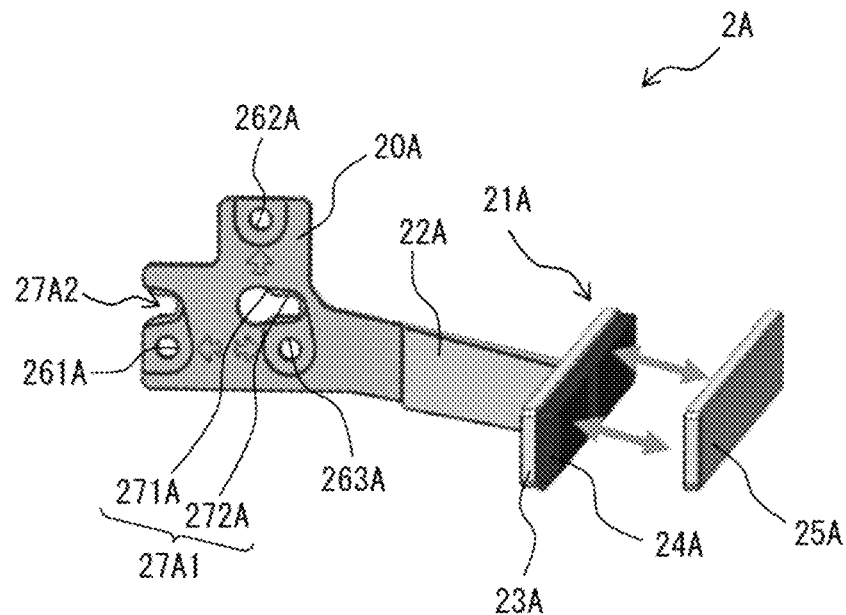
[ FIG. 6B ]
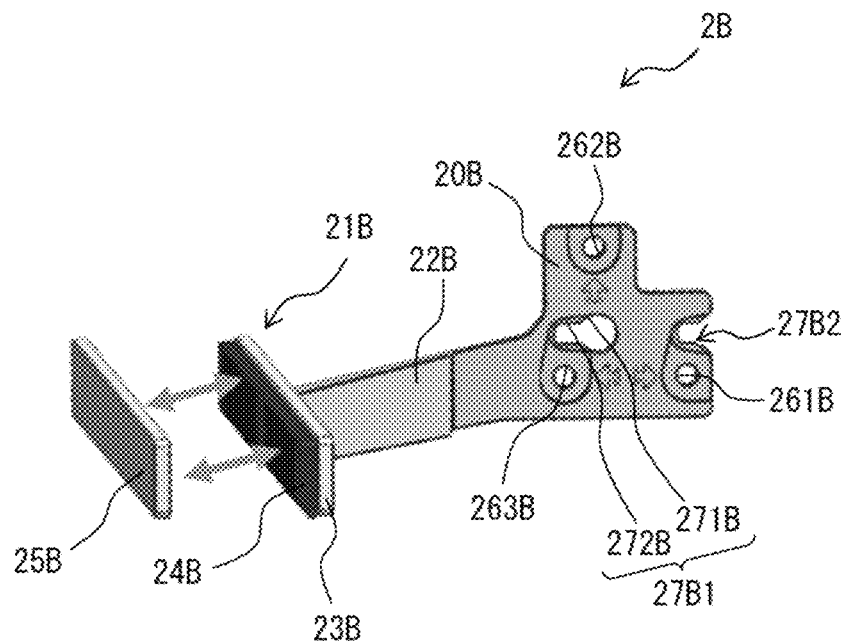

[FIG. 7A]
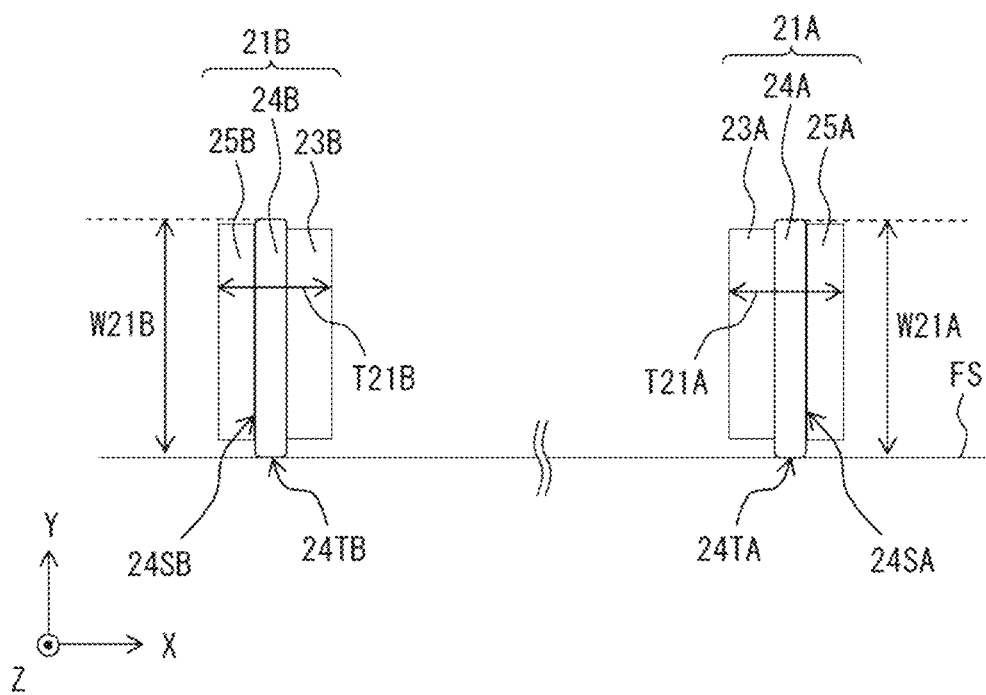
[FIG. 7B]
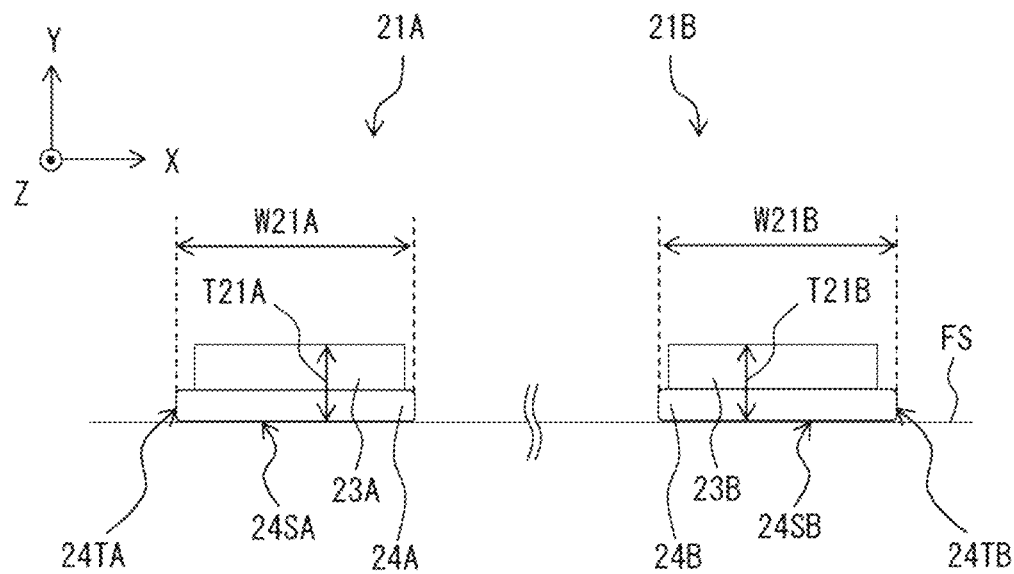

[ FIG. 8A ]
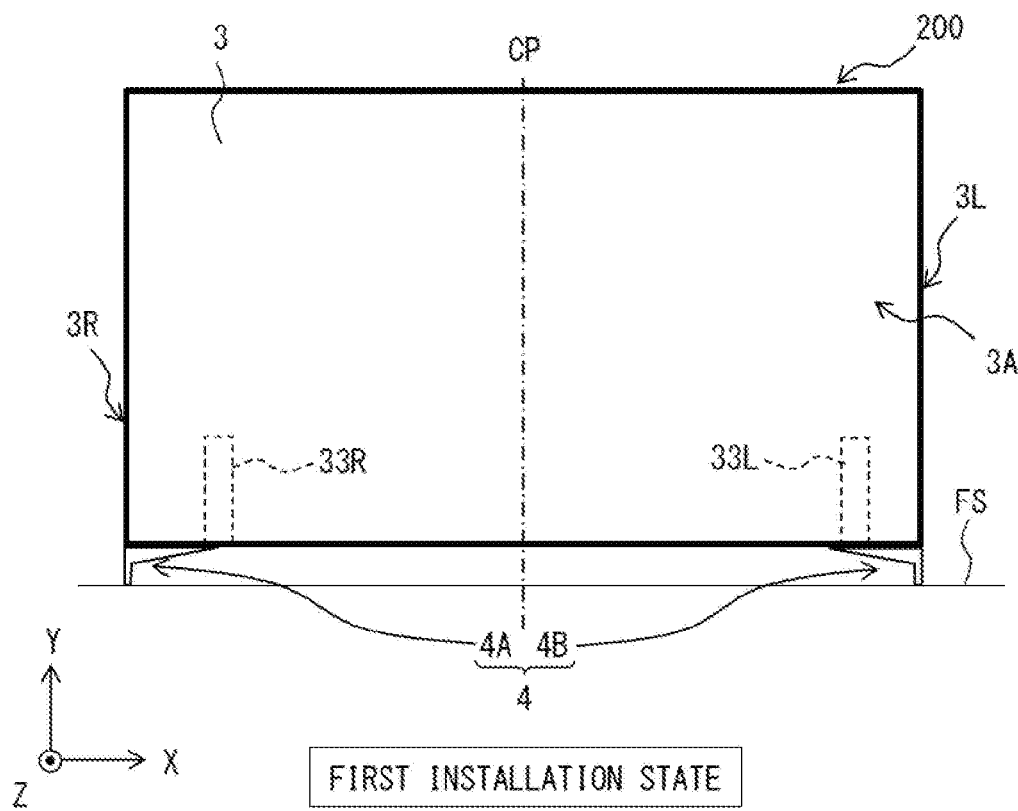
FIRST INSTALLATION STATE
[ FIG. 8B ]
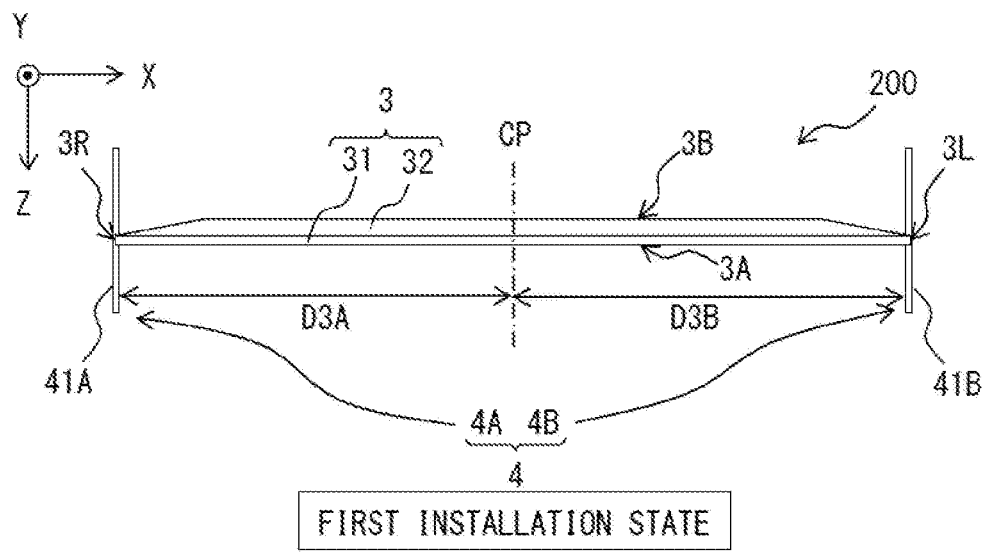
FIRST INSTALLATION STATE

[ FIG. 9A ]
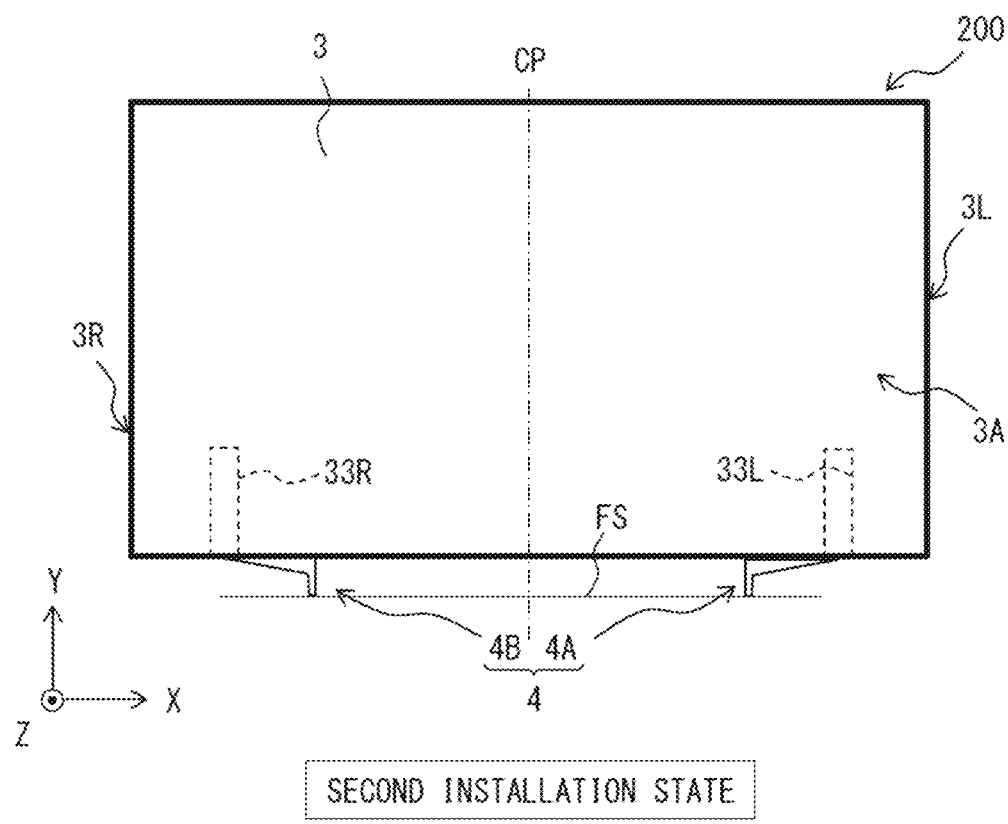
SECOND INSTALLATION STATE
[ FIG. 9B ]
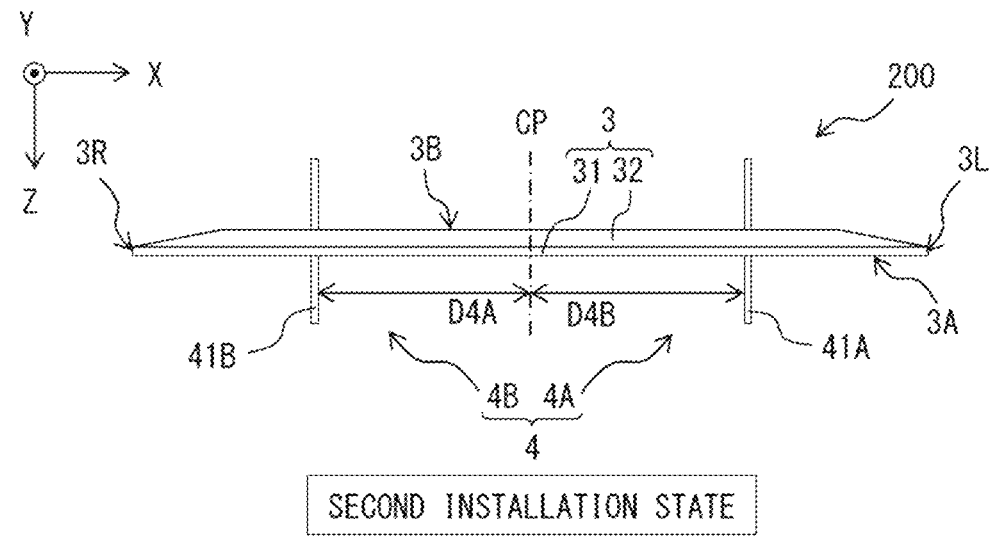
SECOND INSTALLATION STATE

[ FIG. 10A ]
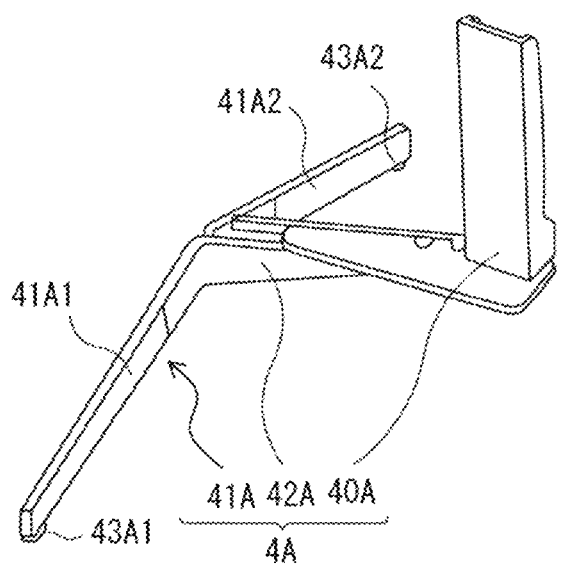

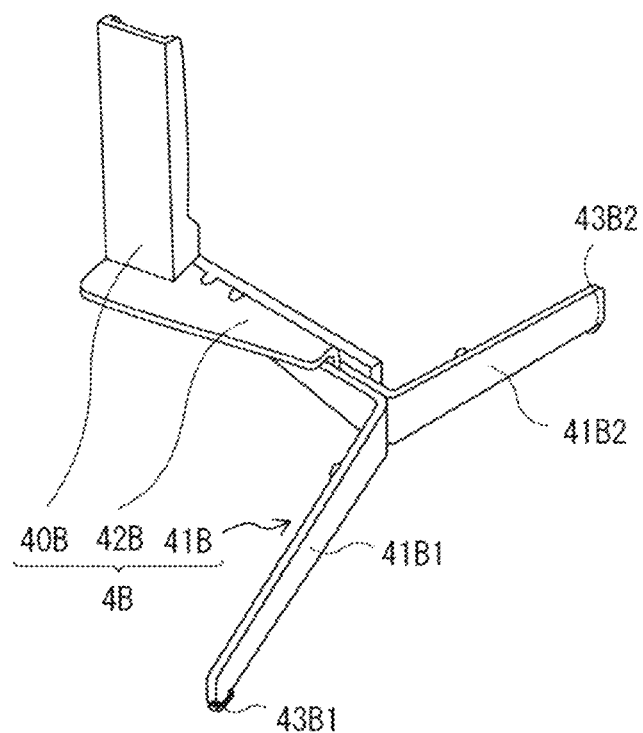
[ FIG. 10B ]

[FIG. 11A]
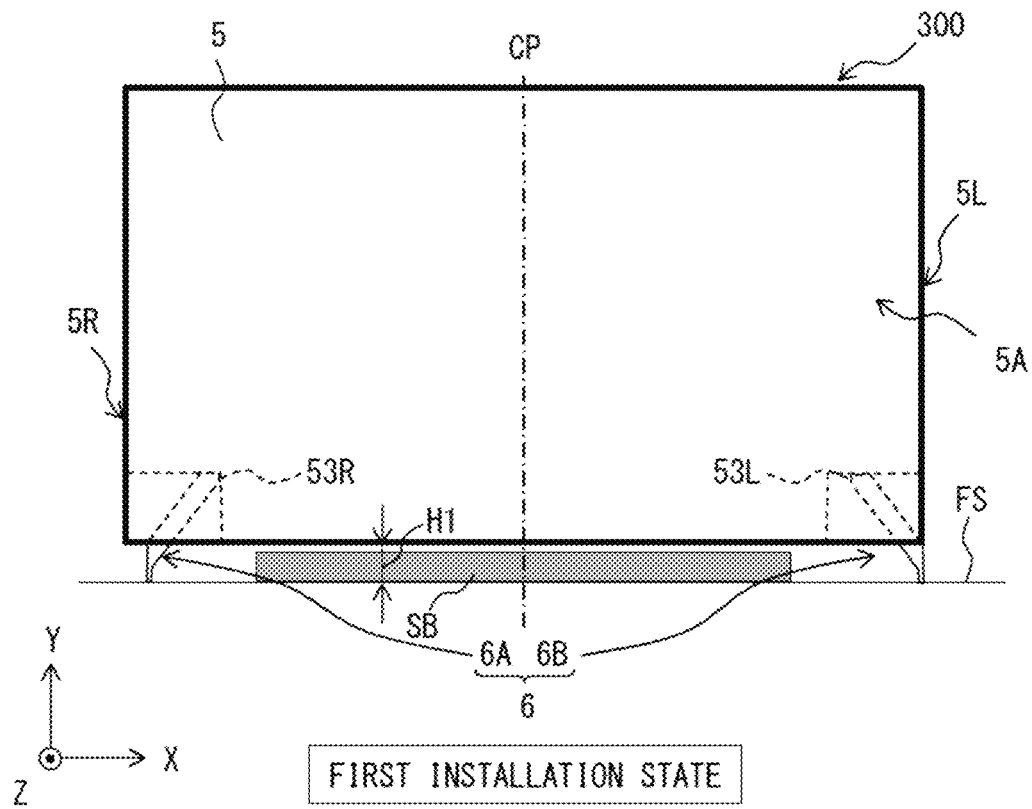
FIRST INSTALLATION STATE
[FIG. 11B]
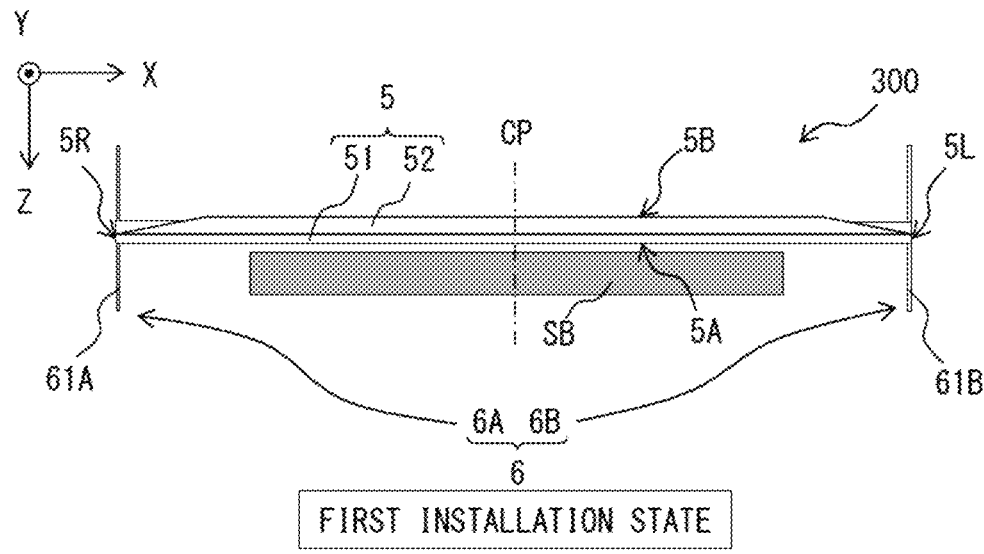
FIRST INSTALLATION STATE

[FIG. 12A]
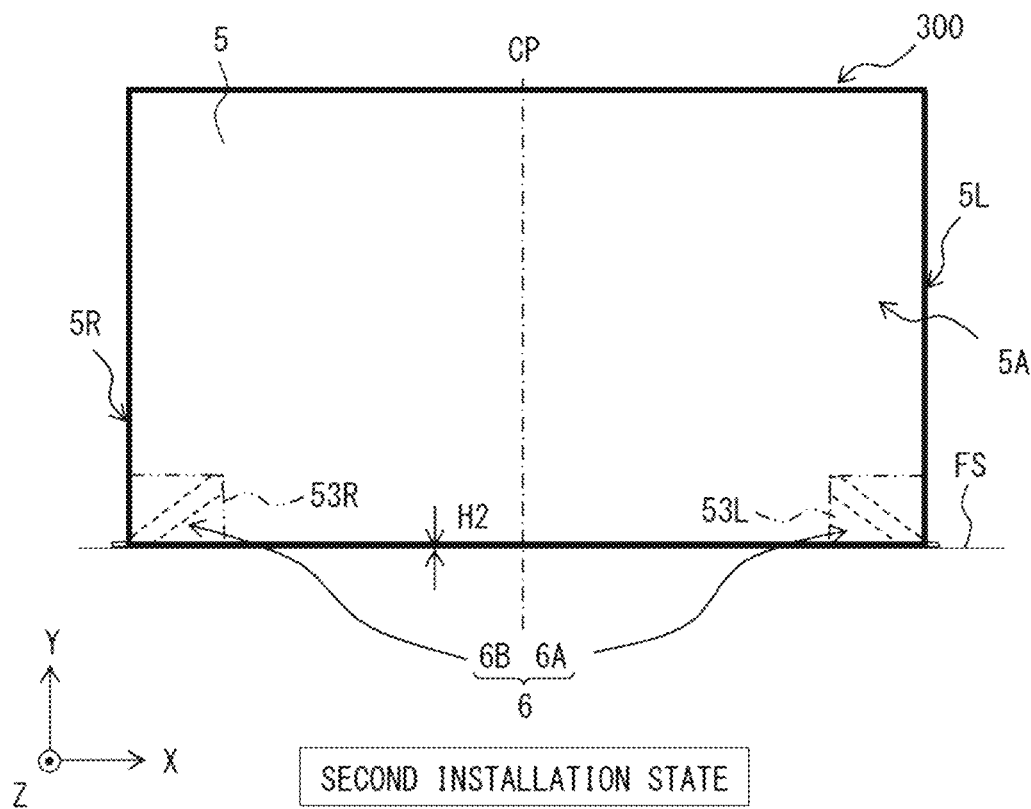
SECOND INSTALLATION STATE
[FIG. 12B]
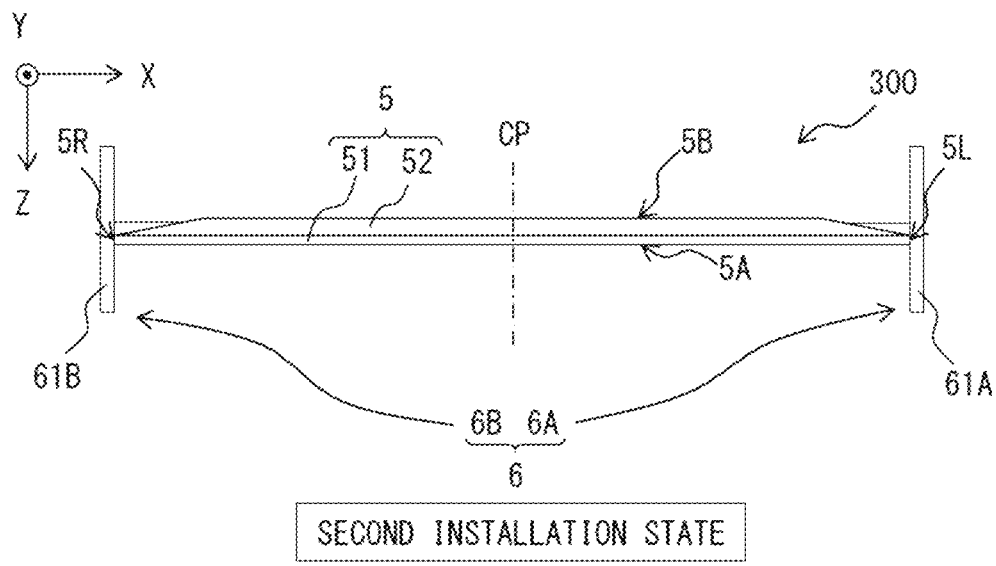
SECOND INSTALLATION STATE

[ FIG. 13A ]
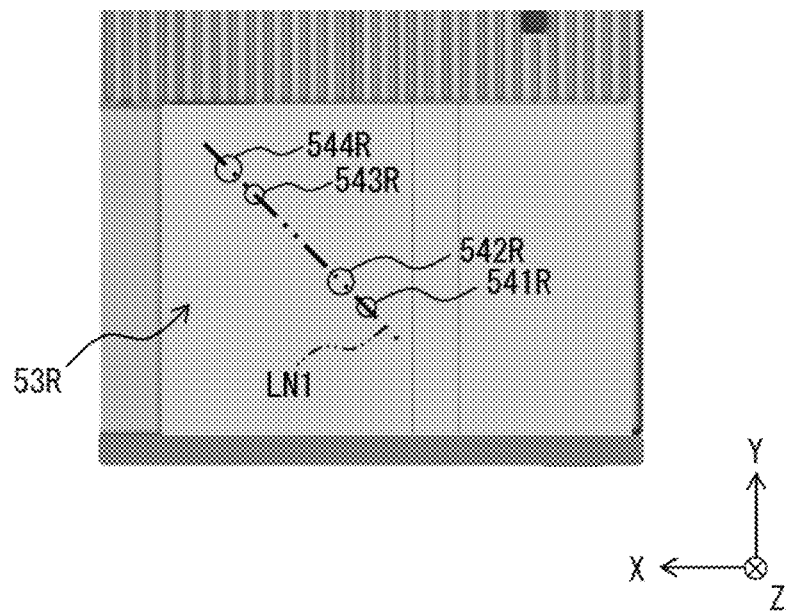
[ FIG. 13B ]
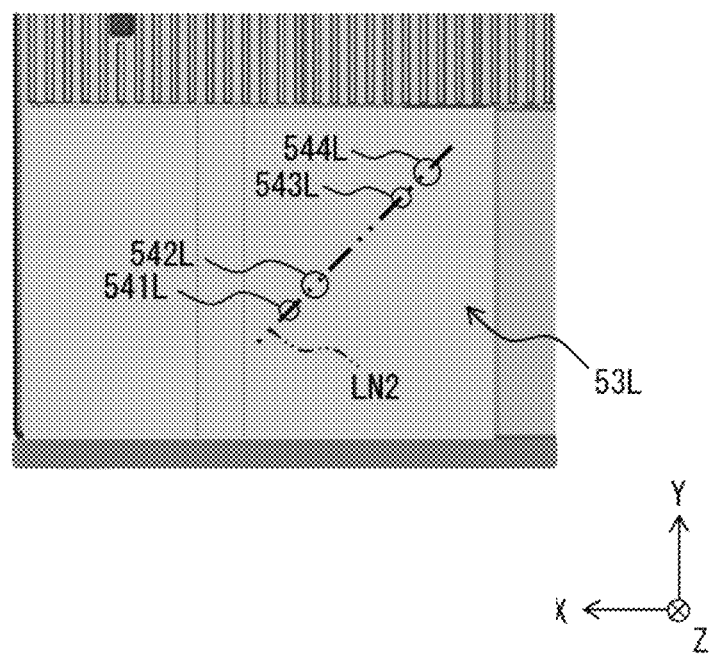

[ FIG. 14A ]
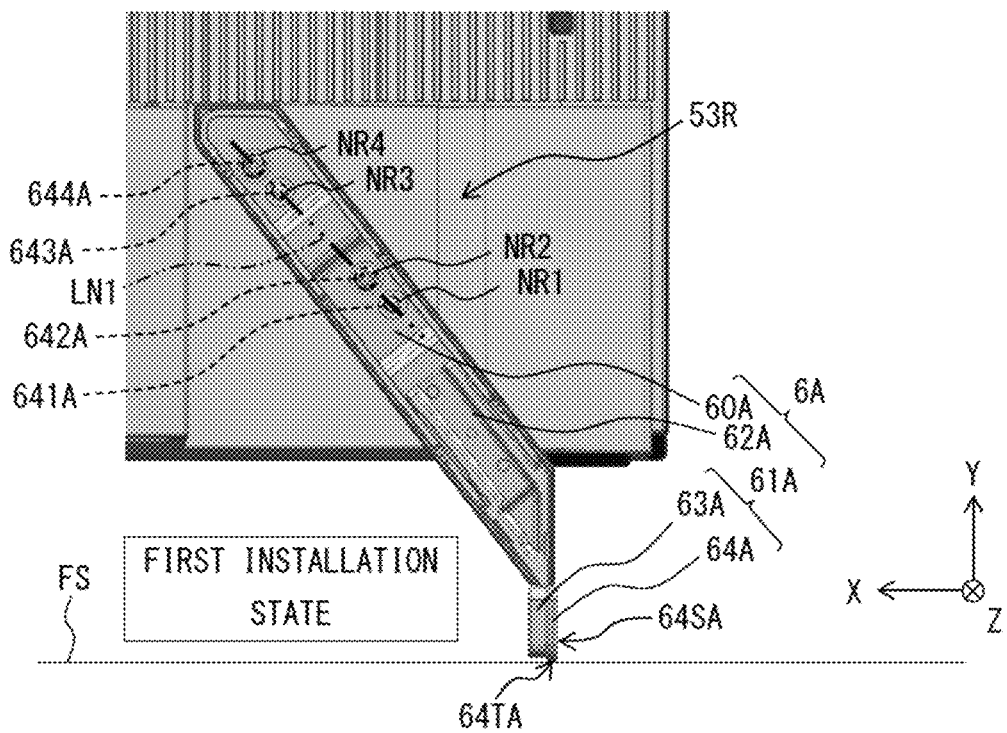
[ FIG. 14B ]
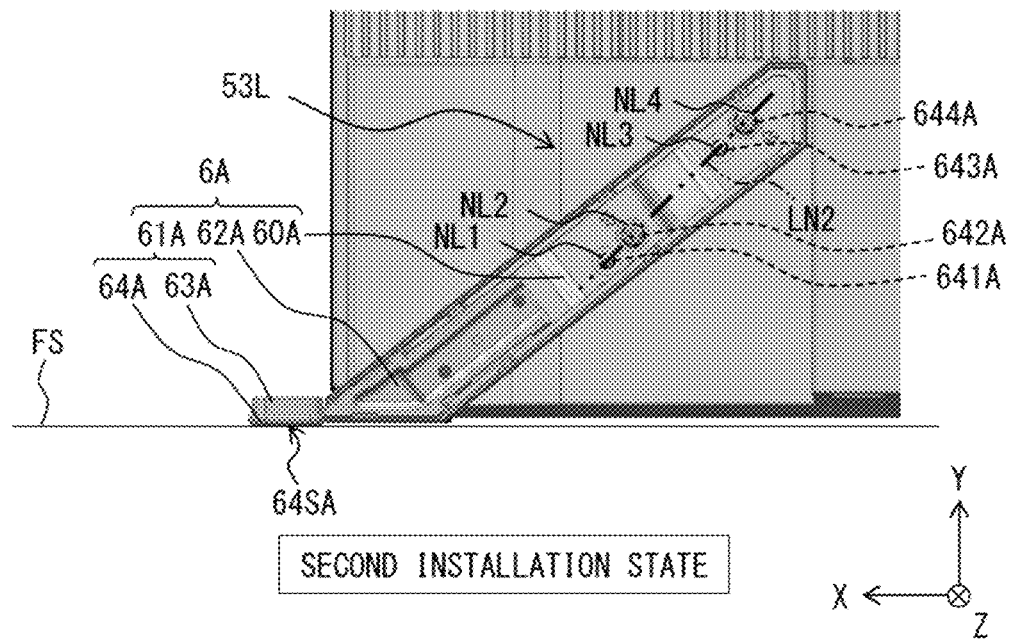

[ FIG. 15A ]
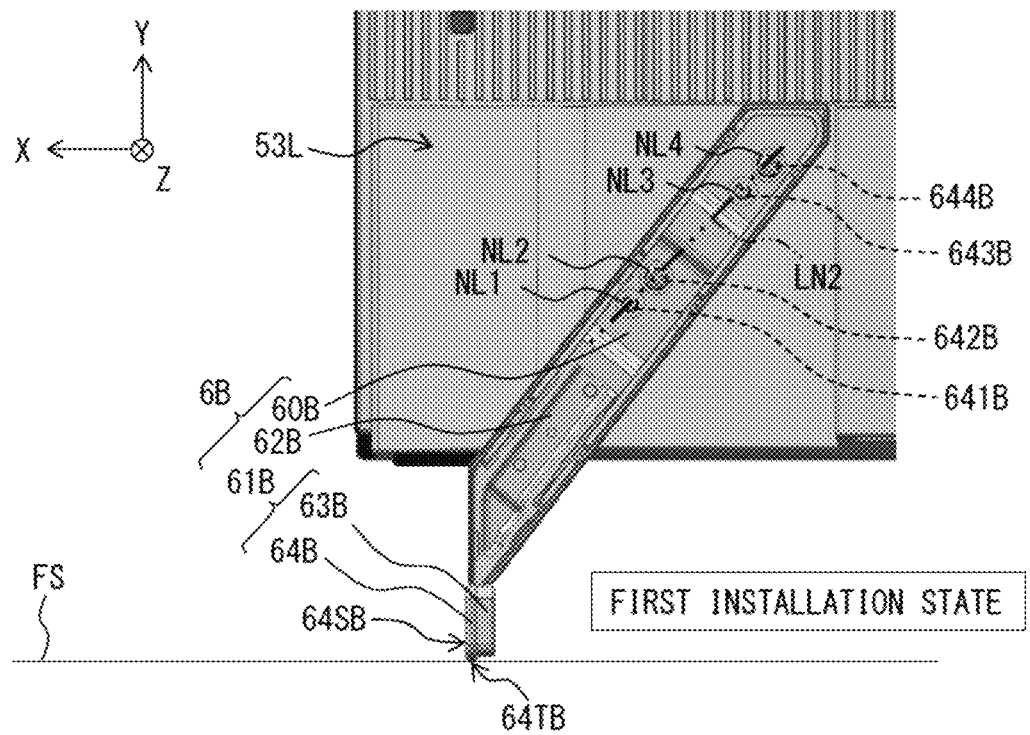
[ FIG. 15B ]
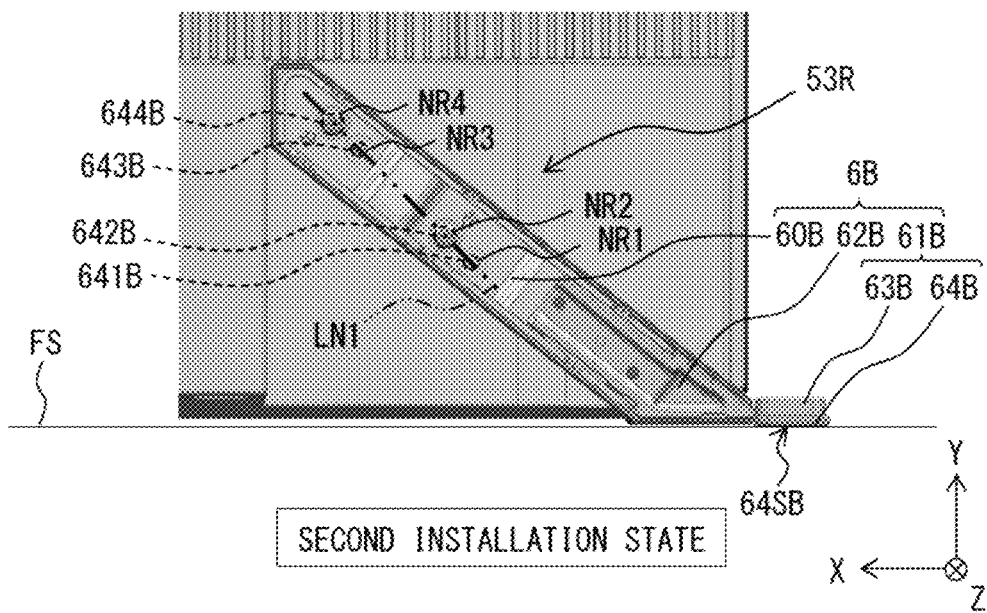

[ FIG. 16A ]
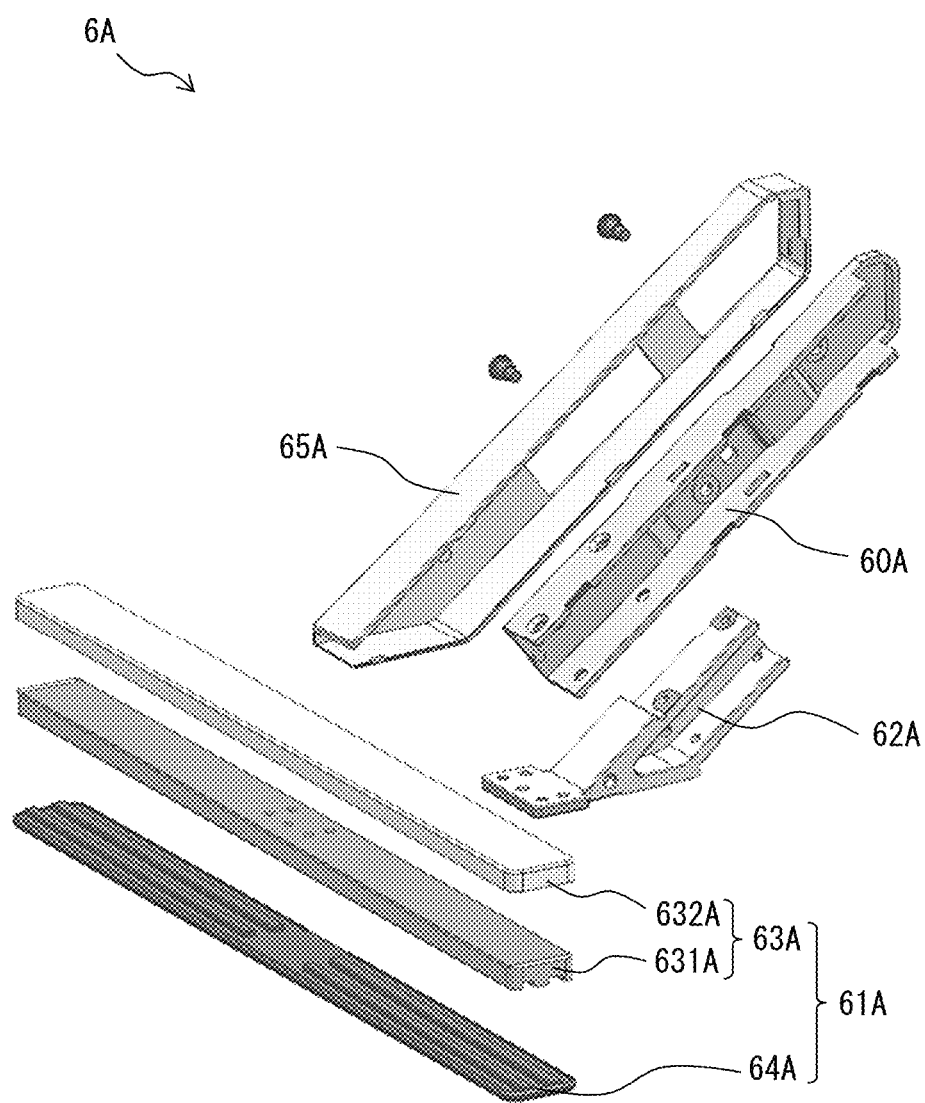

[ FIG. 16B ]
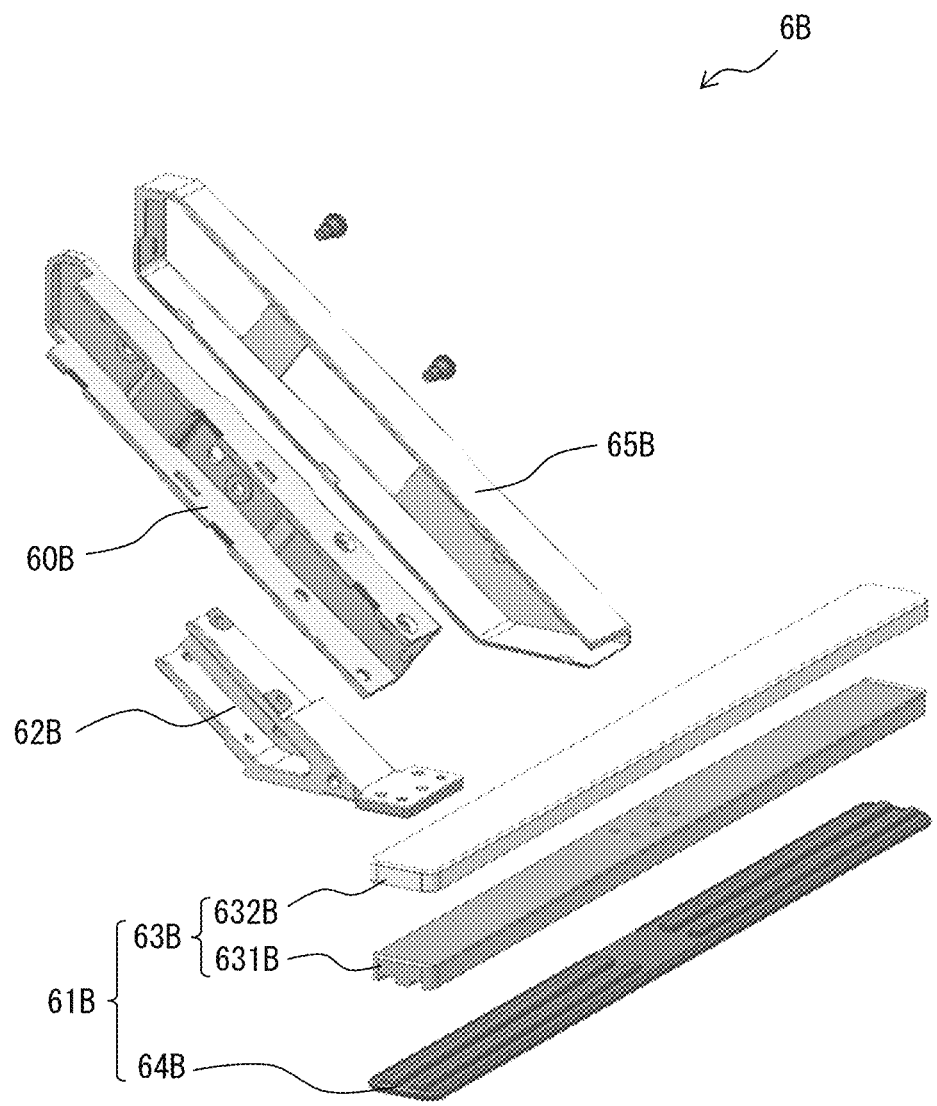

[ FIG. 17A ]
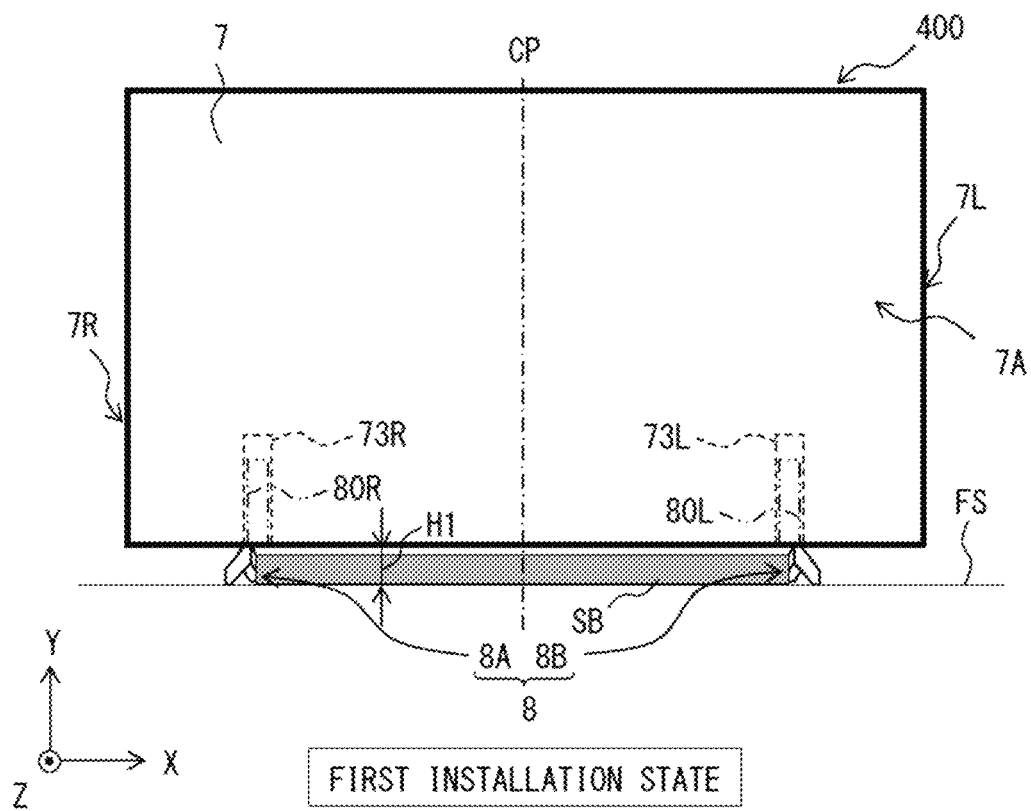
[ FIG. 17B ]
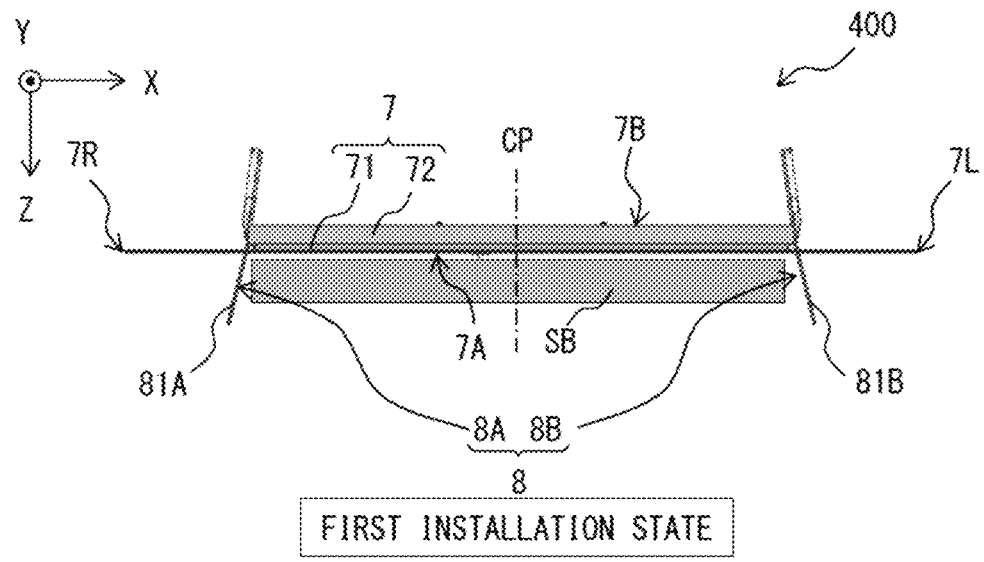

[FIG. 18A]
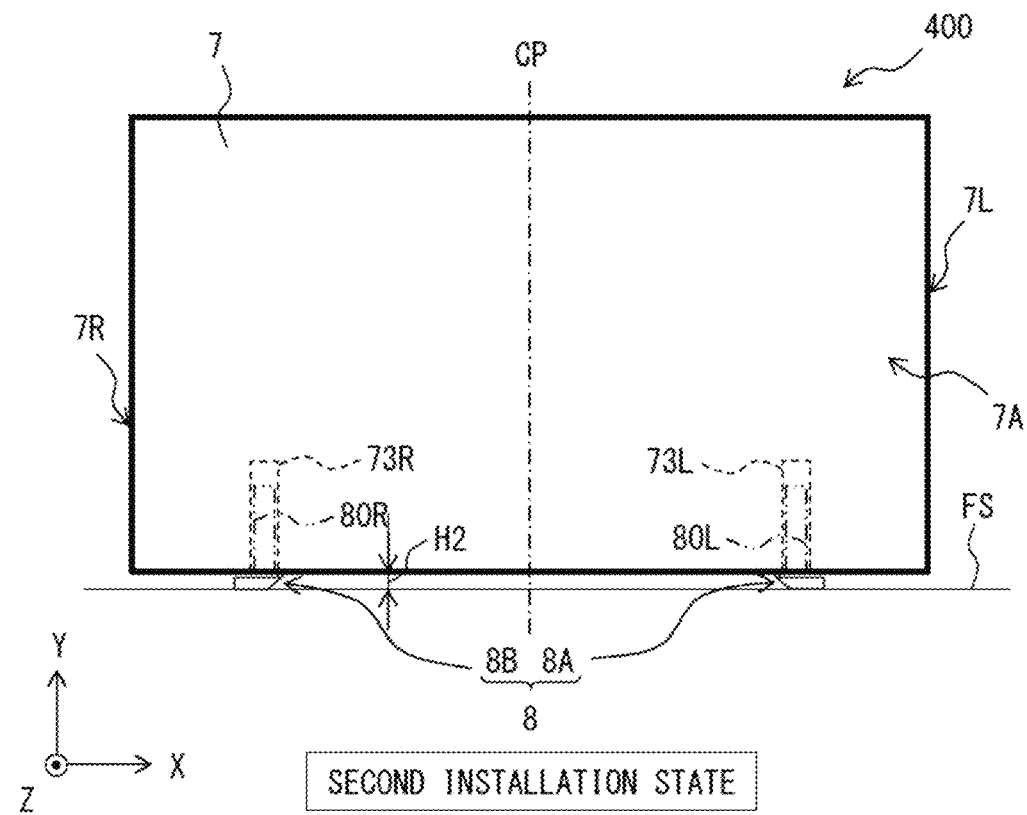
SECOND INSTALLATION STATE
[FIG. 18B]
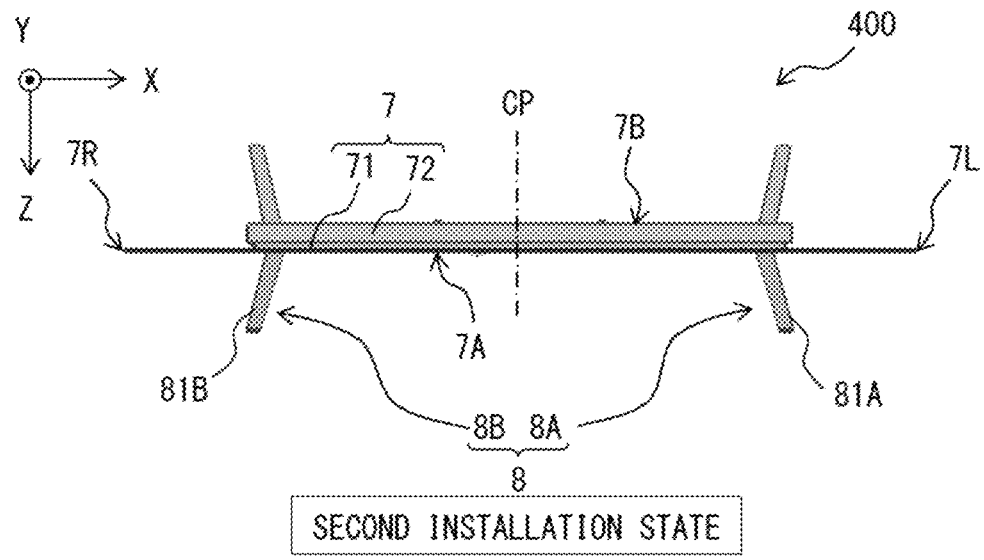
SECOND INSTALLATION STATE

[ FIG. 19A ]
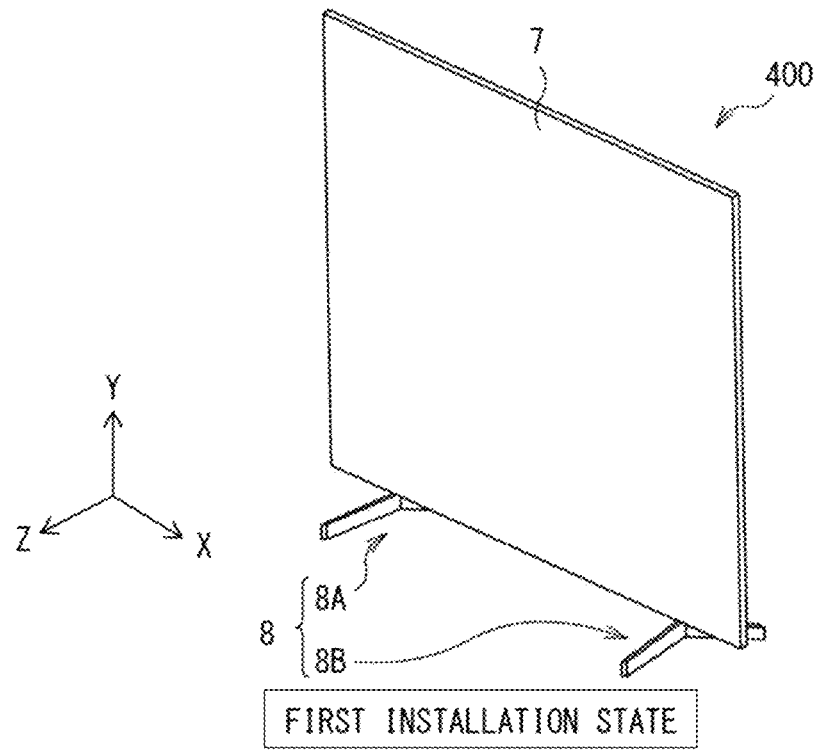
FIRST INSTALLATION STATE
[ FIG. 19B ]
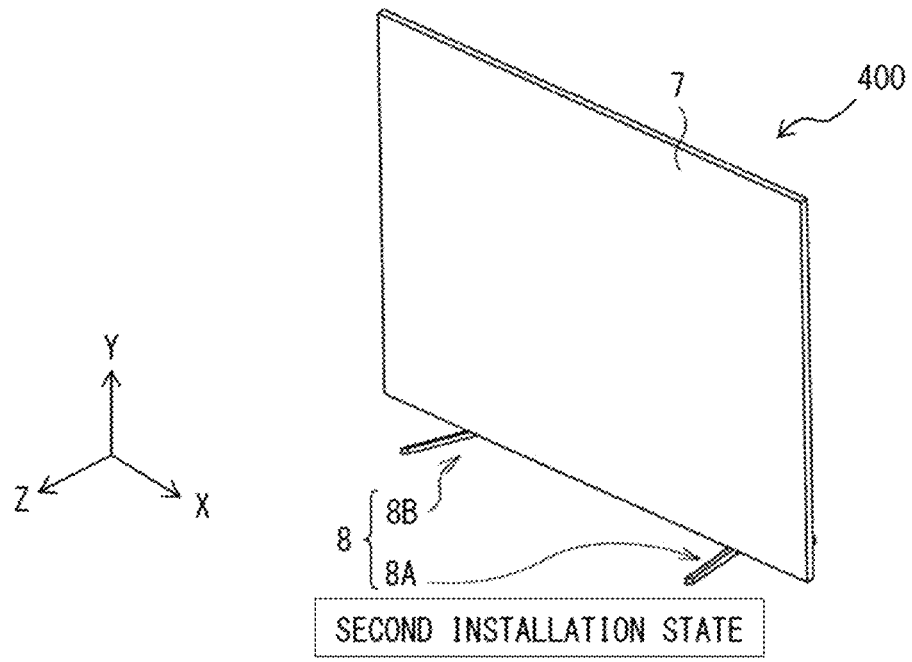
SECOND INSTALLATION STATE

[FIG. 20A]
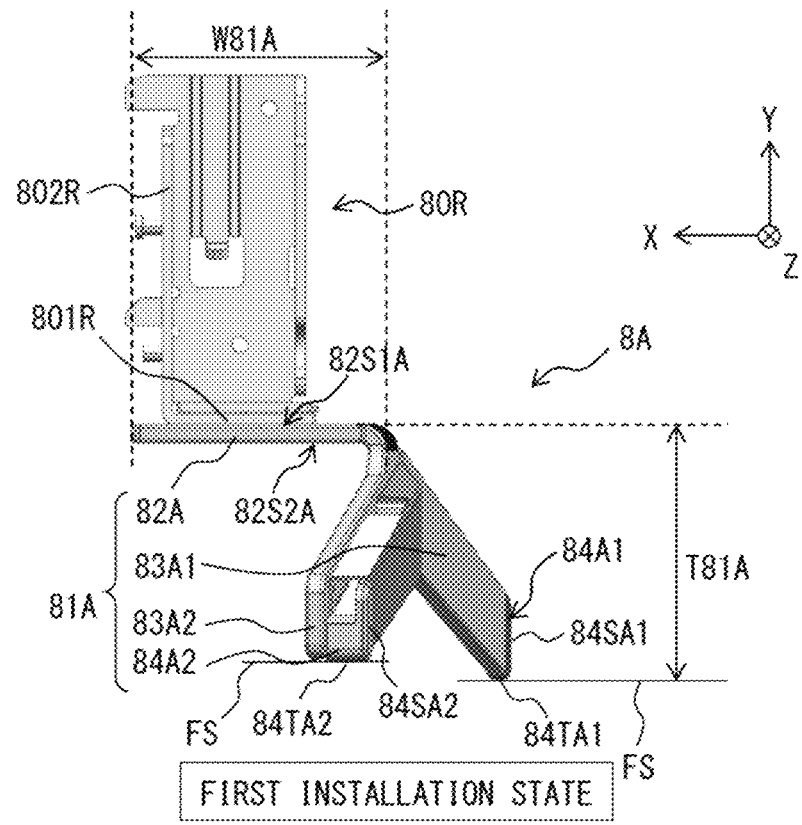
FIRST INSTALLATION STATE
[FIG. 20B]
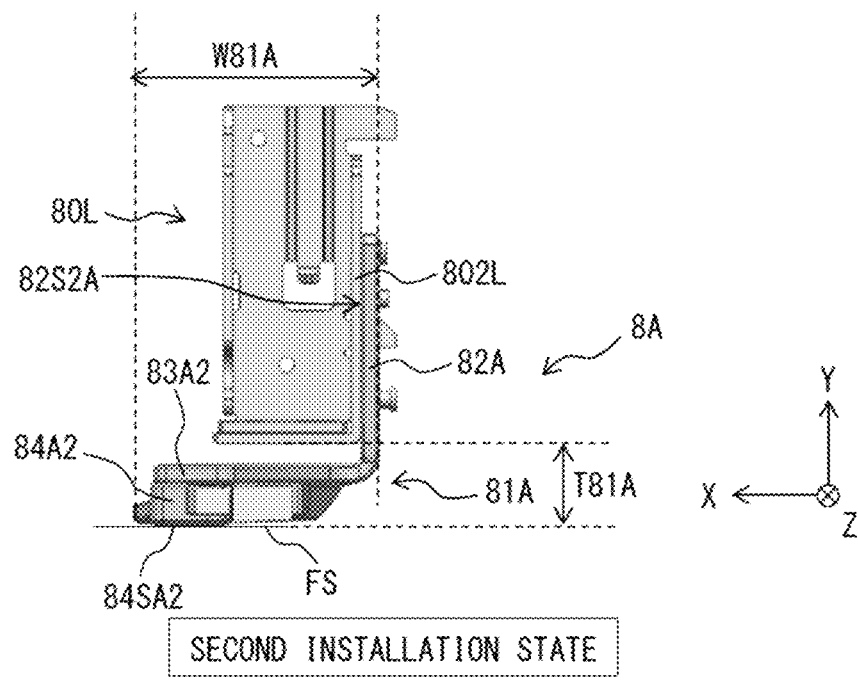
SECOND INSTALLATION STATE

[FIG. 21]
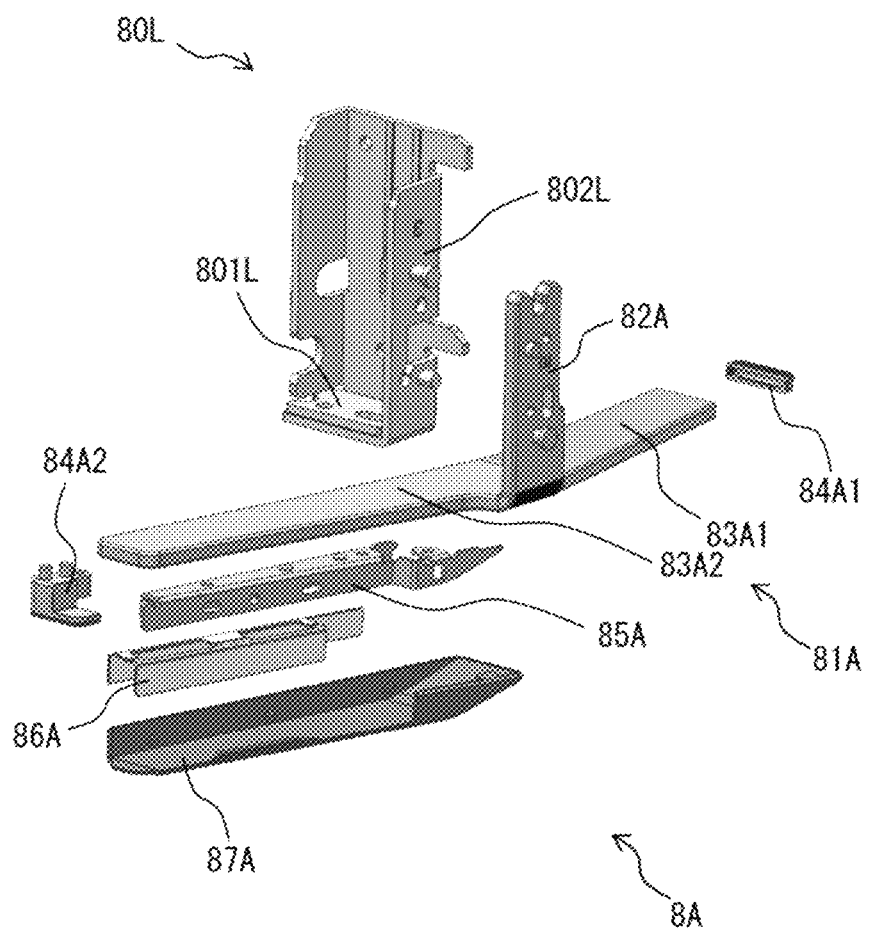

[ FIG. 22A ]
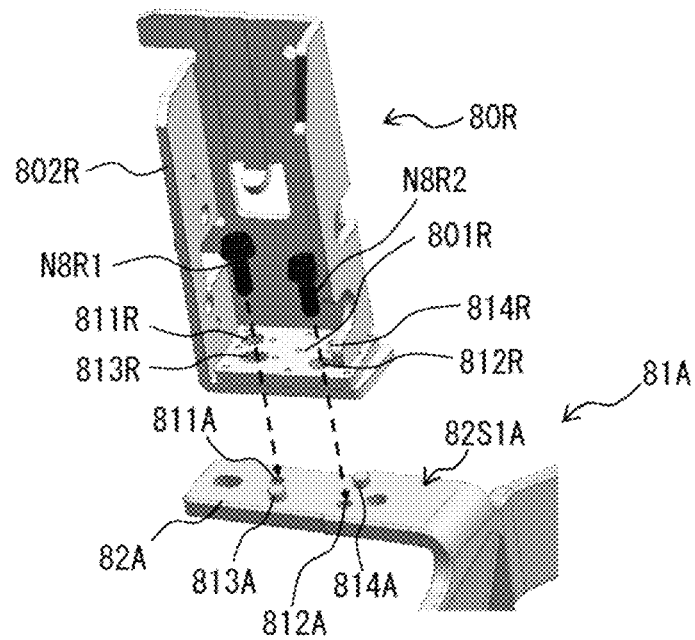
FIRST INSTALLATION STATE
[ FIG. 22B ]
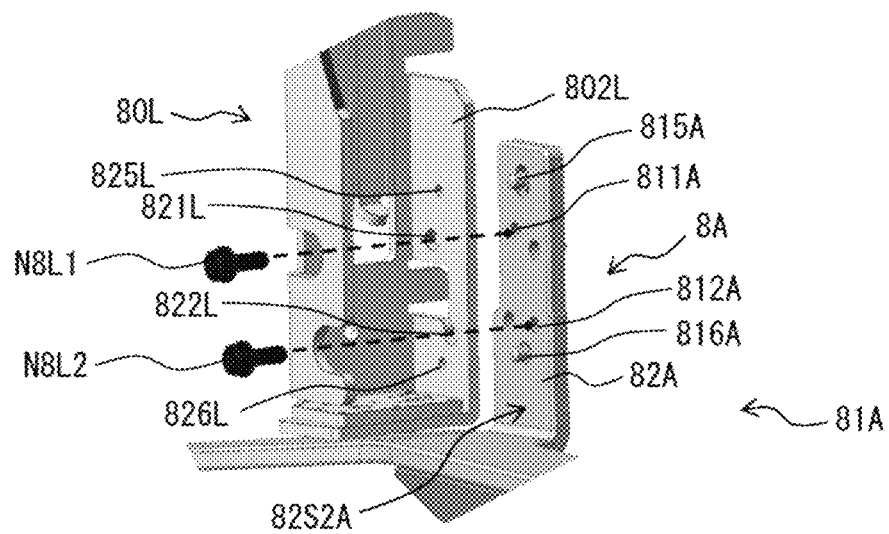
SECOND INSTALLATION STATE

[FIG. 23A]
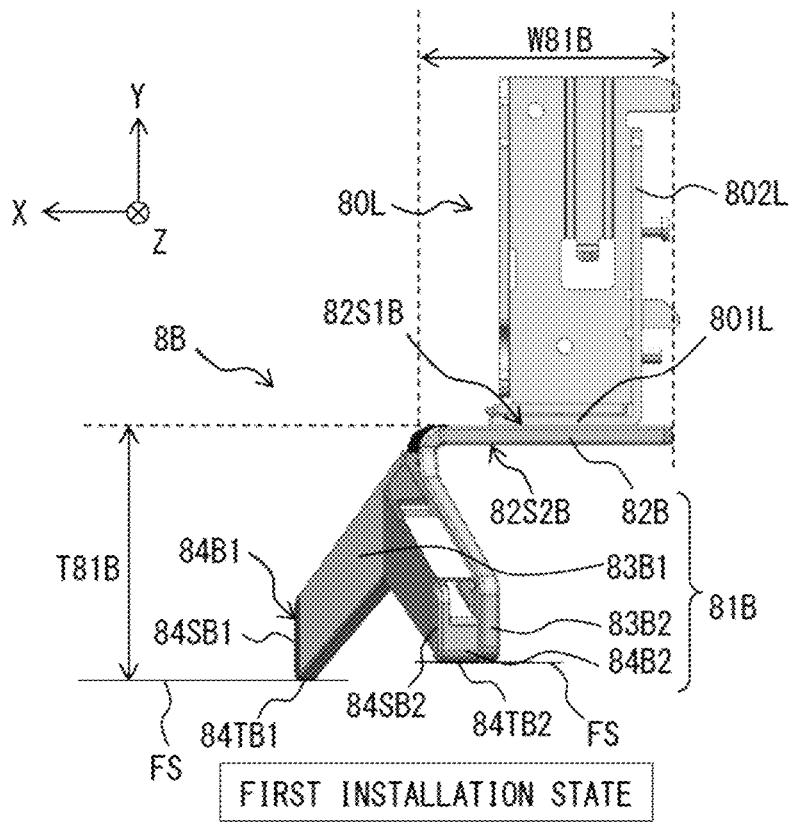
FIRST INSTALLATION STATE
[FIG. 23B]
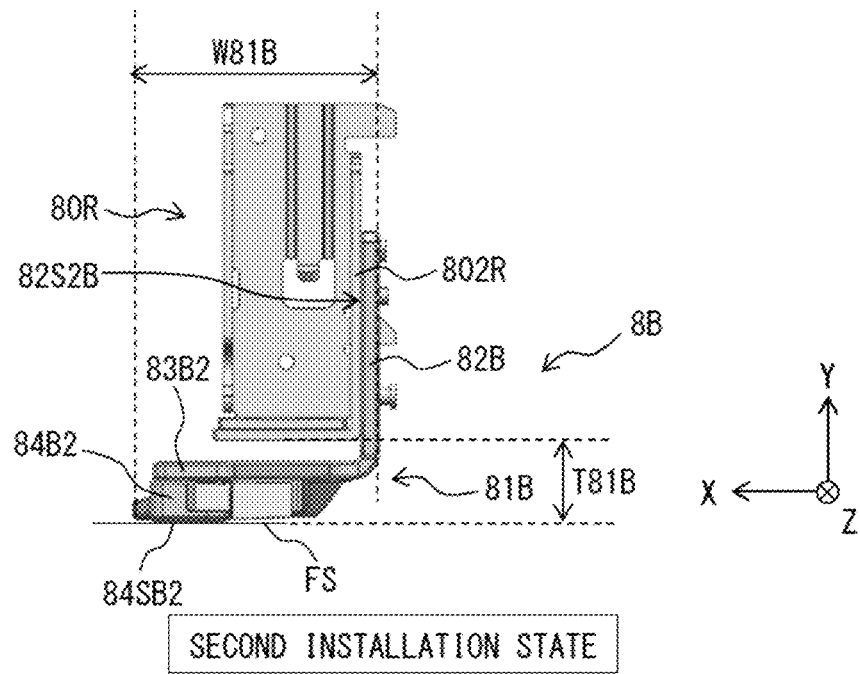
SECOND INSTALLATION STATE

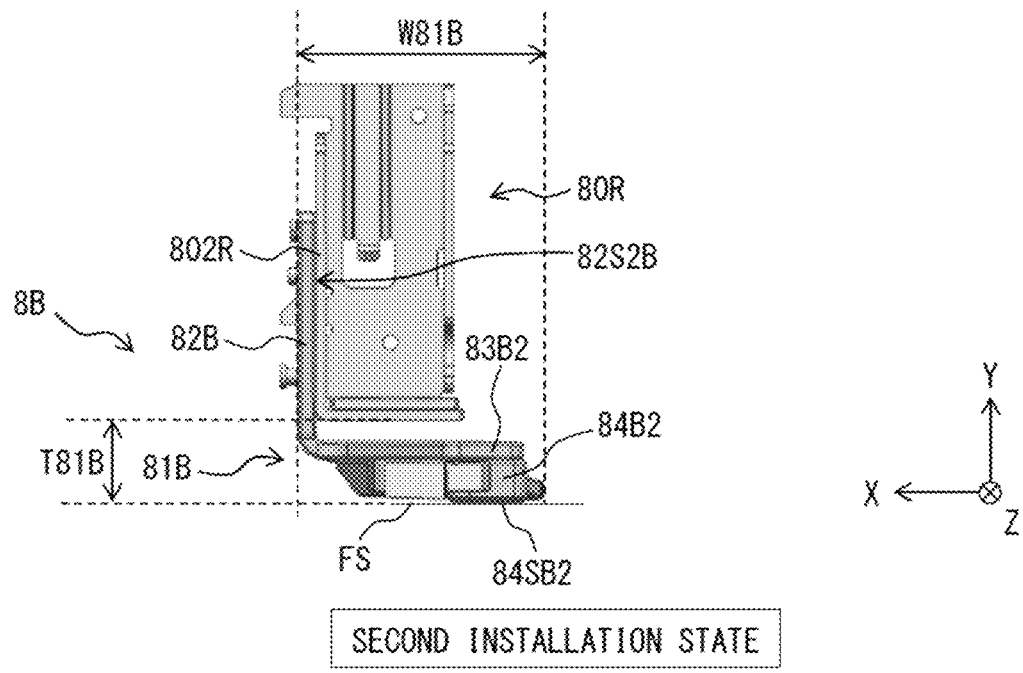
[FIG. 23C]

[ FIG. 24 ]
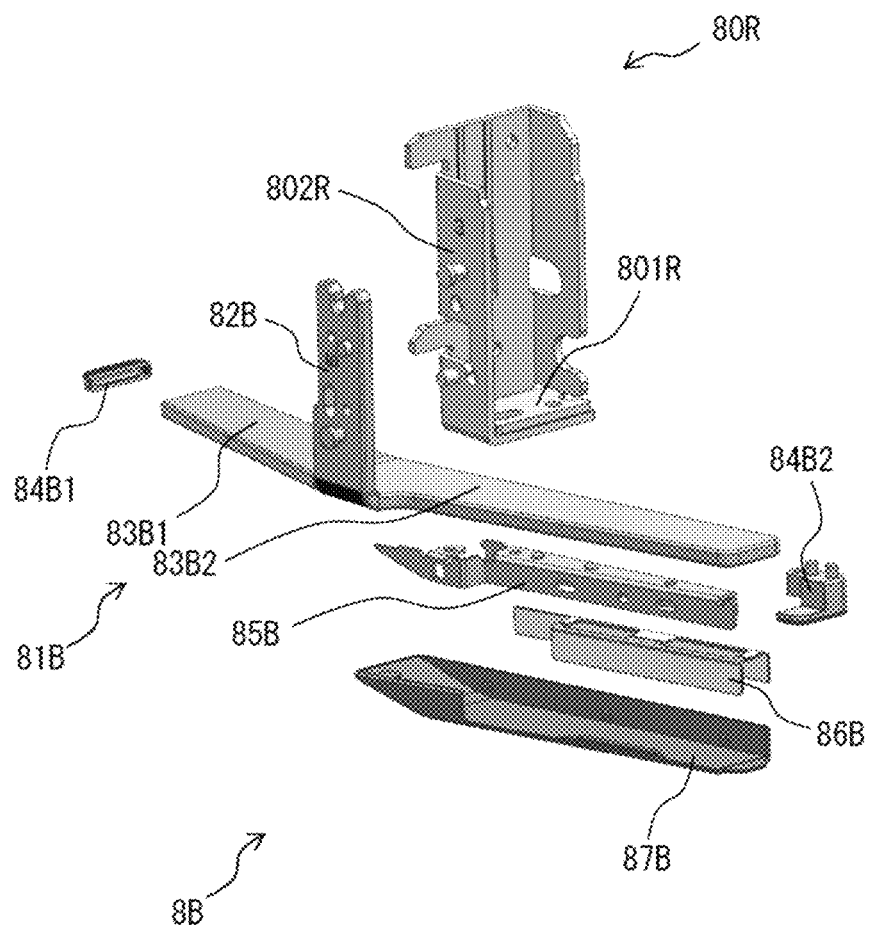

[ FIG. 25A ]
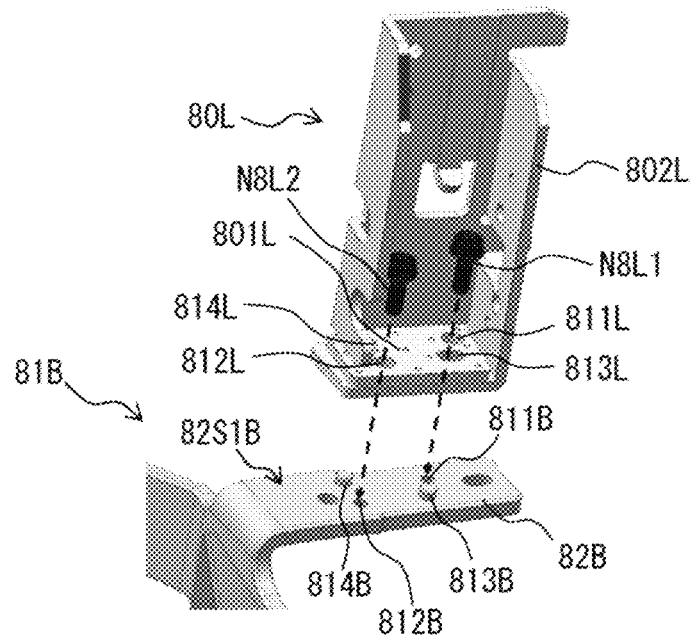
FIRST INSTALLATION STATE
[ FIG. 25B ]
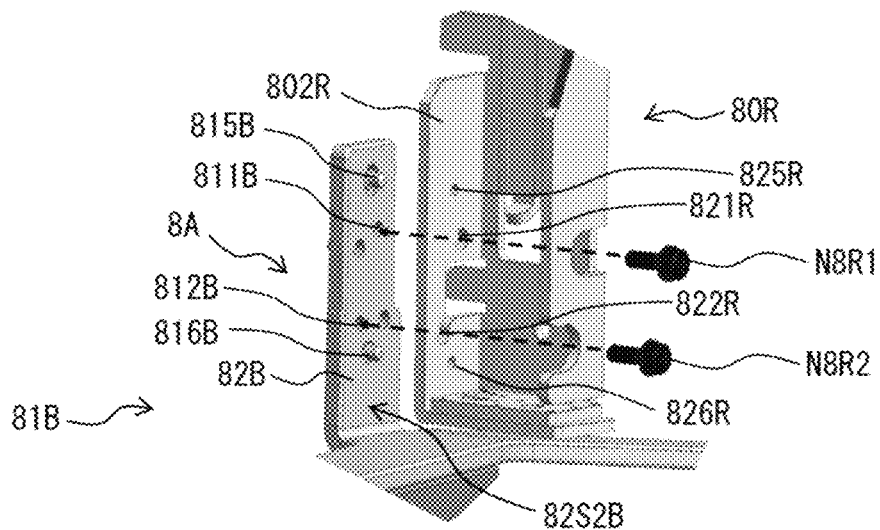
SECOND INSTALLATION STATE

[ FIG. 26A ]
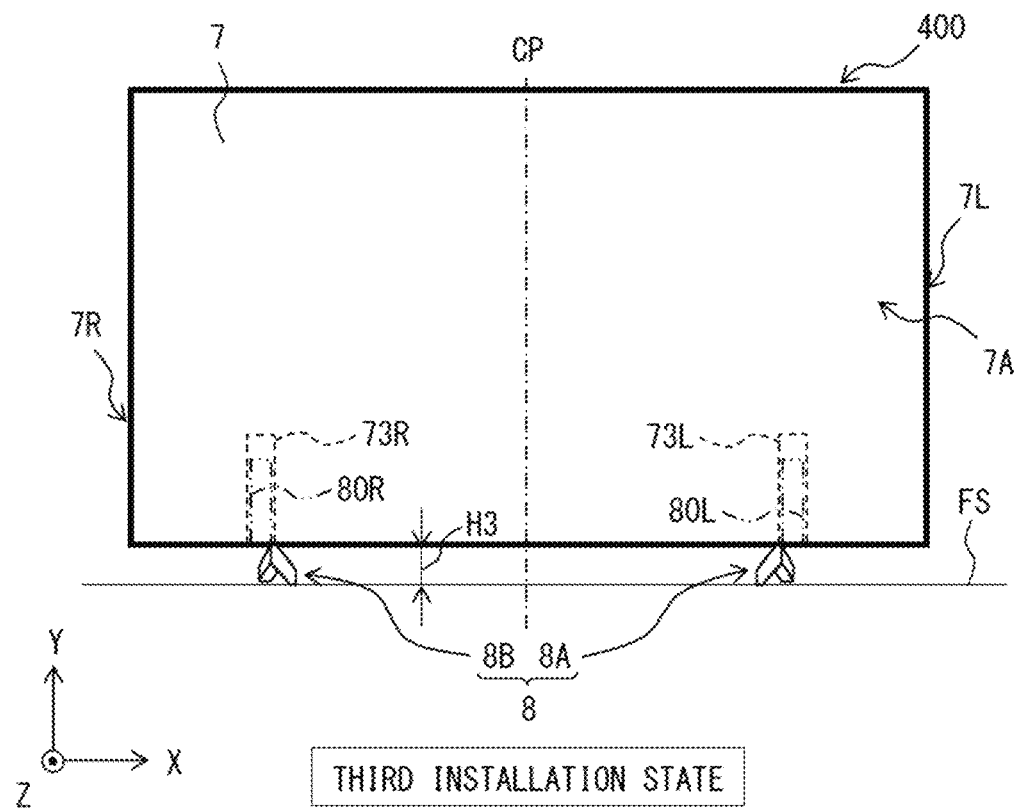
THIRD INSTALLATION STATE
[ FIG. 26B ]
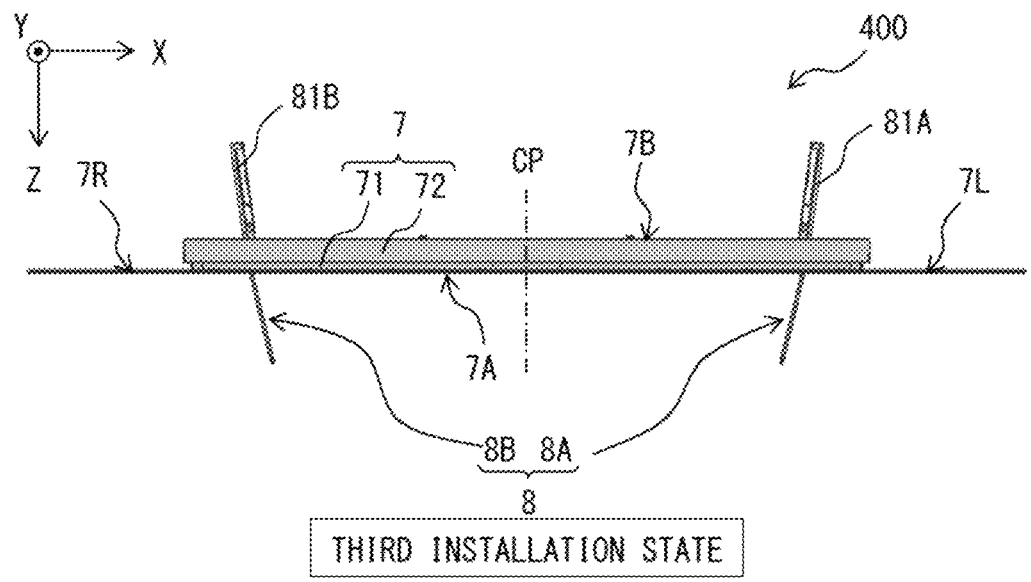
THIRD INSTALLATION STATE

[ FIG. 27A ]
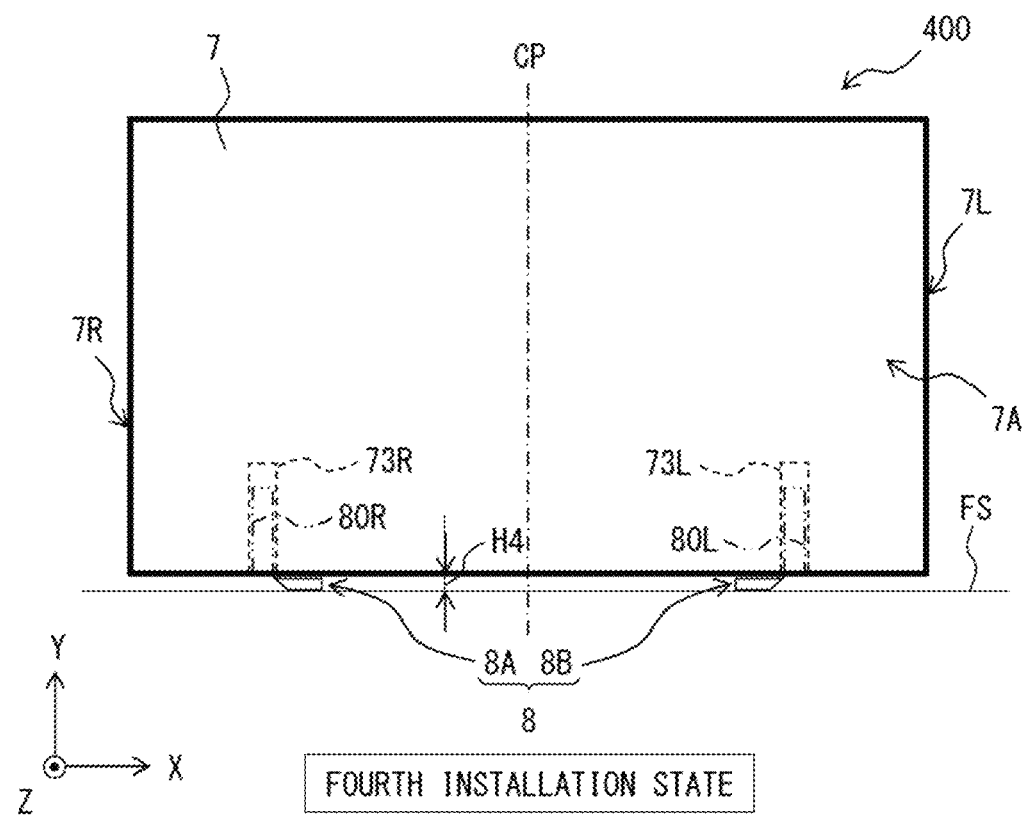
FOURTH INSTALLATION STATE
[ FIG. 27B ]
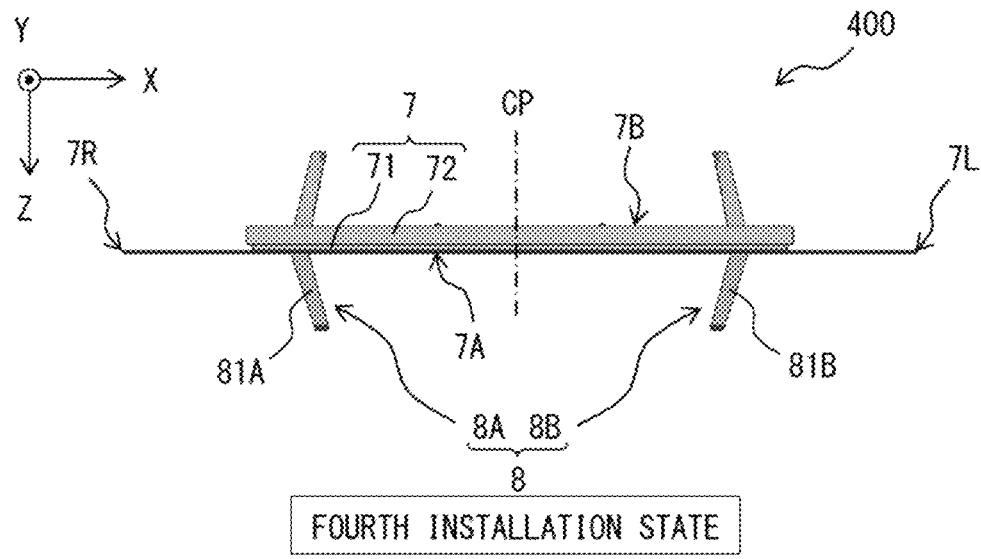
FOURTH INSTALLATION STATE

[ FIG. 28A ]
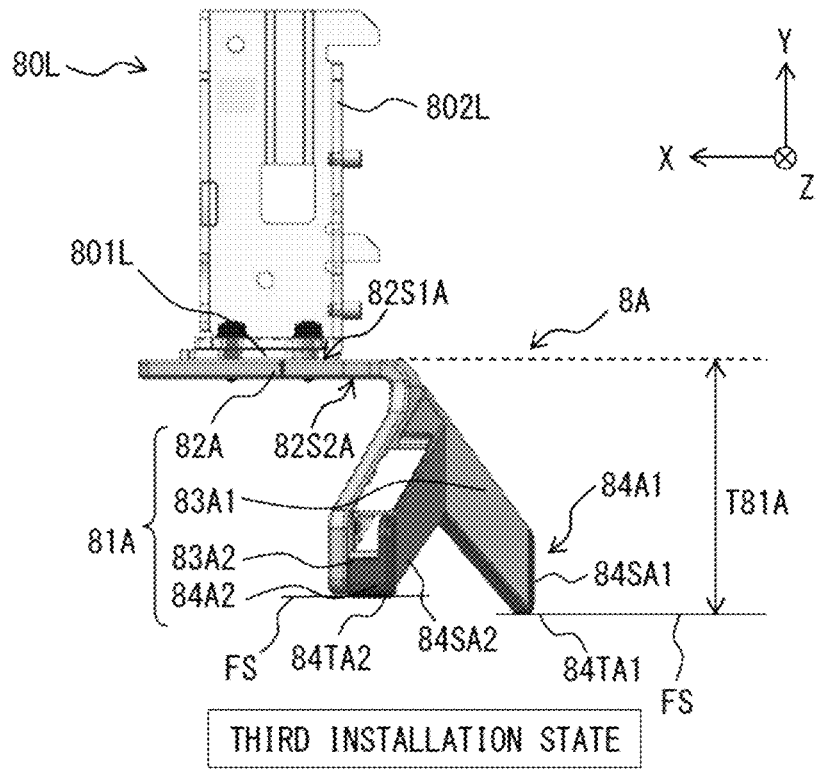
THIRD INSTALLATION STATE
[ FIG. 28B ]
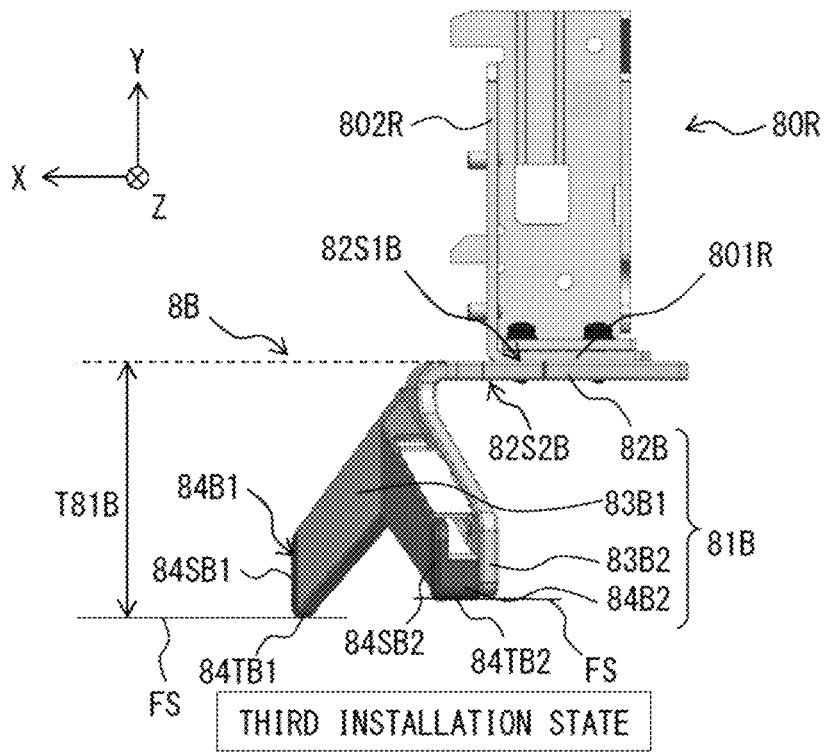
THIRD INSTALLATION STATE

[ FIG. 29A ]
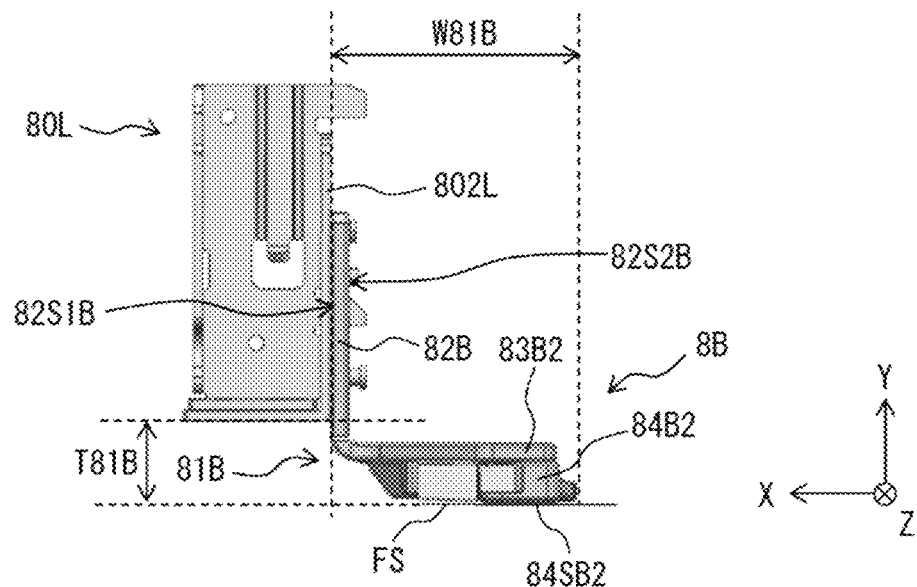
FOURTH INSTALLATION STATE
[ FIG. 29B ]
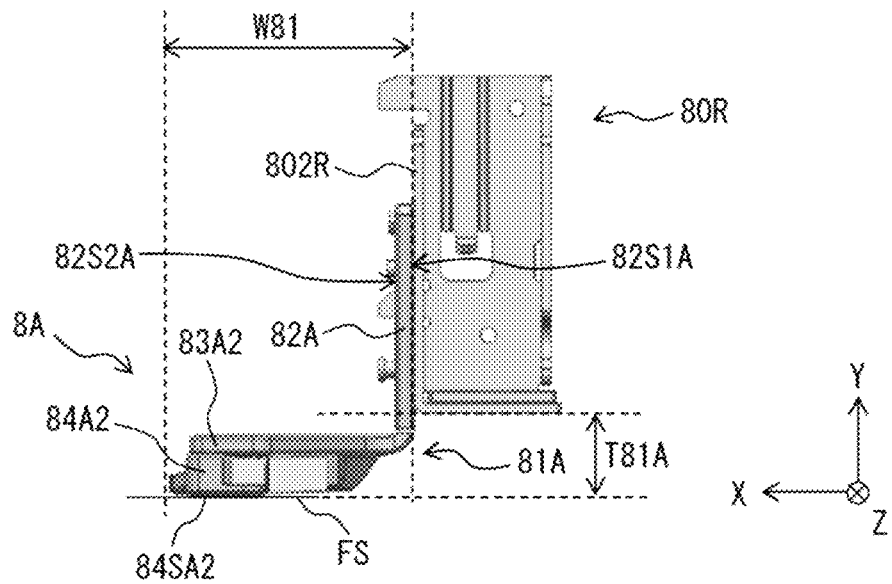
FOURTH INSTALLATION STATE

SUPPORTING BODY AND DISPLAY APPARATUS

CROSS REFERENCE TO RELATED APPLICATIONS

This application is a U.S. National Phase of International Patent Application No. PCT/JP2020/047296 filed on Dec. 17, 2020, which claims priority benefit of Japanese Patent Application No. JP 2019-235743 filed in the Japan Patent Office on Dec. 26, 2019, and claims priority benefit of Japanese Patent Application No. JP 2020-169449 filed in the Japan Patent Office on Oct. 6, 2020. Each of the above-referenced applications is hereby incorporated herein by reference in its entirety.

TECHNICAL FIELD

The present disclosure relates to a supporting body that supports a display unit, and a display apparatus including a display unit and a supporting body.

BACKGROUND ART

In recent years, display apparatuses have been proposed that each include a display panel (a display unit) having a low profile and a large screen size (see PTLs 1 to 3, for example).

CITATION LIST

Patent Literature

PTL 1: Japanese Unexamined Patent Application Publication No. 2004-86046
PTL 2: Japanese Unexamined Patent Application Publication No. 2010-15098
PTL 3: Japanese Unexamined Patent Application Publication No. 2012-141385

SUMMARY OF THE INVENTION

As display units have increased in screen size and decreased in thickness in recent years, aesthetics is desired in supporting bodies that support the display units to cause the display units to stand on a floor surface, for example.

It is therefore desirable to provide a supporting body that is able to select a form of support to a display unit in accordance with a user's purpose or preference, an installation environment, or the like, and a display apparatus including such a supporting body and a display unit.

A supporting body according to an embodiment of the present disclosure supports a display unit to cause the display unit to stand on a placement surface, and includes a first supporting unit and a second supporting unit. The display unit has a display surface that spreads in each of a horizontal direction and a vertical direction, and has a center position in the horizontal direction, and a first edge and a second edge that are positioned opposite to each other in the horizontal direction with the center position interposed therebetween. The first supporting unit is detachably provided on the display unit. The second supporting unit is detachably provided on the display unit as a body different from the first supporting unit. Furthermore, in the supporting body according to the embodiment of the present disclosure, a first form and a second form are configured to be selectable. In the first form, the first supporting unit is mounted at a first position between the center position and the first edge in the horizontal direction of the display unit, and the second supporting unit is mounted at a second position between the center position and the second edge in the horizontal direction of the display unit. In the second form, the second supporting unit is mounted at the first position or a third position between the center position and the first edge in the horizontal direction of the display unit, and the first supporting unit is mounted at the second position or a fourth position between the center position and the second edge in the horizontal direction of the display unit.

BRIEF DESCRIPTION OF THE DRAWINGS

FIG. 1A is a front view of an entire configuration example in a first installation state of a display apparatus according to a first embodiment of the present disclosure.
FIG. 1B is a top view of the display apparatus illustrated in FIG. 1A as viewed from above.
FIG. 2A is a front view of an entire configuration example in a second installation state of the display apparatus according to the first embodiment of the present disclosure.
FIG. 2B is a top view of the display apparatus illustrated in FIG. 2A as viewed from above.
FIG. 3 is a schematic back view of a back surface of a display unit illustrated in FIG. 1A.
FIG. 4A is a first back view of a configuration example of a main part of a back surface in the display apparatus illustrated in FIG. 1A.
FIG. 4B is a second back view of a configuration example of the main part of the back surface in the display apparatus illustrated in FIG. 1A.
FIG. 5A is a first back view of a configuration example of a main part of the back surface in the display apparatus illustrated in FIG. 2A.
FIG. 5B is a second back view of a configuration example of the main part of the back surface in the display apparatus illustrated in FIG. 2A.
FIG. 6A is a perspective view of details of a first supporting unit illustrated in FIG. 4A.
FIG. 6B is a perspective view of details of a second supporting unit illustrated in FIG. 4B.
FIG. 7A is a first schematic view of attitudes of the first supporting unit and the second supporting unit illustrated in FIG. 6A and with respect to a placement surface.
FIG. 7B is a second schematic view of attitudes of the first supporting unit and the second supporting unit illustrated in FIG. 6A and with respect to the placement surface.
FIG. 8A is a front view of an entire configuration example in the first installation state of a display apparatus according to a second embodiment of the present disclosure.
FIG. 8B is a top view of the display apparatus illustrated in FIG. 8A as viewed from above.
FIG. 9A is a front view of an entire configuration example in the second installation state of the display apparatus according to the first embodiment of the present disclosure.
FIG. 9B is a top view of the display apparatus illustrated in FIG. 9A as viewed from above.
FIG. 10A is a perspective view of details of a first supporting unit illustrated in FIG. 8A.
FIG. 10B is a perspective view of details of a second supporting unit illustrated in FIG. 8A.
FIG. 11A is a front view of an entire configuration example in the first installation state of a display apparatus according to a third embodiment of the present disclosure.
FIG. 11B is a top view of the display apparatus illustrated in FIG. 11A as viewed from above.

FIG. 12A is a front view of an entire configuration example in the second installation state of the display apparatus according to the third embodiment of the present disclosure.

FIG. 12B is a top view of the display apparatus illustrated in FIG. 12A as viewed from above.

FIG. 13A is an enlarged back view of a first mounting section provided on a back surface of a display unit illustrated in FIG. 11A in an enlarged manner.

FIG. 13B is an enlarged back view of a second mounting section provided on the back surface of the display unit illustrated in FIG. 11A in an enlarged manner.

FIG. 14A is an enlarged back view of a first supporting unit and its vicinity in the display apparatus in the first installation state illustrated in FIG. 11A.

FIG. 14B is an enlarged back view of the first supporting unit and its vicinity in the display apparatus in the second installation state illustrated in FIG. 12A.

FIG. 15A is an enlarged back view of a second supporting unit and its vicinity in the display apparatus in the first installation state illustrated in FIG. 11A.

FIG. 15B is an enlarged back view of the second supporting unit and its vicinity in the display apparatus in the second installation state illustrated in FIG. 12A.

FIG. 16A is an exploded perspective view of the first supporting unit illustrated in FIG. 14A.

FIG. 16B is an exploded perspective view of the second supporting unit illustrated in FIG. 15A.

FIG. 17A is a front view of an entire configuration example in the first installation state of a display apparatus according to a fourth embodiment of the present disclosure.

FIG. 17B is a top view of the display apparatus illustrated in FIG. 17A as viewed from above.

FIG. 18A is a front view of an entire configuration example in the second installation state of the display apparatus according to the fourth embodiment of the present disclosure.

FIG. 18B is a top view of the display apparatus illustrated in FIG. 18A as viewed from above.

FIG. 19A is a perspective view of the display apparatus illustrated in FIG. 17A as obliquely viewed from front side.

FIG. 19B is a perspective view of the display apparatus illustrated in FIG. 18A as obliquely viewed from front side.

FIG. 20A is a back view of a first supporting unit illustrated in FIG. 17A as viewed from back side.

FIG. 20B is a back view of the first supporting unit illustrated in FIG. 18A as viewed from back side.

FIG. 21 is an exploded perspective view of details of the first supporting unit illustrated in FIG. 18A.

FIG. 22A is a partially enlarged perspective view of a positional relationship between a portion of the first supporting unit illustrated in FIG. 17A and a neck.

FIG. 22B is a partially enlarged perspective view of a positional relationship between a portion of the first supporting unit illustrated in FIG. 18A and a neck.

FIG. 23A is a back view of a second supporting unit illustrated in FIG. 17A as viewed from back side.

FIG. 23B is a back view of the second supporting unit illustrated in FIG. 18A as viewed from back side.

FIG. 23C is a back view of the second supporting unit illustrated in FIG. 18A as viewed from back side.

FIG. 24 is an exploded perspective view of details of the second supporting unit illustrated in FIG. 18A.

FIG. 25A is a partially enlarged perspective view of a positional relationship between a portion of the second supporting unit illustrated in FIG. 17A and a neck.

FIG. 25B is a partially enlarged perspective view of a positional relationship between a portion of the second supporting unit illustrated in FIG. 18A and a neck.

FIG. 26A is a front view of an entire configuration example in a third installation state of the display apparatus according to the fourth embodiment of the present disclosure.

FIG. 26B is a top view of the display apparatus illustrated in FIG. 26A as viewed from above.

FIG. 27A is a front view of an entire configuration example in a fourth installation state of the display apparatus according to the fourth embodiment of the present disclosure.

FIG. 27B is a top view of the display apparatus illustrated in FIG. 27A as viewed from above.

FIG. 28A is a back view of the first supporting unit illustrated in FIG. 26A as viewed from back side.

FIG. 28B is a back view of the second supporting unit illustrated in FIG. 26B as viewed from back side.

FIG. 29A is a back view of the second supporting unit illustrated in FIG. 27A as viewed from back side.

FIG. 29B is a back view of the first supporting unit illustrated in FIG. 27B as viewed from back side.

MODES FOR CARRYING OUT THE INVENTION

In a supporting body and a display apparatus including the supporting body of the present disclosure, a first installation state and a second installation state are configured to be selectable. In the following, some embodiments of the present disclosure are described in detail with reference to the drawings. It is to be noted that description is given in the following order.

1. First Embodiment
A first example of a display apparatus including a stand that includes a pair of supporting units between which an interval in a horizontal direction is changeable
2. Second Embodiment
A second example of a display apparatus including a stand that includes a pair of supporting units between which an interval in the horizontal direction is changeable
3. Third Embodiment
A first example of a display apparatus including a stand that includes a pair of supporting units that are able to change a height position in a vertical direction of a display unit
4. Fourth Embodiment
A second example of a display apparatus including a stand that includes a pair of supporting units that are able to change a height position in the vertical direction of a display unit
5. Other Modification Examples 1. First Embodiment

[Configuration of Display Apparatus 100]

FIGS. 1A and 1B illustrate an entire configuration example in the first installation state of a display apparatus 100 according to a first embodiment of the present disclosure. FIG. 1A is a front view of the display apparatus 100 in the first installation state as viewed from front side (viewer's side), and FIG. 1B is a top view of the display apparatus 100 in the first installation state as viewed from above.

FIGS. 2A and 2B illustrate an entire configuration example in the second installation state of the display apparatus 100. FIG. 2A is a front view of the display apparatus 100 in the second installation state as viewed from front side (viewer's side), and FIG. 2B is a top view of the display apparatus 100 in the second installation state as viewed from above.

As illustrated in FIGS. 1A, 1B, 2A, and 2B, the display apparatus 100 is a so-called stationary type display apparatus including a display unit 1 and a stand 2 as a supporting body that supports the display unit 1 on a placement surface FS. It is to be noted that the placement surface FS is a horizontal surface such as a floor surface, a shelf surface, or a top surface of a board.

(Display Unit 1)

The display unit 1 includes, for example, a display panel 11 and a main body 12. The display panel 11 has a display surface 1A that displays an image toward front side, and the main body 12 holds the display panel 11. The display surface 1A is a horizontally long rectangular screen extending in each of the horizontal direction and the vertical direction, and has a first edge 1R and a second edge 1L that are positioned opposite to each other in the horizontal direction with a center position CP interposed therebetween. It is to be noted that in this description, the horizontal direction is referred to as an X-axis direction, the vertical direction is referred to as a Y-axis direction, and a front-back direction intersecting with the display surface 1A is referred to as a Z-axis direction. Examples of the display panel 11 include a liquid crystal display device including a liquid crystal layer, an organic EL display device including an organic EL element, and the like.

As illustrated in FIG. 3, the main body 12 is, for example, a housing that holds the display panel 11 and a circuit board provided with a drive circuit that drives the display panel 11, an image processing circuit, and the like. The main body 12 has a back surface 1B opposite to the display surface 1A, and a lower portion of the back surface 1B is provided with mounting sections at two points each on left and right sides, for a total of four points. Specifically, the main body 12 includes outer mounting sections 13L and 13R provided near respective ends in the horizontal direction of the display panel 11, and inner mounting sections 14L and 14L provided between these outer mounting sections 13L and 13R. Each of the outer mounting sections 13L and 13R and the inner mounting sections 14L and 14R is, for example, a portion recessed from another portion of the back surface 1B of the main body 12, and is provided with screw holes into which screws are screwed at three or more points, for example. It is to be noted that FIG. 3 is a schematic back view of the back surface 1B of the display unit 1. In FIG. 3, the stand 2 is not illustrated.

(Stand 2)

As illustrated in FIGS. 1A, 1B, 2A, and 2B, the stand 2 includes a first supporting unit 2A and a second supporting unit 2B. The first supporting unit 2A and the second supporting unit 2B are provided as different bodies, and each are detachably provided on the display unit 1.

In the first installation state (FIGS. 1A and 1B), the first supporting unit 2A is mounted on the outer mounting section 13R (a first position) between the center position CP and the first edge 1R in the X-axis direction of the display unit 1. In the second installation state (FIGS. 2A and 2B), the first supporting unit 2A is mounted on the inner mounting section 14L (a fourth position) between the center position CP and the second edge 1L in the X-axis direction of the display unit 1. More specifically, as illustrated in FIGS. 4A and 5A, the first supporting unit 2A includes a neck 20A as a first attaching section detachably formed on the display unit 1, a base 21A as a first base section that is to be in contact with the placement surface FS, and an arm 22A that joins the neck 20A and the base 21A together. Here, the neck 20A and a plate-like member 23A (to be described later) of the base 21A are integrally formed with the arm 22A interposed therebetween. It is possible to manufacture the neck 20A, the arm 22A, and the plate-like member 23A of the first supporting unit 2A, for example, by bending of one sheet metal member such as stainless steel, or the like, or by casting. However, the first supporting unit 2A may be a unit formed by individually molding a plurality of members and then bonding the members by welding or the like. It is to be noted that an elastic member 24A and a cover 25A that are to be described later of the base 21A may be fabricated separately from the plate-like member 23A and attached to the plate-like member 23A in a different process.

FIG. 4A is an enlarged perspective view of the first supporting unit 2A mounted on the outer mounting section 13R, and its vicinity in the first installation state in an enlarged manner. FIG. 5A is an enlarged perspective view of the first supporting unit 2A mounted on the inner mounting section 14L, and its vicinity in the second installation state in an enlarged manner.

In the first installation state (FIGS. 1A and 1B), the second supporting unit 2B is mounted on the outer mounting section 13L (a second position) between the center position CP and the second edge 1L in the X-axis direction of the display unit 1. In the second installation state (FIGS. 2A and 2B), the second supporting unit 2B is mounted on the inner mounting section 14R (a third position) between the center position CP and the first edge 1R in the X-axis direction of the display unit 1. Accordingly, the first installation state is opposite to the second installation state in a positional relationship between the first supporting unit 2A and the second supporting unit 2B in a right-left direction. More specifically, as illustrated in FIGS. 4B and 5B, the second supporting unit 2B includes a neck 20B as a second attaching section detachably formed on the display unit 1, a base 21B as a second base section that is to be in contact with the placement surface FS, and an arm 22B that joins the neck 20B and the base 21B together. As with the first supporting unit 2A, the second supporting unit 2B is formed by integrally forming the neck 20B and a plate-like member 23B (to be described later) of the base 21B with the arm 22B interposed therebetween. It is possible to manufacture the neck 20B, the arm 22B, and the plate-like member 23B of the second supporting unit 2B, for example, by bending of one sheet metal member such as stainless steel, or the like, or by casting. However, the second supporting unit 2B may be a unit formed by individually molding a plurality of members and then bonding the members by welding or the like. It is to be noted that an elastic member 24B and a cover 25B that are to be described later of the base 21B may be fabricated separately from the plate-like member 23B and attached to the plate-like member 23B in a different process.

FIG. 4B is an enlarged perspective view of the second supporting unit 2B mounted on the outer mounting section 13L, and its vicinity in the first installation state in an enlarged manner. FIG. 5B is an enlarged perspective view of the second supporting unit 2B mounted on the inner mounting section 14R, and its vicinity in the second installation state in an enlarged manner.

As illustrated in FIGS. 4A, 4B, 5A, and 5B, in the display apparatus 100, a first installation attitude of the base 21A and the base 21B with respect to the placement surface FS in the first installation state (FIGS. 4A and 4B) is different from a second installation attitude of the base 21A and the base 21B with respect to the placement surface FS in the second installation state (FIGS. 5A and 5B). That is, in the display apparatus 100, rotating each of the first supporting unit 2A and the second supporting unit 2B in the first installation state by about 90☐ makes it possible to change from the first installation state to the second installation state. In the display apparatus 100, reversely, rotating each of the first supporting unit 2A and the second supporting unit 2B in the second installation state by about 90☐ makes it possible to change from the second installation state to the first installation state.

In the display apparatus 100, a distance D1A (FIG. 1B) between the base 21A and the center position CP in the first installation state is longer than a distance D2A (FIG. 2B) between the base 21A and the center position CP in the second installation state. In addition, a distance D1B (FIG. 1B) between the base 21B and the center position CP in the first installation state is longer than a distance D2B (FIG. 2B) between the base 21B and the center position CP in the second installation state. That is, in the first installation state, the base 21A and the base 21B are located at positions far from the center position CP in the X-axis direction, as compared with the second installation state. It is to be noted that in terms of an improvement in supporting stability, it is desirable that the distance D1A and the distance D1B be equal to each other in the first installation state, and it is desirable that the distance D2A and the distance D2B be equal to each other in the second installation state.

More specifically, in the first installation state, the neck 20A is mounted on the outer mounting section 13R to cause at least a portion of the base 21A to protrude on side opposite to the center position CP (that is, outside the display surface 1A) as viewed from the first edge 1R, and the neck 20B is mounted on the outer mounting section 13L to cause at least a portion of the base 21B to protrude on side opposite to the center position CP (that is, outside the display surface 1A) as viewed from the second edge 1L. In addition, in the second installation state, the neck 20A is mounted on the inner mounting section 14L to place the base 21A between the first edge 1R and the center position CP, and the neck 20B is mounted on the inner mounting section 14R to place the base 21B between the second edge 1L and the center position CP.

FIG. 6A illustrates an entire configuration example of the first supporting unit 2A. As illustrated in FIG. 6A, the neck 20A has holes 261A to 263A into which screws NA1 to NA3 (see FIGS. 4A and 5A) are inserted, at positions of vertices of a triangle. The neck 20A is fastened to the outer mounting section 13R or the inner mounting section 14L by the screws NA1 to NA3 (see FIGS. 4A and 5A). FIG. 6B illustrates an entire configuration example of the second supporting unit 2B. As illustrated in FIG. 6B, the neck 20B has holes 261B to 263B into which screws NB1 to NB3 (see FIGS. 4B and 5B) are inserted, at positions of vertices of a triangle. The neck 20B is fastened to the outer mounting section 13L or the inner mounting section 14R by the screws NB1 to NB3 (see FIGS. 4B and 5B).

In the first installation state, the neck 20A is fixed to the outer mounting section 13R in an attitude in which the screws NA1 and NA3 are separated from the screw NA2 in the Y-axis direction (FIG. 4A). In the second installation state, the neck 20A is fixed to the inner mounting section 14L in an attitude in which the screws NA2 and NA3 are separated from the screw NA1 in the Y-axis direction (FIG. 5A). In the first installation state, the neck 20B is fixed to the outer mounting section 13L in an attitude in which the screws NB1 and NB3 are separated from the screw NB2 in the Y-axis direction (FIG. 4B). In the second installation state, the neck 20B is fixed to the inner mounting section 14R in an attitude in which the screws NB2 and NB3 are separated from the screw NB1 in the Y-axis direction (FIG. 5B). This makes it possible to prevent the display unit 1 from falling in the front-back direction (the Z-axis direction) in both the first installation state and the second installation state even in a case where the stand 2 is downsized. It is to be noted that the necks 20A and 20B may be fixed to the display unit 1 at four or more points.

In addition, the neck 20A is provided with an opening 27A1 including a round hole portion 271A and a long hole portion 272A, and a notch 27A2. As illustrated in FIG. 4A, two machine screws 15R1 and 15R2 are provided to stand on the outer mounting section 13R. The machine screw 15R1 is engaged in the long hole portion 272A of the opening 27A1, and the machine screw 15R2 is engaged in the notch 27A2, thereby temporarily fixing the first supporting unit 2A to the outer mounting section 13R in a stage before fastening the neck 20A by the screws NA1 to NA3. It is to be noted that the machine screw 15R1 is inserted in the round hole portion 271A of the opening 27A1, and thereafter slides into and is engaged in the long hole portion 272A. Likewise, as illustrated in FIG. 5A, two machine screws 16L1 and 16L2 are provided to stand on the inner mounting section 14L. The machine screw 16L1 is engaged in the long hole portion 272A of the opening 27A1, and the machine screw 16L2 is engaged in the notch 27A2, thereby temporarily fixing the first supporting unit 2A to the inner mounting section 14L in a stage before fastening the neck 20A by the screws NA1 to NA3. It is to be noted that the machine screw 16L1 is inserted in the round hole portion 271A of the opening 27A1, and thereafter slides into and is engaged in the long hole portion 272A.

The neck 20B is provided with an opening 27B1 including a round hole portion 271B and a long hole portion 272B, and a notch 27B2. As illustrated in FIG. 4B, two machine screws 15L1 and 15L2 are provided to stand on the outer mounting section 13L. The machine screw 15L1 is engaged in the long hole portion 272B of the opening 27B1, and the machine screw 15LR2 is engaged in the notch 27B2, thereby temporarily fixing the second supporting unit 2B to the outer mounting section 13L in a stage before fastening the neck 20B by the screws NB1 to NB3. It is to be noted that the machine screw 15L1 is inserted in the round hole portion 271B of the opening 27B1, and thereafter slides into and is engaged in the long hole portion 272B. Likewise, as illustrated in FIG. 5B, two machine screws 16R1 and 16R2 are provided to stand on the inner mounting section 14R. The machine screw 16R1 is engaged in the long hole portion 272B of the opening 27B1, and the machine screw 16R2 is engaged in the notch 27B2, thereby temporarily fixing the second supporting unit 2B to the inner mounting section 14R in a stage before fastening the neck 20B by the screws NB1 to NB3. It is to be noted that the machine screw 16R1 is inserted in the round hole portion 271B of the opening 27B1, and thereafter slides into and is engaged in the long hole portion 272B.

As illustrated in FIGS. 4A, 5A, and 6A, the base 21A of the first supporting unit 2A extends, for example, in the Z-axis direction intersecting with the display surface 1A, and includes a plate-like member 23A, an elastic member 24A, and a cover 25A. The plate-like member 23A includes a material having high strength such as stainless steel, and is coupled to an end, on side opposite to the neck 20A, of the arm 22A. The elastic member 24A includes, for example, an elastic material such as rubber, and is mounted on side opposite to the arm 22A of the plate-like member 23A. The elastic member 24A has, for example, a flat plate shape, and is adhered and fixed to the plate-like member 23A. The elastic member 24A is in contact with the placement surface FS in both the first installation state (FIGS. 1A and 1B) and the second installation state (FIGS. 2A and 2B). The cover 25A is a member that covers the elastic member 24A, and is detachably provided on the elastic member 24A. The cover 25A is attached in the first installation state to cover the elastic member 24A, and is detached in the second installation state.

Likewise, as illustrated in FIGS. 4B, 5B, and 6B, the base 21B of the second supporting unit 2B extends, for example, in the Z-axis direction, and includes a plate-like member 23B, an elastic member 24B, and a cover 25B. The plate-like member 23B includes a material having high strength such as stainless steel, and is coupled to an end, on side opposite to the neck 20B, of the arm 22B. The elastic member 24B includes, for example, an elastic material such as rubber, and is mounted on side opposite to the arm 22B of the plate-like member 23B. The elastic member 24B has, for example, a flat plate shape, and is adhered and fixed to the plate-like member 23B. The elastic member 24B is in contact with the placement surface FS in both the first installation state (FIGS. 1A and 1B) and the second installation state (FIGS. 2A and 2B). The cover 25B is a member that covers the elastic member 24B, and is detachably provided on the elastic member 24B. The cover 25B is attached in the first installation state to cover the elastic member 24B, and is detached in the second installation state.

FIG. 7A is an enlarged schematic view of a positional relationship between the bases 21A and 21B and the placement surface FS in the first installation state. FIG. 7B is an enlarged schematic view of a positional relationship between the bases 21A and 21B and the placement surface FS in the second installation state. As illustrated in FIGS. 7A and 7B, the elastic members 24A and 24B are in contact with the placement surface FS in both the first installation state (FIGS. 1A and 1B) and the second installation state (FIGS. 2A and 2B). However, contact portions of the elastic members 24A and 24B with the placement surface FS in the first installation state are different from contact portions of the elastic members 24A and 24B with the placement surface FS in the second installation state.

Specifically, in the first installation state, as illustrated in FIG. 7A, the bases 21A and 21B are provided to stand on the placement surface FS. Accordingly, in the first installation state (FIG. 7A), an end surface 24TA of the elastic member 24A and an end surface 24TB of the elastic member 24B each abut on the placement surface FS. In contrast, in the second installation state, as illustrated in FIG. 7B, the bases 21A and 21B have an attitude in which main surfaces of the bases 21A and 21B spread along the placement surface FS. Accordingly, in the second installation state (FIG. 7B), a main surface 24SA of the elastic member 24A and a main surface 24SB of the elastic member 24B each abut on the placement surface FS. That is, a ratio (W21A/T21A) of a dimension W21A in the Y-axis direction to a dimension T21A in the X-axis direction of the base 21A in the first installation state is larger than a ratio (T21A/W21A) of a dimension T21A in the Y-axis direction to a dimension W21A in the X-axis direction of the base 21A in the second installation state. Likewise, a ratio (W21B/T21B) of a dimension W21B in the Y-axis direction to a dimension T21B in the X-axis direction of the base 21B in the first installation state is larger than a ratio (T21B/W21B) of a dimension T21B in the Y-axis direction to a dimension W21B in the X-axis direction of the base 21B in the second installation state.

Thus, in the base 21A, a contact area between the placement surface FS and the elastic member 24A in the second installation state is wider than a contact area between the placement surface FS and the elastic member 24A in the first installation state. Likewise, in the base 21B, a contact area between the placement surface FS and the elastic member 24B in the second installation state is wider than a contact area between the placement surface FS and the elastic member 24B in the first installation state.

[Workings and Effects of Display Apparatus 100]

As described above, according to the display apparatus 100 according to the present embodiment, the display unit 1 is stably supported by the stand 2 as a supporting body. In addition, in the display apparatus 100, the first installation state and the second installation state are configured to be selectable by rearrangement of the first supporting unit 2A and the second supporting unit 2B with respect to the display unit 1, which makes it possible to realize two viewing positions. This makes it possible to select a form of support to the display unit 1 in accordance with a user's purpose or preference, an installation environment, or the like.

Specifically, it is possible to select the first installation state in an environment in which it is possible to secure the placement surface FS having a sufficient width. In this case, an interval between the base 21A of the first supporting unit 2A and the base 21B of the second supporting unit 2B is widened, which makes it possible to secure sufficient supporting stability, for example, even in a case where the bases 21A and 21B are provided to stand on the placement surface FS. In contrast, in an environment in which it is not possible to secure the placement surface FS having a sufficient width, it is possible to select the second installation state. In the second installation state, the interval between the base 21A and the base 21B is narrowed as compared with the first installation state; however, for example, the base 21A and the base 21B have an attitude in which the main surfaces thereof are opposed to the placement surface FS, thereby making it possible to secure sufficient supporting stability.

Furthermore, mounting sections (the outer mounting sections 13L and 13R) of the first supporting unit 2A and the second supporting unit 2B in the first installation state, and mounting sections (the inner mounting sections 14L and 14R) of the first supporting unit 2A and the second supporting unit 2B in the second installation state are separately provided. Accordingly, although an installation attitude of the first supporting unit 2A and the second supporting unit 2B with respect to the placement surface FS in the first installation state is different from an installation attitude of the first supporting unit 2A and the second supporting unit 2B with respect to the placement surface FS in the second installation state, it is possible to make a height of the display unit 1 from the placement surface FS substantially equal between the first installation state and the second installation state.

In addition, in the display apparatus 100, the first supporting unit 2A and the second supporting unit 2B that are made common in the first installation state and the second installation state are each used. Furthermore, both the elastic members 24A and 24B are provided to be contactable with the placement surface FS in both the first installation state and the second installation state. Accordingly, the number of components is reduced as compared with a case where different stands are used for the first installation state and the second installation state, or the like, which is advantageous in cost reduction, and complicated work for a user, such as storage, is not necessary and there is no possibility of losing components.

In addition, in the display apparatus 100, each of the first supporting unit 2A and the second supporting unit 2B is integrated, thereby making it possible to reduce the number of components, which is advantageous in cost reduction. In addition, rearrangement work of the first installation state and the second installation state by a user is easy.

In addition, in the display apparatus 100, in the first installation state, the neck 20A is mounted on the outer mounting section 13R to cause at least a portion of the base 21A to protrude outside the display surface 1A, and the neck 20B is mounted on the outer mounting section 13L to cause at least a portion of the base 21B to protrude outside the display surface 1A. Accordingly, in the first installation state, it is possible to prevent the bases 21A and 21B from being reflected on the display surface 1A, resulting in an improvement in image viewability. In addition, in the second installation state, the base 21A is placed between the first edge 1R and the center position CP, and the base 21B is placed between the second edge 1L and the center position CP. Accordingly, in the second installation state, as compared with the first installation state, installation on the placement surface FS having a smaller width is possible, resulting in an improvement in flexibility in installation location.

In addition, in the display apparatus 100, in the first installation state, the bases 21A and 21B are provided to stand on the placement surface FS. That is, a dimension ratio W21A/T21A of the base 21A in the first installation state is larger than a dimension ratio T21A/W21A of the base 21A in the second installation state, and a dimension ratio W21B/T21B of the base 21B in the first installation state is larger than a dimension ratio T21B/W21B of the base 21B in the second installation state. Accordingly, it is possible to reduce a protruding amount of the base 21A from the display unit 1 and a protruding amount of the base 21B from the display unit 1 in the first installation state, resulting in superior aesthetics. In contrast, areas of surfaces opposed to the placement surface FS of the bases 21A and 21B in the second installation state are larger than those in the first installation state, resulting in an improvement in supporting stability.

In addition, in the display apparatus 100, the contact portions of the elastic members 24A and 24B with the placement surface FS in the first installation state are different from the contact portions of the elastic members 24A and 24B with the placement surface FS in the second installation state, resulting in an improvement in flexibility in design selection.

In addition, in the display apparatus 100, contact areas between the placement surface FS and the elastic members 24A and 24B in the bases 21A and 21B in the second installation state are wider than contact areas between the placement surface FS and the elastic members 24A and 24B in the first installation state. Accordingly, even in the second installation state in which an interval between the base 21A and the base 21B is narrowed, supporting stability of the display unit 1 by the stand 2 is further improved.

In addition, in the display apparatus 100, the neck 20A and the neck 20B are provided to be fixable to the display unit 1 at a plurality of points including three points that are positions of vertices of a triangle. Accordingly, supporting stability in both the X-axis direction and the Y-axis direction is still further improved.

2. Second Embodiment

[Configuration of Display Apparatus 200]

FIGS. 8A and 8B illustrate an entire configuration example in the first installation state of a display apparatus 200 according to a second embodiment of the present disclosure. FIG. 8A is a front view of the display apparatus 200 in the first installation state as viewed from front side (viewer's side), and FIG. 8B is a top view of the display apparatus 200 in the first installation state as viewed from above.

FIG. 9A and FIG. 9B illustrate an entire configuration example in the second installation state of the display apparatus 200. FIG. 9A is a front view of the display apparatus 200 in the second installation state as viewed from front side (viewer's side), and FIG. 9B is a top view of the display apparatus 200 in the second installation state as viewed from above.

As illustrated in FIGS. 8A, 8B, 9A, and 9B, the display apparatus 200 is a so-called stationary type display apparatus including a display unit 3 and a stand 4 as a supporting body that supports the display unit 3 on the placement surface FS.

(Display Unit 3)

The display unit 3 basically has the same configuration as that of the display unit 1 according to the first embodiment described above. The display unit 3 includes, for example, a display panel 31 and a main body 32. The display panel 31 has a display surface 3A that displays an image toward front side, and the main body 32 holds the display panel 31. The display surface 3A is a horizontally long rectangular screen extending in each of the X-axis direction and the Y-axis direction, and has a first edge 3R and a second edge 3L that are positioned opposite to each other in the X-axis direction with the center position CP interposed therebetween. Examples of the display panel 31 include a liquid crystal display device including a liquid crystal layer, an organic EL display device including an organic EL element, and the like.

The main body 32 is, for example, a housing that holds the display panel 31 and a circuit board provided with a drive circuit that drives the display panel 31, an image processing circuit, and the like. The main body 32 has a back surface 3B opposite to the display surface 3A. A lower portion of the main body 32 is provided with one mounting hole 33L and one mounting hole 33R respectively on the left and the right. The mounting holes 33L and 33R each have an opening directed downward, and extend in the Y-axis direction. Specifically, the mounting hole 33R is provided at a position (a first position) between the center position CP and the first edge 3R in the X-axis direction, and the mounting hole 33L is provided at a position (a second position) between the center position CP and the second edge 3L in the X-axis direction.

(Stand 4)

As illustrated in FIGS. 8A, 8B, 9A, and 9B, the stand 4 includes a first supporting unit 4A and a second supporting unit 4B. The first supporting unit 4A and the second supporting unit 4B are provided as different bodies, and each are detachably provided on the display unit 3. In the display apparatus 200, the mounting position of the first supporting unit 4A on the display unit 3 and the mounting position of the second supporting unit 4B on the display unit 3 are replaced with each other, which makes it possible to switch between the first installation state and the second installation state.

In the first installation state (FIGS. 8A and 8B), the first supporting unit 4A is mounted in the mounting hole 33R of the display unit 3. In the second installation state (FIGS. 9A and 9B), the first supporting unit 4A is mounted in the mounting hole 33L of the display unit 3.

More specifically, as illustrated in FIG. 10A, the first supporting unit 4A includes a neck 40A as a first attaching section detachably formed on the display unit 3, a base 41A as a first base section that is to be in contact with the placement surface FS, and an beam 42A that joins the neck 40A and the base 41A together. FIG. 10A is a perspective view of an entire configuration of the first supporting unit 4A. The neck 40A is a portion extending in the Y-axis direction in the first installation state and the second installation state, and has a shape insertable into both the mounting hole 33R and the mounting hole 33L. The neck 40A is inserted into the mounting hole 33R or the mounting hole 33L, which allows the first supporting unit 4A to be held by the display unit 3 with enough strength not to be dropped by its weight. In addition, strongly pulling the first supporting unit 4A makes it possible to remove the first supporting unit 4A from the display unit 3. In addition, the beam 42A is, for example, a portion extending in the X-axis direction in the first installation state and the second installation state. Furthermore, the base 41A includes a leg section 41A1 and a leg section 41A2 that extend in directions opposite to each other in plan views illustrated in FIGS. 8B and 9B. The leg section 41A1 and the leg section 41A2 extend downward with an increasing distance from a point coupled to the beam 42A in the first installation state and the second installation state. An elastic member 43A1 is mounted on a tip of the leg section 41A1, and an elastic member 43A2 is mounted on a tip of the leg section 41A2. It is to be noted that the neck 40A and the base 41A are integrally formed with the beam 42A interposed therebetween.

The second supporting unit 4B has a configuration bilaterally symmetrical to that of the first supporting unit 4A. Specifically, as illustrated in FIG. 10B, the second supporting unit 4B includes a neck 40B as a second attaching section detachably formed on the display unit 3, a base 41B as a second base section that is to be in contact with the placement surface FS, and an beam 42B that joins the neck 40B and the base 41B together. FIG. 10B is a perspective view of an entire configuration of the second supporting unit 4B. The neck 40B is a portion extending in the Y-axis direction in the first installation state and the second installation state, and has a shape insertable into both the mounting hole 33R and the mounting hole 33L. The neck 40B is inserted into the mounting hole 33R or the mounting hole 33L, which allows the second supporting unit 4B to be held by the display unit 3 with enough strength not to be dropped by its weight. In addition, strongly pulling the second supporting unit 4B makes it possible to remove the second supporting unit 4B from the display unit 3. In addition, the beam 42B is, for example, a portion extending in the X-axis direction in the first installation state and the second installation state. Furthermore, the base 41B includes a leg section 41B1 and a leg section 41B2 that extend in directions opposite to each other in plan views illustrated in FIGS. 8B and 9B. The leg section 41B1 and the leg section 41B2 extend downward with an increasing distance from a point coupled to the beam 42B in the first installation state and the second installation state. An elastic member 43B1 is mounted on a tip of the leg section 41B1, and an elastic member 43B2 is mounted on a tip of the leg section 41B2. It is to be noted that the neck 40B and the base 41B are integrally formed with the beam 42B interposed therebetween.

In the display apparatus 200, a distance D3A (FIG. 8B) between the base 41A and the center position CP in the first installation state is longer than a distance D4A (FIG. 9B) between the base 41A and the center position CP in the second installation state. In addition, a distance D3B (FIG. 8B) between the base 41B and the center position CP in the first installation state is longer than a distance D3B (FIG. 9B) between the base 41B and the center position CP in the second installation state. That is, in the first installation state, the base 41A and the base 41B are located at positions far from the center position CP in the X-axis direction, as compared with the second installation state. It is to be noted that in terms of an improvement in supporting stability, it is desirable that the distance D3A and the distance D3B be equal to each other in the first installation state, and it is desirable that the distance D4A and the distance D4B be equal to each other in the second installation state.

In the display apparatus 200, attitudes of the first supporting unit 4A and the second supporting unit 4B in the first installation state are substantially the same as attitudes of the first supporting unit 4A and the second supporting unit 4B in the second installation state. Accordingly, in the display apparatus 200, contact portions of the elastic members 43A1 and 43A2 with the placement surface FS in the first installation state are respectively the same as contact portions of the elastic members 43A1 and 43A2 with the placement surface FS in the second installation state. Likewise, contact portions of the elastic members 43B1 and 43B2 with the placement surface FS in the first installation state are respectively the same as contact portions of the elastic members 43B 1 and 43B2 with the placement surface FS in the second installation state.

In the display apparatus 200, in the first installation state, the neck 40A is inserted into the mounting hole 33R to mount the first supporting unit 4A on the display unit 3, and the neck 40B is inserted into the mounting hole 33L to mount the second supporting unit 4B on the display unit 3. In addition, in the second installation state, the neck 40B is inserted into the mounting hole 33R to mount the second supporting unit 4B on the display unit 3, and the neck 40A is inserted into the mounting hole 33L to mount the first supporting unit 4A on the display unit 3.

In addition, in the first installation state, the neck 40A is mounted in the mounting hole 33R to place the base 41A between the first edge 3R and the center position CP. Note that FIGS. 8A and 8B illustrate, as an example, a state in which the position of the base 41A substantially coincides in the X-axis direction with the position of the first edge 3R. Likewise, in the first installation state, the neck 40B is mounted in the mounting hole 33L to place the base 41B between the second edge 3L and the center position CP. Note that FIGS. 8A and 8B illustrate, as an example, a state in which the position of the base 41B substantially coincides in the X-axis direction with the position of the second edge 3L.

In contrast, in the second installation state, the neck 40A is mounted in the mounting hole 33L to place the base 41A between the second edge 3L and the center position CP. Note that FIGS. 9A and 9B illustrate, as an example, a state in which the position of the base 41A is located inside the mounting hole 33L in the X-axis direction. Likewise, in the second installation state, the neck 40B is mounted in the mounting hole 33R to place the base 41B between the first edge 3R and the center position CP. Note that FIGS. 9A and 9B illustrate, as an example, a state in which the position of the base 41B is located inside the mounting hole 33R in the X-axis direction.

[Workings and Effects of Display Apparatus 200]

As described above, according to the display apparatus 200 according to the present embodiment, the display unit 3 is stably supported by the stand 4 as a supporting body. In addition, in the display apparatus 200, the first installation state and the second installation state are configured to be selectable by replacing the mounting position of the first supporting unit 4A on the display unit 3 and the mounting position of the second supporting unit 4B on the display unit 3 with each other. Accordingly, it is possible to realize two viewing positions in the display apparatus 200. This makes it possible to select a form of support to the display unit 3 in accordance with a user's purpose or preference, an installation environment, or the like.

Specifically, it is possible to select the first installation state in an environment in which it is possible to secure the placement surface FS having a sufficient width. In contrast, in an environment in which it is not possible to secure the placement surface FS having a sufficient width, it is possible to select the second installation state.

In addition, in the display apparatus 200, the first supporting unit 4A and the second supporting unit 4B have a configuration in which the necks 40A and 40B are respectively coupled to the bases 41A and 41B by the beams 42A and 42B extending in the X-axis direction. Accordingly, it is possible to change abutting positions of the bases 41A and 41B on the placement surface FS in the first installation state and the second installation state while the mounting holes 33L and 33R, in which the necks 40A and 40B are attached, are made common in the first installation state and the second installation state. This makes it possible to maintain a simple configuration without need to form an extra mounting hole in the display unit 3.

In addition, in the display apparatus 200, attitudes of the first supporting unit 4A and the second supporting unit 4B in the first installation state are substantially the same as attitudes of the first supporting unit 4A and the second supporting unit 4B in the second installation state. That is, in the display apparatus 200, upon switching between the first installation state and the second installation state, it is sufficient if the first supporting unit 4A and the second supporting unit 4B are moved in parallel without being rotated, and the mounting positions on the left and the right are replaced with each other. Accordingly, it is possible to make a height of the display unit 3 from the placement surface FS substantially equal between the first installation state and the second installation state.

In addition, in the display apparatus 200, the first supporting unit 4A and the second supporting unit 4B that are made common in the first installation state and the second installation state are each used. Accordingly, the number of components is reduced as compared with a case where different stands are used for the first installation state and the second installation state, or the like, which is advantageous in cost reduction, and complicated work for a user, such as storage is not necessary and there is no possibility of losing components.

In addition, in the display apparatus 200, each of the first supporting unit 4A and the second supporting unit 4B is integrated, thereby making it possible to reduce the number of components, which is advantageous in cost reduction. In addition, rearrangement work of the first installation state and the second installation state by a user is easy.

In addition, in the display apparatus 200, the contact portions of the elastic members 43A1 and 43A2 with the placement surface FS in the first installation state are the same as the contact portions of the elastic members 43A1 and 43A2 with the placement surface FS in a second form. Likewise, the contact portions of the elastic members 43B 1 and 43B2 with the placement surface FS in the first installation state are the same as the contact portions of the elastic members 43B1 and 43B2 with the placement surface FS in the second form. Accordingly, it is easy to reduce dimensions of the elastic members 43A1 and 43A2 and the elastic members 43B1 and 43B2, and it is easy to correspond to various designs.

In the display apparatus 200, in both the first installation state and the second installation state, inserting each of the necks 40A and 40B into a corresponding one of the mounting hole 33L and the mounting hole 33R makes it possible to mount the first supporting unit 4A and the second supporting unit 4B on the display unit 3. This makes it possible to easily execute rearrangement work of the first installation state and the second installation state.

3. Third Embodiment

[Configuration of Display Apparatus 300]

FIGS. 11A and 11B illustrate an entire configuration example in the first installation state of a display apparatus 300 according to a third embodiment of the present disclosure. FIG. 11A is a front view of the display apparatus 300 in the first installation state as viewed from front side (viewer's side), and FIG. 11B is a top view of the display apparatus 300 in the first installation state as viewed from above.

FIGS. 12A and 12B illustrate an entire configuration example in the second installation state of the display apparatus 300. FIG. 12A is a front view of the display apparatus 300 in the second installation state as viewed from front side (viewer's side), and FIG. 12B is a top view of the display apparatus 300 in the second installation state as viewed from above.

As illustrated in FIGS. 11A, 11B, 12A, and 12B, the display apparatus 300 is a so-called stationary type display apparatus including a display unit 5 and a stand 6 as a supporting body that supports the display unit 5 on the placement surface FS. In the display apparatus 300, a first height H1 in the Y-axis direction from the placement surface FS to a lower end of the display unit 5 in the first installation state is higher than a second height H2 in the Y-axis direction from the placement surface FS to the lower end of the display unit 5 in the second installation state. That is, the first installation state is a high-position state in which the display unit 5 is installed at a relatively high position, and the second installation state is a low-position state in which the display unit 5 is installed at a relatively low position.

(Display Unit 5)

The display unit 5 basically has the same configuration as that of the display unit 1 according to the first embodiment described above. The display unit 5 includes, for example, a display panel 51 and a main body 52. The display panel 51 has a display surface 5A that displays an image toward front side, and the main body 52 holds the display panel 51. The display surface 5A is a horizontally long rectangular screen extending in each of the X-axis direction and the Y-axis direction, and has a first edge 5R and a second edge 5L that are positioned opposite to each other in the X-axis direction with the center position CP interposed therebetween. Examples of the display panel 51 include a liquid crystal display device including a liquid crystal layer, an organic EL display device including an organic EL element, and the like.

The main body 52 is, for example, a housing that holds the display panel 51 and a circuit board provided with a drive circuit that drives the display panel 51, an image processing circuit, and the like. The main body 52 has a back surface 5B opposite to the display surface 5A. A lower portion of the main body 52 is provided with a mounting section 53R near the first edge 5R, and is provided with a mounting section 53L near the second edge 5L. As illustrated in FIG. 13A, the mounting section 53R has a plurality of screw holes 54R (541R to 544R) arranged along a first straight line LN1. As illustrated in FIG. 13B, the mounting section 53L has a plurality of screw holes 54L (541L to 544L) arranged along a second straight line LN2. It is to be noted that FIG. 13A is an enlarged view of the mounting section 53R and its vicinity in the back surface 5B of the display unit 5. FIG. 13B is an enlarged view of the mounting section 53L and its vicinity in the back surface 5B of the display unit 5.

(Stand 6)

As illustrated in FIGS. 11A, 11B, 12A, and 12B, the stand 6 includes a first supporting unit 6A and a second supporting unit 6B. The first supporting unit 6A and the second supporting unit 6B are provided as different bodies, and each are detachably provided on the display unit 5. In the display apparatus 300, it is possible to switch between the first installation state and the second installation state by the following rearrangement operation. Specifically, first, the mounting position of the first supporting unit 6A on the display unit 5 and the mounting position of the second supporting unit 6B on the display unit 5 are replaced with each other. Furthermore, each of an installation attitude of the first supporting unit 6A on the display unit 5 and an installation attitude of the second supporting unit 6B on the display unit 5 is changed. In the display apparatus 300, switching between the high-position state and the low-position state is performed by such a rearrangement operation.

In the first installation state (FIGS. 11A and 11B), the first supporting unit 6A is mounted on a mounting section 53R (a first position) between the center position CP and the first edge 5R in the X-axis direction of the display unit 5. In the second installation state (FIGS. 12A and 12B), the first supporting unit 6A is mounted on a mounting section 53L (a second position) between the center position CP and the second edge 5L in the X-axis direction of the display unit 5. In the first installation state (FIGS. 11A and 11B), the second supporting unit 6B is mounted on the mounting section 53L (the second position) between the center position CP and the second edge 5L in the X-axis direction of the display unit 5. In the second installation state (FIGS. 12A and 12B), the second supporting unit 6B is mounted on the mounting section 53R (the first position) between the center position CP and the first edge 5R in the X-axis direction of the display unit 5.

FIG. 14A is a partially enlarged back view of the first supporting unit 6A mounted on the mounting section 53R, and its vicinity in the display apparatus 300 in the first installation state in an enlarged manner. FIG. 14B is a partially enlarged back view of the first supporting unit 6A mounted on the mounting section 53L, and its vicinity in the display apparatus 300 in the second installation state in an enlarged manner. FIG. 15A is an partially enlarged back view of the second supporting unit 6B mounted on the mounting section 53L, and its vicinity in the display apparatus 300 in the first installation state in an enlarged manner. FIG. 15B is an partially enlarged back view of the second supporting unit 6B mounted on the mounting section 53R, and its vicinity in the display apparatus 300 in the second installation state in an enlarged manner. Furthermore, FIG. 16A is an exploded perspective view of the first supporting unit 6A, and FIG. 16B is an exploded perspective view of the second supporting unit 6B.

As illustrated in FIGS. 14A, 14B, and 16A, the first supporting unit 6A includes, for example, a neck 60A as a first attaching section, a base 61A as a first base section, and a junction section 62A that joins the neck 60A and the base 61A together. The neck 60A is formed to be detachable from both the mounting section 53R and the mounting section 53L of the display unit 5. The base 61A includes a plate-like member 63A and an elastic member 64A. The plate-like member 63A includes a main body 631A, and a cover 632A that covers surfaces of the main body 631A except for a surface abutting on the elastic member 64A. The neck 60A and the base 61A are integrally formed with the junction section 62A interposed therebetween. A cover 65A may be further provided to cover the neck 60A and the junction section 62A. The main body 631A of the plate-like member 63A includes a material having high strength such as stainless steel, and is coupled to a tip section, on side opposite to a portion coupled to the neck 60A, of the junction section 62A. The elastic member 64A includes, for example, an elastic material such as rubber, and is mounted on side opposite to the junction section 62A of the main body 631A. The elastic member 64A has, for example, a flat plate shape, and is adhered and fixed to the main body 631A of the plate-like member 63A, for example. The elastic member 64A is contactable with the placement surface FS in both the first installation state and the second installation state.

As illustrated in FIGS. 15A, 15B and 16B, the second supporting unit 6B includes, for example, a neck 60B as a first attaching section, a base 61B as a first base section, and a junction section 62B that joins the neck 60B and the base 61B together. The neck 60B is formed to be detachable from both the mounting section 53R and the mounting section 53L of the display unit 5. The base 61B includes a plate-like member 63B and an elastic member 64B. The plate-like member 63B includes a main body 631B, and a cover 632B that covers surfaces of the main body 631B except for a surface abutting on the elastic member 64B. The neck 60B and the base 61B are integrally formed with the junction section 62B interposed therebetween. A cover 65B may be further provided to cover the neck 60B and the junction section 62B. The main body 631B of the plate-like member 63B includes a material having high strength such as stainless steel, and is coupled to a tip section, on side opposite to a portion coupled to the neck 60B, of the junction section 62B. The elastic member 64B includes, for example, an elastic material such as rubber, and is mounted on side opposite to the junction section 62B of the main body 631B. The elastic member 64B has, for example, a flat plate shape, and is adhered and fixed to the main body 631B of the plate-like member 63B, for example. The elastic member 64B is contactable with the placement surface FS in both the first installation state and the second installation state.

As illustrated in FIGS. 14A, 14B, 15A, and 15B, and the like, in the display apparatus 300, a first installation attitude of the base 61A and the base 61B with respect to the placement surface FS in the first installation state (14A and 15A) is different from a second installation attitude of the base 61A and the base 61B with respect to the placement surface FS in the second installation state (14B and 15B).

That is, in the display apparatus 300, rotating each of the first supporting unit 6A and the second supporting unit 6B in the first installation state by about 90□ makes it possible to change from the first installation state to the second installation state. In the display apparatus 300, reversely, rotating each of the first supporting unit 6A and the second supporting unit 6B in the second installation state by about 90□ makes it possible to change from the second installation state to the first installation state.

As illustrated in FIG. 14A, the neck 60A has a plurality of holes 641A to 644A into which screws NR1 to NR4 are inserted, at positions corresponding to the screw holes 541R to 544R arranged along the first straight line LN1, respectively. The neck 60A is fastened to the mounting section 53R by the screws NR1 to NR4 (see FIG. 14A). It is to be noted that as illustrated in FIG. 14B, the holes 641A to 644A in the neck 60A are respectively provided at positions corresponding to the screw holes 541L to 544L arranged along the second straight line LN2 in the second installation state. Accordingly, in the second installation state, the screws NL1 to NL4 are inserted into the holes 641A to 644A, and the neck 60A is fastened to the mounting section 53L by the screws NL1 to NL4 (see FIG. 14B). It is to be noted that the neck 60A may be fixed to the display unit 5 at three points or five or more points. In addition, the neck 60A may be fixed to the display unit 5 by a fastener other than screws.

As illustrated in FIG. 15A, the neck 60B has a plurality of holes 641B to 644B into which screws NL1 to NL4 are inserted, at positions corresponding to screw holes 541L to 544L arranged along the second straight line LN2, respectively. The neck 60B is fastened to the mounting section 53L by the screws NL1 to NL4 (see FIG. 15A). It is to be noted that as illustrated in FIG. 15B, the holes 641B to 644B in the neck 60B are respectively provided at positions corresponding to the screw holes 541R to 544R arranged along the first straight line LN1 in the first installation state. Accordingly, in the first installation state, the screws NR1 to NR4 are inserted into the holes 641B to 644B, and the neck 60B is fastened to the mounting section 53R by the screws NR1 to NR4 (see FIG. 15B). It is to be noted that the neck 60B may be fixed to the display unit 5 at three points or five or more points. In addition, the neck 60B may be fixed to the display unit 5 by a fastener other than screws.

In addition, in the display apparatus 300, contact portions of the elastic members 64A and 64B with the placement surface FS in the first installation state are different from contact portions of the elastic members 64A and 64B with the placement surface FS in the second installation state. Specifically, in the first installation state, as illustrated in FIGS. 14A and 15A, the bases 61A and 61B are provided to stand on the placement surface FS. Accordingly, in the first installation state, an end surface 64TB of the elastic member 64A and an end surface 64TB of the elastic member 64B each abut on the placement surface FS. In contrast, in the second installation state, as illustrated in FIGS. 14B and 15B, the bases 61A and 61B have an attitude in which main surfaces of the bases 61A and 61B spread along the placement surface FS. Accordingly, in the second installation state, a main surface 64SA of the elastic member 64A and a main surface 64SB of the elastic member 64B each abut on the placement surface FS.

Thus, in the base 61A, a contact area between the placement surface FS and the elastic member 64A in the first installation state is narrower than a contact area between the placement surface FS and the elastic member 64A in the second installation state. Likewise, in the base 61B, a contact area between the placement surface FS and the elastic member 64B in the first installation state is narrower than a contact area between the placement surface FS and the elastic member 24B in the second installation state.

[Workings and Effects of Display Apparatus 300]

As described above, according to the display apparatus 300 according to the present embodiment, the display unit 5 is stably supported by the stand 6 as a supporting body. In addition, in the display apparatus 300, the first installation state and the second installation state are configured to be selectable by rearrangement of the first supporting unit 6A and the second supporting unit 6B with respect to the display unit 5, which makes it possible to realize two viewing positions. This makes it possible to select a form of support to the display unit 5 in accordance with a user's purpose or preference, an installation environment, or the like.

Specifically, as illustrated in FIG. 11A, for example, in a case where an audio device such as a sound bar SB or any other device is installed on the placement surface FS, it is possible to select the high-position state that is the first installation state. Selecting the high-position state makes it possible to prevent the display surface 5A of the display unit 5 from being blocked by any other device such as the sound bar SB. In contrast, in a case where another such device is not installed, as illustrated in FIG. 12A, the low-position state may be selected. In this case, it is possible to bring the display unit 5 close to the placement surface FS, which makes it possible to enhance aesthetics.

In addition, in the display apparatus 300, it is possible to fasten the neck 60A to the mounting section 53R by four screws NR1 to NR4 and the screw holes 541R and 544R arranged along the first straight line LN1 in the first installation state, and it is possible to fasten the neck 60A to the mounting section 53L by four screws NL1 to NL4 and the screw holes 541L to 544L arranged along the second straight line LN2 in the second installation state. Likewise, it is possible to fasten the neck 60B to the mounting section 53L by four screws NL1 to NL4 and the screw holes 541L and 544L arranged along the second straight line LN2 in the first installation state, and it is possible to fasten the neck 60B to the mounting section 53R by four screws NR1 to NR4 and the screw holes 541R to 544R arranged along the first straight line LN1 in the first installation state. Accordingly, it is possible to make the mounting section 53R, the screws NR1 to NR4, the screw holes 541R to 544R, the mounting section 53L, the screws NL1 to NL4, and the screw holes 541L to 544L common in the first installation state and the second installation state. This makes it possible to maintain a simple configuration without need to form an extra mounting section in the display unit 5.

In addition, in the display apparatus 300, the first supporting unit 6A and the second supporting unit 6B that are made common in the first installation state and the second installation state are each used by replacing the mounting positions thereof with each other. Furthermore, each of the elastic members 64A and 64B is provided to be contactable with the placement surface FS in both the first installation state and the second installation state. Accordingly, the number of components is reduced as compared with a case where different stands are used for the first installation state and the second installation state, or the like, which is advantageous in cost reduction, and complicated work for a user, such as storage is not necessary and there is no possibility of losing components.

In addition, in the display apparatus 300, each of the first supporting unit 6A and the second supporting unit 6B is integrated, thereby making it possible to reduce the number of components, which is advantageous in cost reduction. In addition, rearrangement work of the first installation state and the second installation state by a user is easy.

In addition, in the display apparatus 300, the contact portions of the elastic members 64A and 64B with the placement surface FS in the first installation state are different from the contact portions of the elastic members 64A and 64B with the placement surface FS in the second installation state, resulting in an improvement in flexibility in design selection.

In addition, in the display apparatus 300, contact areas between the placement surface FS and the elastic members 64A and 64B in the bases 61A and 61B in the first installation state are narrower than contact areas between the placement surface FS and the elastic members 24A and 24B in the second installation state. Accordingly, in the high-position state that is the first installation state, there is less possibility of interfering with installation of other devices such as a sound bar.

It is to be noted that in the present embodiment, a plurality of other screw holes arranged in a direction different from the first straight line LN1 may be further provided in the mounting section 53R. Likewise, a plurality of other screw holes arranged in a direction different from the second straight line LN2 may be further provided in the mounting section 53L. Doing so makes it possible to achieve, in addition to the first installation state and the second installation state, a third installation state in which the height of the display unit 5 is different from the height of the display unit 5 in the first installation state and the second installation state. That is, it is possible to set the height of the display unit 5 in multiple steps.

4. Fourth Embodiment

[Configuration of Display Apparatus 400]

FIGS. 17A and 17B illustrate an entire configuration example in the first installation state of a display apparatus 400 according to a fourth embodiment of the present disclosure. FIG. 17A is a front view of the display apparatus 400 in the first installation state as viewed from front side (viewer's side), and FIG. 17B is a top view of the display apparatus 400 in the first installation state as viewed from above.

FIGS. 18A and 18B illustrate an entire configuration example in the second installation state of the display apparatus 400. FIG. 18A is a front view of the display apparatus 400 in the second installation state as viewed from front side (viewer's side), and FIG. 18B is a top view of the display apparatus 400 in the second installation state as viewed from above.

FIG. 19A is a perspective view of the display apparatus 400 in the first installation state as obliquely viewed from front side, and FIG. 19B is a perspective view of the display apparatus 400 in the second installation state as obliquely viewed from front side.

As illustrated in FIGS. 17A, 17B, 18A, 18B, 19A, and 19B, the display apparatus 400 is a so-called stationary type display apparatus including a display unit 7 and a stand 8 as a supporting body that supports the display unit 7 on the placement surface FS. In the display apparatus 400, a first height H1 (FIG. 17A) in the Y-axis direction from the placement surface FS to an lower end of the display unit 7 in the first installation state is higher than a second height H2 (FIG. 18A) in the Y-axis direction from the placement surface FS to the lower end of the display unit 7 in the second installation state. That is, the first installation state is a high-position state in which the display unit 7 is installed at a relatively high position, and the second installation state is a low-position state in which the display unit 7 is installed at a relatively low position.

(Display Unit 7)

The display unit 7 basically has the same configuration as that of the display unit 1 according to the first embodiment described above. The display unit 7 includes, for example, a display panel 71 and a main body 52. The display panel 71 has a display surface 7A that displays an image toward front side, and the main body 72 holds the display panel 71. The display surface 7A is a horizontally long rectangular screen extending in each of the X-axis direction and the Y-axis direction, and has a first edge 7R and a second edge 7L that are positioned opposite to each other in the X-axis direction with the center position CP interposed therebetween. Examples of the display panel 71 include a liquid crystal display device including a liquid crystal layer, an organic EL display device including an organic EL element, and the like.

The main body 72 is, for example, a housing that holds the display panel 71 and a circuit board provided with a drive circuit that drives the display panel 71, an image processing circuit, and the like. The display surface 7A has a back surface 7B opposite to the display surface 7A. A lower portion of the main body 72 is provided with one mounting hole 73L and one mounting section 73R respectively on the left and the right. The mounting holes 73L and 73R each have an opening directed downward, and extend in the Y-axis direction. Specifically, the mounting hole 73R is provided at a position (a first position) between the center position CP and the first edge 7R in the X-axis direction, and the mounting hole 73L is provided at a position (a second position) between the center position CP and the second edge 7L in the X-axis direction.

(Stand 8)

As illustrated in FIGS. 17A, 17B, 18A, 18B, 19A, and 19B, the stand 8 includes a first supporting unit 8A and a second supporting unit 8B. The stand 8 further includes a neck 80R as a first attaching section detachably formed on the mounting hole 73R (the first position) in the display unit 7, and a neck 80L as a second attaching section detachably formed on the mounting hole 73L (the second position) in the display unit 7. The first supporting unit 8A and the second supporting unit 8B are provided as different bodies, and each are provided to be detachable from both the neck 80R and the neck 80L. In the display apparatus 400, the mounting position of the first supporting unit 8A on the display unit 7 and the mounting position of the second supporting unit 8B on the display unit 7 are replaced with each other, which makes it possible to switch between the first installation state and the second installation state.

The first supporting unit 8A includes a base 81A that is coupled to the neck 80R in the first installation state and is coupled to the neck 80L in the second installation state. The second supporting unit 8B includes a base 81B that is coupled to the neck 80L in the first installation state and is coupled to the neck 80R in the second installation state.

FIG. 20A is a back view of details of the first supporting unit 8A in the first installation state (the high-position state), and FIG. 20B is a back view of details of the first supporting unit 8A in the second installation state (the low-position state). FIG. 21 is an exploded perspective view of the base 81A. Note that FIG. 20A also illustrates the neck 80R, and FIGS. 20B and 21 also illustrates the neck 80L. Furthermore, FIG. 22A is a partially enlarged perspective view of a positional relationship between a portion of the first supporting unit 8A and the neck 80R in the first installation state, and FIG. 22B is a partially enlarged perspective view of a positional relationship between a portion of the first supporting unit 8A and the neck 80L in the second installation state.

As illustrated in FIGS. 20A and 20B, the base 81A includes a coupling section 82A as a first coupling section, leg sections 83A1 and 83A2, and elastic members 84A1 and 84A2. As illustrated in FIGS. 20A and 20B, the base 81A is attachable to the neck 80R in a first attitude, and is attachable to the neck 80L in a second attitude. The first attitude in the present embodiment is an attitude in which the leg sections 83A1 and 83A2 are provided to stand on the placement surface FS. The second attitude in the present embodiment is an attitude in which the leg sections 83A1 and 83A2 are put sideways to extend along the placement surface FS. The coupling section 82A of the base 81A is connectable to the neck 80R in the first attitude, and is connectable to the neck 80L in the second attitude. The leg sections 83A1 and 83A2 each are joined to the coupling section 82A, and extend approximately along an Z axis to move away from each other in top views illustrated in FIGS. 17B and 18B, for example. In addition, the elastic member 84A1 is mounted on an end, on side opposite to the coupling section 82A, of the leg section 83A1 by an adhesive or the like, and the elastic member 84A2 is mounted on an end, on side opposite to the coupling section 82A, of the leg section 83A2 by an adhesive or the like.

As illustrated in FIG. 21, the first supporting unit 8A further includes, for example, a frame stand 85A as a first reinforcing member, a clamper 86A, and a cover 87A, in addition to the base 81A. The frame stand 85A is mounted to stand on a main surface of the leg section 83A2 as a first plate-like member of the base 81A. The frame stand 85A includes, for example, a highly rigid material such as stainless steel, and prevents deformation of the les sections 83A1 and 83A2 by a load of the display unit 7 specifically in the second installation state. The clamper 86A is, for example, a member that clamps a portion of an electric power cable that performs electric power supply to the main body 72 of the display unit 7, portions of various signal cables and the like that perform signal transmission between the main body 72 and an external device. In order to enhance beauty of appearance, the cover 87A is detachably provided to cover the frame stand 85A and the clamper 86A.

As illustrated in FIGS. 22A and 22B, the coupling section 82A is provided with two screw holes 811A and 812A that penetrate from a first surface 82S1A to a second surface 82S2A. Furthermore, the first surface 82S1A of the coupling section 82A is provided with two projections 813A and 814A (FIG. 22A), and the second surface 82S2A of the coupling section 82A is provided with two projections 815A and 816A (FIG. 22B). In contrast, the neck 80R includes a bottom plate section 801R and a side plate section 802R (FIG. 22A). The bottom plate section 801R is provided with four holes 811R to 814R1 that each penetrate through the bottom plate section 801R (FIG. 22A). In the first installation state, as illustrated in FIG. 22A, the neck 80R and the base 81A are fastened by two screws N8R1 and N8R2. In this case, a lower surface of the bottom plate section 801R and the first surface 82S1A of the coupling section 82A abut on each other, and the screw N8R1 is screwed into the screw hole 811A through the hole 811R and the screw N8R2 is screwed into the screw hole 812A through the hole 812R. At this time, respectively inserting the projections 813A and 814A into the holes 813R and 814R before performing a fastening operation by the screws N8R1 and N8R2 makes it possible to easily perform positioning of the base 81A with respect to the neck 80R.

As illustrated in FIG. 22B, the neck 80L includes a bottom plate section 801L and a side plate section 802L. The side plate section 802L is provided with four holes 821L, 822L, 825L, and 826L that each penetrate through the side plate section 802L. In the second installation state, the neck 80L and the base 81A are fastened by two screws N8L1 and N8L2. In this case, an outer surface of the side plate section 802L and the second surface 82S2A of the coupling section 82A abut on each other, and the screw N8L1 is screwed into the screw hole 812A through the hole 821L and the screw N8L2 is screwed into the screw hole 812A through the hole 822L. At this time, respectively inserting the projections 815A and 816A into the holes 825L and 826L before performing a fastening operation by the screws N8L1 and N8L2 makes it possible to easily perform positioning of the base 81A with respect to the neck 80L.

The elastic members 84A1 and 84A2 each are configured to be contactable with the placement surface FS in both the first installation state (FIG. 20A) and the second installation state (FIG. 20B). However, contact portions of the elastic members 84A1 and 84A2 with the placement surface FS in the first installation state are different from contact portions of the elastic members 84A1 and 84A2 with the placement surface FS in the second installation state. Specifically, in the first installation state, as illustrated in FIG. 20A, the leg sections 83A1 and 83A2 are provided to stand on the placement surface FS. Accordingly, in the first installation state (FIG. 20A), an end surface 84TA1 of the elastic member 84A1 and an end surface 84TA2 of the elastic member 84A2 each abut on the placement surface FS. In contrast, in the second installation state, as illustrated in FIG. 20B, the leg sections 83A1 and 83A2 have an attitude in which main surfaces of the leg sections 83A1 and 83A2 spread along the placement surface FS. Accordingly, in the second installation state (FIG. 20B), a main surface 84SA1 of the elastic member 84A1 and a main surface 84SA2 of the elastic member 84A2 each abut on the placement surface FS. At this time, in the base 81A, contact areas between the elastic members 84A1 and 84A2 and the placement surface FS in the first installation state are narrower than contact areas between the elastic members 84A1 and 84A2 and the placement surface FS in the second installation state.

In addition, in the display apparatus 400, a ratio (W81A/T81A) of a dimension W81A in the Y-axis direction to a dimension T81A in the X-axis direction of a portion below the neck 80R of the base 81A in the first installation state is larger than a ratio (T81A/W81A) of a dimension T81A in the Y-axis direction to a dimension W81A in the X-axis direction of a portion below the neck 80L of the base 81A in the second installation state.

FIG. 23A is a back view of details of the second supporting unit 8B in the first installation state (the high-position state), and FIG. 23B is a back view of details of the second supporting unit 8B in the second installation state (the low-position state). FIG. 24 is an exploded perspective view of the base 81B. Note that FIG. 23A also illustrates the neck 80L, and FIGS. 23B and 24 also illustrate the neck 80L. Furthermore, FIG. 25A is a partially enlarged perspective view of a positional relationship between a portion of the second supporting unit 8B and the neck 80L in the first installation state, and FIG. 25B is a partially enlarged perspective view of a positional relationship between a portion of the second supporting unit 8B and the neck 80R in the second installation state.

As illustrated in FIGS. 23A and 23B, the base 81B includes a coupling section 82B as a second coupling section, leg sections 83B1 and 83B2, and elastic members 84B1 and 84B2. As illustrated in FIGS. 23A and 23B, the base 81B is attachable to the neck 80R in a third attitude, and is attachable to the neck 80L in a fourth attitude. The third attitude in the present embodiment is an attitude in which the leg sections 83B1 and 83B2 are put sideways to extend along the placement surface FS. The fourth attitude in the present embodiment is an attitude in which the leg sections 83B1 and 83B2 are provided to stand on the placement surface FS. The coupling section 82B of the base 81B is connectable to the neck 80R in the third attitude, and is connectable to the neck 80L in the fourth attitude. The leg section 83B1 and 83B2 each are joined to the coupling section 82B, and extend approximately along the Z axis to move away from each other in top views illustrated in FIGS. 17B and 18B, for example. In addition, the elastic member 84B1 is mounted on an end, on side opposite to the coupling section 82B, of the leg section 83B1 by an adhesive or the like, and the elastic member 84B2 is mounted on an end, on side opposite to the coupling section 82B, of the leg section 83B2 by an adhesive or the like.

As illustrated in FIG. 24, the second supporting unit 8B further includes, for example, a frame stand 85B as a second reinforcing member, a clamper 86B, and a cover 87B, in addition to the base 81B. The frame stand 85B is mounted to stand on a main surface of the leg section 83B2 as a second plate-like member of the base 81B. The frame stand 85B includes, for example, a highly rigid material such as stainless steel, and prevents deformation of the les sections 83B1 and 83B2 by a load of the display unit 7 specifically in the second installation state. The clamper 86B is, for example, a member that clamps a portion of an electric power cable that performs electric power supply to the main body 72 of the display unit 7, portions of various signal cables and the like that perform signal transmission between the main body 72 and an external device. In order to enhance beauty of appearance, the cover 87B is detachably provided to cover the frame stand 85B and the clamper 86B.

As illustrated in FIGS. 25A and 25B, the coupling section 82B is provided with two screw holes 811B and 812B that penetrate from a first surface 82S1B to a second surface 82S2B. Furthermore, the first surface 82S1B of the coupling section 82B is provided with two projections 813B and 814B (FIG. 25A), and the second surface 82S2B of the coupling section 82B is provided with two projections 815B and 816B (FIG. 25B). In contrast, the neck 80L includes a bottom plate section 801L and a side plate section 802L (FIG. 25A). The bottom plate section 801L is provided with four holes 811L to 814L that each penetrate through the bottom plate section 801L (FIG. 25A). In the first installation state, as illustrated in FIG. 25A, the neck 80L and the base 81B are fastened by two screws N8L1 and N8L2. In this case, a lower surface of the bottom plate section 801L and the first surface 82S1B of the coupling section 82B abut on each other, and the screw N8L1 is screwed into the screw hole 811B through the hole 811L and the screw N8L2 is screwed into the screw hole 812B through the hole 812L. At this time, respectively inserting the projections 813B and 814B into the holes 813L and 814L before performing a fastening operation by the screws N8L1 and N8L2 makes it possible to easily perform positioning of the base 81L with respect to the neck 80L.

As illustrated in FIG. 25B, the neck 80R includes a bottom plate section 801R and a side plate section 802R. The side plate section 802R is provided with four holes 821R, 822R, 825R, and 826R that each penetrate through the side plate section 802R. In the second installation state, the neck 80R and the base 81B are fastened by two screws N8R1 and N8R2. In this case, an outer surface of the side plate section 802R and the second surface 82S2B of the coupling section 82B abut on each other, and the screw N8R1 is screwed into the screw hole 811B through the hole 821R and the screw N8R2 is screwed into the screw hole 812B through the hole 822R. At this time, respectively inserting the projections 815B and 816B into the holes 825R and 826R before performing a fastening operation by the screws N8R1 and N8R2 makes it possible to easily perform positioning of the base 81B with respect to the neck 80R.

The elastic members 84B1 and 84B2 each are configured to be contactable with the placement surface FS in both the first installation state (FIG. 23A) and the second installation state (FIG. 23B). However, contact portions of the elastic members 84B1 and 84B2 with the placement surface FS in the first installation state are different from contact portions of the elastic members 84B1 and 84B2 with the placement surface FS in the second installation state. Specifically, in the first installation state, as illustrated in FIG. 23A, the leg sections 83B1 and 83B2 are provided to stand on the placement surface FS. Accordingly, in the first installation state (FIG. 23A), an end surface 84TB1 of the elastic member 84B1 and an end surface 84TB2 of the elastic member 84B2 each abut on the placement surface FS. In contrast, in the second installation state, as illustrated in FIG. 23B, the leg sections 83B1 and 83B2 have an attitude in which main surfaces of the leg sections 83B1 and 83B2 spread along the placement surface FS. Accordingly, in the second installation state (FIG. 23B), a main surface 84SB1 of the elastic member 84B1 and a main surface 84SB2 of the elastic member 84B2 each abut on the placement surface FS. At this time, in the base 81B, contact areas between the elastic members 84B1 and 84B2 and the placement surface FS in the first installation state are narrower than contact areas between the elastic members 84B1 and 84B2 and the placement surface FS in the second installation state.

In addition, in the display apparatus 400, a ratio (W81B/T81B) of a dimension W81B in the Y-axis direction to a dimension T81B in the X-axis direction of a portion below the neck 80L of the base 81B in the first installation state is larger than a ratio (T81B/W81B) of a dimension T81B in the Y-axis direction to a dimension W81B in the X-axis direction of a portion below the neck 80R of the base 81B in the second installation state.

Thus, in the display apparatus 400, in the first installation state, the base 81A is attached to the neck 80R in the first attitude, and the base 81B is attached to the neck 80L in the fourth attitude. In addition, in the second installation state, the base 81B is attached to the neck 80R in the third attitude, and the base 81A is attached to the neck 80L in the second attitude. That is, in the display apparatus 400, rotating each of the first supporting unit 8A and the second supporting unit 8B in the first installation state by about 90° and replacing the mounting positions on the left and the right of the first supporting unit 8A and the second supporting unit 8B with each other makes it possible to change from the first installation state to the second installation state. In the display apparatus 400, reversely, rotating each of the first supporting unit 8A and the second supporting unit 8B in the second installation state by about 90° and replacing the mounting positions on the left and the right of the first supporting unit 8A and the second supporting unit 8B with each other makes it possible to change from the second installation state to the first installation state.

It is to be noted that description of the neck 80R and the second supporting unit 8B in FIG. 23B in Japanese Patent Application JP2019-235743, which is the basic application of this application, is an error, and description of the neck 80R and the second supporting unit 8B in FIG. 23C is correct. In FIG. 23B, the neck 80R and the second supporting unit 8B are illustrated in a laterally inverted state, which is an obvious error.

Furthermore, in the display apparatus 400 according to the present embodiment, the third installation state and the fourth installation state, in addition to the first installation state and the second installation state, are configured to be selectable by rearrangement of the first supporting unit 2A and the second supporting unit 2B with respect to the display unit 7. That is, in the display apparatus 400 according to the present embodiment, it is possible to realize four viewing positions.

FIGS. 26A and 26B illustrate an entire configuration example in the third installation state of the display apparatus 400. FIG. 26A is a front view of the display apparatus 400 in the third installation state as viewed from front side (viewer's side), and FIG. 26B is a top view of the display apparatus 400 in the third installation state as viewed from above.

FIGS. 27A and 27B illustrate an entire configuration example in the fourth installation state of the display apparatus 400. FIG. 27A is a front view of the display apparatus 400 in the fourth installation state as viewed from front side (viewer's side), and FIG. 27B is a top view of the display apparatus 400 in the fourth installation state as viewed from above.

In the third installation state, a third height H3 (FIG. 26A) in the Y-axis direction from the placement surface FS to the lower end of the display unit 7 in the third installation state is higher than a fourth height H4 (FIG. 27A) in the Y-axis direction from the placement surface FS to the lower end of the display unit 7 in the fourth installation state. That is, as in the first installation state, the third installation state is a high-position state in which the display unit 7 is installed at a relatively high position, and as in the second installation state, the fourth installation state is a low-position state in which the display unit 7 is installed at a relatively low position. The third height H3 is, for example, substantially the same as the first height H1 (FIG. 17A), and the fourth height H3 is, for example, substantially the same as the second height H2 (FIG. 18A).

However, in the third installation state, the first supporting unit 8A is attached to the mounting hole 73L (the second position) of the display unit 7 with the neck 80L interposed therebetween, and the second supporting unit 8B is attached to the mounting hole 73R (the first position) of the display unit 7 with the neck 80R interposed therebetween. In addition, in the fourth installation state, the first supporting unit 8A is attached to the mounting hole 73R (the first position) of the display unit 7 with the neck 80R interposed therebetween, and the second supporting unit 8B is attached to the mounting hole 73L (the second position) with the neck 80L interposed therebetween.

FIG. 28A is a back view of details of the neck 80L and the first supporting unit 8A in the third installation state, and FIG. 28B is a back view of details of the neck 80R and the second supporting unit 8B in the third installation state. Furthermore, FIG. 29A is a back view of details of the neck 80L and the second supporting unit 8B in the fourth installation state, and FIG. 29B is a back view of details of the neck 80R and the first supporting unit 8A in the fourth installation state.

The base 81A is attachable to the neck 80R in a fifth attitude as illustrated in FIG. 29B, and is attachable to the neck 80R in a sixth attitude as illustrated in FIG. 28A. The fifth attitude in the present embodiment is an attitude in which the leg sections 83A1 and 83A2 are put sideways to extend along the placement surface FS. In the fifth attitude (FIG. 29B), the coupling section 82A of the base 81A is coupled to the neck 80R, and screwing is performed to cause the first surface 82S 1A of the coupling section 82A and the outer surface of the side plate section 802R to abut on each other. Accordingly, the leg sections 83A1 and 83A2 are positioned on side opposite to the neck 80R as viewed from the coupling section 82A. In addition, the sixth attitude in the present embodiment is an attitude in which the leg sections 83A1 and 83A2 are provided to stand on the placement surface FS. In the sixth attitude, the coupling section 82A of the base 81A is coupled to the neck 80L, and the leg sections 83A1 and 83A2 are coupled to the coupling section 82A inside the neck 80L, that is, between the neck 80L and the center position CP.

The base 81B is attachable to the neck 80R in a seventh attitude as illustrated in FIG. 28B, and is attachable to the neck 80L in an eighth attitude as illustrated in FIG. 29A. The seventh attitude in the present embodiment is an attitude in which the leg sections 83B1 and 83B2 are provided to stand on the placement surface FS. In the seventh attitude, the coupling section 82B of the base 81B is coupled to the neck 80R, and the leg sections 83B1 and 83B2 are coupled to the coupling section 82B inside the neck 80R, that is, between the neck 80R and the center position CP. In addition, the eighth attitude in the present embodiment is an attitude in which the leg sections 83B1 and 83B2 are put sideways to extend along the placement surface FS. In the eighth attitude (FIG. 29A), the coupling section 82B of the base 81B is coupled to the neck 80L, and screwing is performed to cause the first surface 82S1B of the coupling section 82B and the outer surface of the side plate section 802L to abut on each other. Accordingly, the leg sections 83B1 and 83B2 are positioned on side opposite to the neck 80L as viewed from the coupling section 82B.

[Workings and Effects of Display Apparatus 400]

As described above, according to the display apparatus 400 according to the present embodiment, the display unit 7 is stably supported by the stand 8 as a supporting body. In addition, in the display apparatus 400, the first installation state and the second installation state are configured to be selectable by rearrangement of the first supporting unit 8A and the second supporting unit 8B with respect to the display unit 7, which makes it possible to realize two viewing positions. This makes it possible to select a form of support to the display unit 7 in accordance with a user's purpose or preference, an installation environment, or the like.

Specifically, as illustrated in FIG. 17A, in a case where an audio device such as a sound bar SB or any other device is installed on the placement surface FS, it is possible to select the high-position state that is the first installation state. Selecting the high-position state makes it possible to prevent the display surface 7A of the display unit 7 from being blocked by any other device such as the sound bar SB. In contrast, in a case where another such device is not installed, as illustrated in FIG. 18A, the low-position state may be selected. In this case, it is possible to bring the display unit 7 close to the placement surface FS, which makes it possible to enhance aesthetics.

In addition, in the display apparatus 400, the base 81A and the base 81B that are made common in the first installation state and the second installation state are each used by replacing the mounting positions thereof with each other. Furthermore, the elastic members 84A1, 84A2, 84B1, and 84B are provided to be contactable with the placement surface FS in both the first installation state and the second installation state. Accordingly, the number of components is reduced as compared with a case where different stands are used for the first installation state and the second installation state, or the like, which is advantageous in cost reduction, and complicated work for a user, such as storage is not necessary and there is no possibility of losing components.

In addition, in the display apparatus 400, the contact portions of the elastic members 84A1, 84A2, 84B1, and 84B2 with the placement surface FS in the first installation state are different from the contact portions of the elastic members 84A1, 84A2, 84B1, and 84B2 with the placement surface FS in the second installation state, which improves flexibility in design selection.

In addition, in the display apparatus 400, contact areas between the placement surface FS and the elastic members 84A1, 84A2, 84B1, and 84B2 in the first installation state in the bases 81A and 81B are narrower than contact areas between the placement surface FS and the elastic members 84A1, 84A2, 84B1, and 84B2 in the second installation state. Accordingly, in the high-position state that is the first installation state, there is less possibility of interfering with installation of other devices such as a sound bar.

In addition, in the display apparatus 400, dimension ratios W81A/T81A and W81B/T81B in the first installation state are respectively larger than the dimension ratios W81A/T81A and W81B/T81B in the second installation state. This makes it possible to further increase a height difference between the first height H1 in the first installation state and the second height H2 in the second installation state.

In addition, in the display apparatus 400, the coupling section 82A in the base 81A is connectable to the neck 80R in the first attitude with use of the screws N8R1 and N8R2, and is connectable to the neck 80L in the second attitude with use of the screws N8L1 and N8L2, and the coupling section 82B in the base 81B is connectable to the neck 80L in the fourth attitude with use of the screws N8L1 and N8L2, and is connectable to the neck 80R in the third attitude with use of the screws N8R1 and N8R2. This makes it possible to mount each of the base 81A and the base 81B with use of the same screws N8L1, N8L2, N8L1, and N8L2 in both the first installation state and the second installation state. Accordingly, a simplified configuration is achieved in addition to reduction in the number of components, which is advantageous in cost reduction.

In addition, in the display apparatus 400, the first supporting unit 8A and the second supporting unit 8B respectively include the frame stands 85A and 85B, which makes it possible to prevent deformation of the bases 81A and 81B by a load of the display unit 7 specifically in the second installation state. Accordingly, supporting stability of the display unit 7 by the stand 8 is further improved.

3. Other Modification Examples

Although the present disclosure has been described with reference to some embodiments, the present disclosure is not limited to the embodiments described above, and may be modified in a variety of ways. For example, size relationships, positional relationships, and shapes of the display units and the stands described in the first to fourth embodiments described above are merely illustrative, and the present disclosure is not limited thereto.

In addition, in the first, third, and fourth embodiments described above, elastic members as a first contact member and a second contact member are in contact with the placement surface in both the first installation state and the second installation state; however, the present disclosure is not limited thereto. For example, an elastic member in contact with the placement surface in the first installation state and an elastic member in contact with the placement surface in the second installation state may be different bodies, and may be provided only at respective necessary points.

In addition, in the embodiments described above, a case where an interval between the first supporting unit and the second supporting unit or the height of the display unit is different between a first form and a second form has been described as an example; however, the present disclosure is not limited thereto. For example, a case where an elevation angle of the display surface of the display unit may be different between the first form and the second form, or the like may be adopted.

Furthermore, for example, the display apparatuses described in the embodiments described above are not limited to a case where all described components are included, and some of the components may not be included, or any other component may be further included.

Thus, according to the supporting body and the display apparatus as one embodiment of the present disclosure, the first form and the second form are configured to be selectable by rearrangement of the first supporting unit and the second supporting unit. This makes it possible to select a form of support to the display unit in accordance with a user's purpose or preference, an installation environment, or the like.

It is to be noted that the effects described herein are merely illustrative and non-limiting, and other effects may be provided. In addition, the present technology may have the following configurations.

(1)

A supporting body that supports a display unit to cause the display unit to stand on a placement surface, the display unit having a display surface that spreads in each of a horizontal direction and a vertical direction, and having a center position in the horizontal direction, and a first edge and a second edge that are positioned opposite to each other in the horizontal direction with the center position interposed therebetween, the supporting body including:

a first supporting unit that is detachably provided on the display unit; and a second supporting unit that is detachably provided on the display unit as a body different from the first supporting unit, in which a first form and a second form are configured to be selectable, the first form in which the first supporting unit is mounted at a first position between the center position and the first edge in the horizontal direction of the display unit, and the second supporting unit is mounted at a second position between the center position and the second edge in the horizontal direction of the display unit, and the second form in which the second supporting unit is mounted at the first position or a third position between the center position and the first edge in the horizontal direction of the display unit, and the first supporting unit is mounted at the second position or a fourth position between the center position and the second edge in the horizontal direction of the display unit.

(2)

The supporting body according to (1), in which the first supporting unit includes a first attaching section detachably formed on the display unit, and a first base section including a first contact member that is contactable with the placement surface in both the first form and the second form, and the second supporting unit includes a second attaching section detachably formed on the display unit, and a second base section including a second contact member that is contactable with the placement surface in both the first form and the second form.

(3)
The supporting body according to (2), in which a first installation attitude of the first base section and the second base section with respect to the placement surface in the first form is different from a second installation attitude of the first base section and the second base section with respect to the placement surface in the second form.

(4)
The supporting body according to (2) or (3), in which
the first attaching section and the first base section are integrally formed, and
the second attaching section and the second base section are integrally formed.

(5)
The supporting body according to any one of (2) to (4), in which
a distance between the first base section and the center position in the first form is longer than a distance between the first base section and the center position in the second form, and
a distance between the second base section and the center position in the first form is longer than a distance between the second base section and the center position in the second form.

(6)
The supporting body according to (5), in which
a ratio of a dimension in the vertical direction to a dimension in the horizontal direction of the first base section in the first form is larger than a ratio of a dimension in the vertical direction to a dimension in the horizontal direction of the first base section in the second form, and
ratio of a dimension in the vertical direction to a dimension in the horizontal direction of the second base section in the first form is larger than a ratio of a dimension in the vertical direction to a dimension in the horizontal direction of the second base section in the second form.

(7)
The supporting body according to (5) or (6), in which
in the first form, the first attaching section is mounted at the first position to cause at least a portion of the first base section to protrude on side opposite to the center position as viewed from the first edge, and the second attaching section is mounted at the second position to cause at least a portion of the second base section to protrude on side opposite to the center position as viewed from the second edge, and
in the second form, the first attaching section is mounted at the fourth position to place the first base section between the first edge and the center position, and the second attaching section is mounted at the third position to place the second base section between the second edge and the center position.

(8)
The supporting body according to any one of (5) to (7), in which a contact portion of the first contact member with the placement surface in the first form is different from a contact portion of the first contact member with the placement surface in the second form.

(9)
The supporting body according to any one of (5) to (8), in which a contact area between the placement surface and the first contact member in the second form is wider than a contact area between the placement surface and the first contact member in the first form, and
a contact area between the placement surface and the second contact member in the second form is wider than a contact area between the placement surface and the second contact member in the first form.

(10)
The supporting body according to any one of (2) to (9), in which each of the first attaching section and the second attaching section is provided to be fixable to the display unit at a plurality of points including three points that are positions of vertices of a triangle.

(11)
The supporting body according to (2), in which
the first supporting unit further includes a first beam section that extends in the horizontal direction, and joins the first attaching section and the first base section together, and
the second supporting unit further includes a second beam section that extends in the horizontal direction, and joins the second attaching section and the second base section together.

(12)
The supporting body according to (2) or (11), in which
a contact portion of the first contact member with the placement surface in the first form is same as a contact portion of the first contact member with the placement surface in the second form, and
a contact portion of the second contact member with the placement surface in the first form is same as a contact portion of the second contact member with the placement surface in the second form.

(13)
The supporting body according to (2), (11), or (12), in which
the display unit includes a first hole section provided at the first position, and a second hole section provided at the second position,
in the first form, the first supporting unit is mounted on the display unit by inserting the first attaching section into the first hole section, and the second supporting unit is mounted on the display unit by inserting the second attaching section into the second hole section, and
in the second form, the second supporting unit is mounted on the display unit by inserting the second attaching section into the first hole section, and the first supporting unit is mounted on the display unit by inserting the first attaching section into the second hole section.

(14)
The supporting body according to (5), in which
in the first form, the first attaching section is mounted at the first position to place the first base section between the first edge and the center position, and the second attaching section is mounted at the second position to place the second base section between the second edge and the center position, and
in the second form, the first attaching section is mounted at the second position to place the first base section between the second edge and the center position, and the second attaching section is mounted at the first position to place the second base section between the first edge and the center position.

(15)
The supporting body according to any one of (2) and (11) to (13), in which a first height in the vertical direction from the placement surface to a lower end of the display unit in the first form is higher than a second height in the vertical direction from the placement surface to the lower end of the display unit in the second form.

(16)

The supporting body according to any one of (2) and (11) to (13), in which
the first attaching section is provided to be fixable at the first position by three or more first fasteners arranged on a first straight line in the first form, and be fixable at the second position by three or more second fasteners arranged on a second straight line in the second form, and
the second attaching section is provided to be fixable at the second position by the three or more second fasteners arranged on the second straight line in the first form, and be fixable at the first position by the three or more first fasteners on the first straight line in the second form.

(17)

The supporting body according to (15) or (16), in which a contact portion of the first contact member with the placement surface in the first form is different from a contact portion of the first contact member with the placement surface in the second form.

(18)

The supporting body according to any one of (15) to (17), in which
a contact area between the placement surface and the first contact member in the first form is narrower than a contact area between the placement surface and the first contact member in the second form, and
a contact area between the placement surface and the second contact member in the first form is narrower than a contact area between the placement surface and the second contact member in the second form.

(19)

The supporting body according to (1), further including:
a first attaching section detachably formed at the first position of the display unit; and
a second attaching section detachably formed at the second position of the display unit,
in which the first supporting unit includes a first base section that is coupled to the first attaching section in the first form and is coupled to the second attaching section in the second form, and
the second supporting unit includes a second base section that is coupled to the second attaching section in the first form and is coupled to the first attaching section in the second form.

(20)

The supporting body according to (19), in which
the first base section includes a first contact member that is contactable with the placement surface in both the first form and the second form, and
the second base section includes a second contact member that is contactable with the placement surface in both the first form and the second form.

(21)

The supporting body according to (19) or (20), in which
the first base section is attachable in a first attitude to the first attaching section detachably provided at the first position of the display unit, and is attachable in a second attitude to the second attaching section detachably provided at the second position of the display unit, and
the second base section is attachable in a third attitude to the first attaching section detachably provided at the first position of the display unit, and is attachable in a fourth attitude to the second attaching section detachably provided at the second position of the display unit.

(22)

The supporting body according to (21), in which
in the first form, the first base section is attached to the first attaching section in the first attitude, and the second base section is attached to the second attaching section in the fourth attitude, and
in the second form, the second base section is attached to the first attaching section in the third attitude, and the first base section is attached to the second attaching section in the second attitude.

(23)

The supporting body according to any one of (19) to (22), in which a first height in the vertical direction from the placement surface to a lower end of the display unit in the first form is higher than a second height in the vertical direction from the placement surface to the lower end of the display unit in the second form.

(24)

The supporting body according to (23), in which
a ratio of a dimension in the vertical direction to a dimension in the horizontal direction of a portion below the first attaching section of the first base section in the first form is larger than a ratio of a dimension in the vertical direction to a dimension in the horizontal direction of a portion below the second attaching section of the first base section in the second form, and
a ratio of a dimension in the vertical direction to a dimension in the horizontal direction of a portion below the second attaching section of the second base section in the first form is larger than a ratio of a dimension in the vertical direction to a dimension in the horizontal direction of a portion below the first attaching section of the second base section in the second form.

(25)

The supporting body according to (21) or (22), in which
the first base section includes a first coupling section that is connectable to the first attaching section in the first attitude and is connectable to the second attaching section in the second attitude, and
the second base section includes a second coupling section that is connectable to the second attaching section in the fourth attitude and is connectable to the first attaching section in the third attitude.

(26)

The supporting body according to (20), in which a contact portion of the first contact member with the placement surface in the first form is different from a contact portion of the first contact member with the placement surface in the second form.

(27)

The supporting body according to (20) or (26), in which
a contact area between the placement surface and the first contact member in the first form is narrower than a contact area between the placement surface and the first contact member in the second form, and
a contact area between the placement surface and the second contact member in the first form is narrower than a contact area between the placement surface and the second contact member in the second form.

(28)

The supporting body according to any one of (19) to (27), in which the first base section includes a first plate-like member and a first reinforcing member, the first plate-like member having a first surface that intersects with the vertical direction in the second attitude, and the first reinforcing member being provided to stand on the first surface, and the second base section includes a second plate-like member and a second reinforcing member, the second plate-like member having a second surface that intersects with the vertical direction in the third attitude, and the second reinforcing member being provided to stand on the second surface.

(29)

A display apparatus provided with a display unit and a supporting body, the display unit having a display surface that spreads in each of a horizontal direction and a vertical direction, and having a center position in the horizontal direction, and a first edge and a second edge that are positioned opposite to each other in the horizontal direction with the center position interposed therebetween, and the supporting body supporting the display unit to cause the display unit to stand on a placement surface, the supporting body including:

a first supporting unit that is detachably provided on the display unit; and a second supporting unit that is detachably provided on the display unit as a body different from the first supporting unit, in which a first form and a second form are configured to be selectable, the first form in which the first supporting unit is mounted at a first position between the center position and the first edge in the horizontal direction of the display unit, and the second supporting unit is mounted at a second position between the center position and the second edge in the horizontal direction of the display unit, and the second form in which the second supporting unit is mounted at the first position or a third position between the center position and the first edge in the horizontal direction of the display unit, and the first supporting unit is mounted at the second position or a fourth position between the center position and the second edge in the horizontal direction of the display unit.

This application claims the benefit of Japanese Priority Patent Application JP2019-235743 filed with Japan Patent Office on Dec. 26, 2019, and Japanese Priority Patent Application JP2020-169449 filed with the Japan Patent Office on Oct. 6, 2020, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A supporting body that supports a display unit to cause the display unit to stand on a placement surface, the display unit having a display surface that spreads in each of a horizontal direction and a vertical direction, and having a center position in the horizontal direction, and a first edge and a second edge that are positioned opposite to each other in the horizontal direction with the center position interposed therebetween, the supporting body comprising:

a first supporting unit that is detachably provided on the display unit; and a second supporting unit that is detachably provided on the display unit as a body different from the first supporting unit, wherein a first form and a second form are configured to be selectable, the first form in which the first supporting unit is mounted at a first position between the center position and the first edge in the horizontal direction of the display unit, and the second supporting unit is mounted at a second position between the center position and the second edge in the horizontal direction of the display unit, and the second form in which the second supporting unit is mounted at the first position or a third position between the center position and the first edge in the horizontal direction of the display unit, and the first supporting unit is mounted at the second position or a fourth position between the center position and the second edge in the horizontal direction of the display unit, the first supporting unit includes a first attaching section detachably formed on the display unit, and a first base section including a first contact member that is contactable with the placement surface in both the first form and the second form, the second supporting unit includes a second attaching section detachably formed on the display unit, and a second base section including a second contact member that is contactable with the placement surface in both the first form and the second form, and a first installation attitude of the first base section and the second base section with respect to the placement surface in the first form is different from a second installation attitude of the first base section and the second base section with respect to the placement surface in the second form.

2. The supporting body according to claim 1, wherein the first attaching section and the first base section are integrally formed, and the second attaching section and the second base section are integrally formed.

3. The supporting body according to claim 1, wherein a distance between the first base section and the center position in the first form is longer than a distance between the first base section and the center position in the second form, and a distance between the second base section and the center position in the first form is longer than a distance between the second base section and the center position in the second form.

4. A supporting body that supports a display unit to cause the display unit to stand on a placement surface, the display unit having a display surface that spreads in each of a horizontal direction and a vertical direction, and having a center position in the horizontal direction, and a first edge and a second edge that are positioned opposite to each other in the horizontal direction with the center position interposed therebetween, the supporting body comprising:

a first supporting unit that is detachably provided on the display unit; and a second supporting unit that is detachably provided on the display unit as a body different from the first supporting unit, wherein a first form and a second form are configured to be selectable, the first form in which the first supporting unit is mounted at a first position between the center position and the first edge in the horizontal direction of the display unit, and the second supporting unit is mounted at a second position between the center position and the second edge in the horizontal direction of the display unit, and the second form in which the second supporting unit is mounted at the first position or a third position between the center position and the first edge in the horizontal direction of the display unit, and the first supporting unit is mounted at the second position or a fourth position between the center position and the second edge in the horizontal direction of the display unit, the first supporting unit includes a first attaching section detachably formed on the display unit, and a first base section including a first contact member that is contactable with the placement surface in both the first form and the second form, the second supporting unit includes a second attaching section detachably formed on the display unit, and a second base section including a second contact member that is contactable with the placement surface in both the first form and the second form, a distance between the first base section and the center position in the first form is longer than a distance between the first base section and the center position in the second form, a distance between the second base section and the center position in the first form is longer than a distance between the second base section and the center position in the second form, a ratio of a dimension in the vertical direction to a dimension in the horizontal direction of the first base section in the first form is larger than a ratio of a dimension in the vertical direction to a dimension in the horizontal direction of the first base section in the second form, and a ratio of a dimension in the vertical direction to a dimension in the horizontal direction of the second base section in the first form is larger than a ratio of a dimension in the vertical direction to a dimension in the horizontal direction of the second base section in the second form.

5. A supporting body that supports a display unit to cause the display unit to stand on a placement surface, the display unit having a display surface that spreads in each of a horizontal direction and a vertical direction, and having a center position in the horizontal direction, and a first edge and a second edge that are positioned opposite to each other in the horizontal direction with the center position interposed therebetween, the supporting body comprising:

a first supporting unit that is detachably provided on the display unit; and a second supporting unit that is detachably provided on the display unit as a body different from the first supporting unit, wherein a first form and a second form are configured to be selectable, the first form in which the first supporting unit is mounted at a first position between the center position and the first edge in the horizontal direction of the display unit, and the second supporting unit is mounted at a second position between the center position and the second edge in the horizontal direction of the display unit, and the second form in which the second supporting unit is mounted at the first position or a third position between the center position and the first edge in the horizontal direction of the display unit, and the first supporting unit is mounted at the second position or a fourth position between the center position and the second edge in the horizontal direction of the display unit, the first supporting unit includes a first attaching section detachably formed on the display unit, and a first base section including a first contact member that is contactable with the placement surface in both the first form and the second form, the second supporting unit includes a second attaching section detachably formed on the display unit, and a second base section including a second contact member that is contactable with the placement surface in both the first form and the second form, a distance between the first base section and the center position in the first form is longer than a distance between the first base section and the center position in the second form, a distance between the second base section and the center position in the first form is longer than a distance between the second base section and the center position in the second form, in the first form, the first attaching section is mounted at the first position to cause at least a portion of the first base section to protrude on side opposite to the center position as viewed from the first edge, and the second attaching section is mounted at the second position to cause at least a portion of the second base section to protrude on side opposite to the center position as viewed from the second edge, and in the second form, the first attaching section is mounted at the fourth position to place the first base section between the first edge and the center position, and the second attaching section is mounted at the third position to place the second base section between the second edge and the center position.

6. A supporting body that supports a display unit to cause the display unit to stand on a placement surface, the display unit having a display surface that spreads in each of a horizontal direction and a vertical direction, and having a center position in the horizontal direction, and a first edge and a second edge that are positioned opposite to each other in the horizontal direction with the center position interposed therebetween, the supporting body comprising:

a first supporting unit that is detachably provided on the display unit; and a second supporting unit that is detachably provided on the display unit as a body different from the first supporting unit, wherein a first form and a second form are configured to be selectable, the first form in which the first supporting unit is mounted at a first position between the center position and the first edge in the horizontal direction of the display unit, and the second supporting unit is mounted at a second position between the center position and the second edge in the horizontal direction of the display unit, and the second form in which the second supporting unit is mounted at the first position or a third position between the center position and the first edge in the horizontal direction of the display unit, and the first supporting unit is mounted at the second position or a fourth position between the center position and the second edge in the horizontal direction of the display unit, the first supporting unit includes a first attaching section detachably formed on the display unit, and a first base section including a first contact member that is contactable with the placement surface in both the first form and the second form, the second supporting unit includes a second attaching section detachably formed on the display unit, and a second base section including a second contact member that is contactable with the placement surface in both the first form and the second form, a distance between the first base section and the center position in the first form is longer than a distance between the first base section and the center position in the second form, a distance between the second base section and the center position in the first form is longer than a distance between the second base section and the center position in the second form, and a contact portion of the first contact member with the placement surface in the first form is different from a contact portion of the first contact member with the placement surface in the second form.

7. A supporting body that supports a display unit to cause the display unit to stand on a placement surface, the display unit having a display surface that spreads in each of a horizontal direction and a vertical direction, and having a center position in the horizontal direction, and a first edge and a second edge that are positioned opposite to each other in the horizontal direction with the center position interposed therebetween, the supporting body comprising:

a first supporting unit that is detachably provided on the display unit; and a second supporting unit that is detachably provided on the display unit as a body different from the first supporting unit, wherein a first form and a second form are configured to be selectable, the first form in which the first supporting unit is mounted at a first position between the center position and the first edge in the horizontal direction of the display unit, and the second supporting unit is mounted at a second position between the center position and the second edge in the horizontal direction of the display unit, and the second form in which the second supporting unit is mounted at the first position or a third position between the center position and the first edge in the horizontal direction of the display unit, and the first supporting unit is mounted at the second position or a fourth position between the center position and the second edge in the horizontal direction of the display unit, the first supporting unit includes a first attaching section detachably formed on the display unit, and a first base section including a first contact member that is contactable with the placement surface in both the first form and the second form, the second supporting unit includes a second attaching section detachably formed on the display unit, and a second base section including a second contact member that is contactable with the placement surface in both the first form and the second form, a distance between the first base section and the center position in the first form is longer than a distance between the first base section and the center position in the second form, a distance between the second base section and the center position in the first form is longer than a distance between the second base section and the center position in the second form, a contact area between the placement surface and the first contact member in the second form is wider than a contact area between the placement surface and the first contact member in the first form, and a contact area between the placement surface and the second contact member in the second form is wider than a contact area between the placement surface and the second contact member in the first form.

8. A supporting body that supports a display unit to cause the display unit to stand on a placement surface, the display unit having a display surface that spreads in each of a horizontal direction and a vertical direction, and having a center position in the horizontal direction, and a first edge and a second edge that are positioned opposite to each other in the horizontal direction with the center position interposed therebetween, the supporting body comprising:

a first supporting unit that is detachably provided on the display unit; and a second supporting unit that is detachably provided on the display unit as a body different from the first supporting unit, wherein a first form and a second form are configured to be selectable, the first form in which the first supporting unit is mounted at a first position between the center position and the first edge in the horizontal direction of the display unit, and the second supporting unit is mounted at a second position between the center position and the second edge in the horizontal direction of the display unit, and the second form in which the second supporting unit is mounted at the first position or a third position between the center position and the first edge in the horizontal direction of the display unit, and the first supporting unit is mounted at the second position or a fourth position between the center position and the second edge in the horizontal direction of the display unit, the first supporting unit includes a first attaching section detachably formed on the display unit, and a first base section including a first contact member that is contactable with the placement surface in both the first form and the second form, the second supporting unit includes a second attaching section detachably formed on the display unit, and a second base section including a second contact member that is contactable with the placement surface in both the first form and the second form, and each of the first attaching section and the second attaching section is provided to be fixable to the display unit at a plurality of points including three points that are positions of vertices of a triangle.

9. A supporting body that supports a display unit to cause the display unit to stand on a placement surface, the display unit having a display surface that spreads in each of a horizontal direction and a vertical direction, and having a center position in the horizontal direction, and a first edge and a second edge that are positioned opposite to each other in the horizontal direction with the center position interposed therebetween, the supporting body comprising:

a first supporting unit that is detachably provided on the display unit; and a second supporting unit that is detachably provided on the display unit as a body different from the first supporting unit, wherein a first form and a second form are configured to be selectable, the first form in which the first supporting unit is mounted at a first position between the center position and the first edge in the horizontal direction of the display unit, and the second supporting unit is mounted at a second position between the center position and the second edge in the horizontal direction of the display unit, and the second form in which the second supporting unit is mounted at the first position or a third position between the center position and the first edge in the horizontal direction of the display unit, and the first supporting unit is mounted at the second position or a fourth position between the center position and the second edge in the horizontal direction of the display unit, the first supporting unit includes a first attaching section detachably formed on the display unit, and a first base section including a first contact member that is contactable with the placement surface in both the first form and the second form, the second supporting unit includes a second attaching section detachably formed on the display unit, and a second base section including a second contact member that is contactable with the placement surface in both the first form and the second form, the first supporting unit further includes a first beam section that extends in the horizontal direction, and joins the first attaching section and the first base section together, and the second supporting unit further includes a second beam section that extends in the horizontal direction, and joins the second attaching section and the second base section together.

10. A supporting body that supports a display unit to cause the display unit to stand on a placement surface, the display unit having a display surface that spreads in each of a horizontal direction and a vertical direction, and having a center position in the horizontal direction, and a first edge and a second edge that are positioned opposite to each other in the horizontal direction with the center position interposed therebetween, the supporting body comprising:

a first supporting unit that is detachably provided on the display unit; and a second supporting unit that is detachably provided on the display unit as a body different from the first supporting unit, wherein a first form and a second form are configured to be selectable, the first form in which the first supporting unit is mounted at a first position between the center position and the first edge in the horizontal direction of the display unit, and the second supporting unit is mounted at a second position between the center position and the second edge in the horizontal direction of the display unit, and the second form in which the second supporting unit is mounted at the first position or a third position between the center position and the first edge in the horizontal direction of the display unit, and the first supporting unit is mounted at the second position or a fourth position between the center position and the second edge in the horizontal direction of the display unit, the first supporting unit includes a first attaching section detachably formed on the display unit, and a first base section including a first contact member that is contactable with the placement surface in both the first form and the second form, the second supporting unit includes a second attaching section detachably formed on the display unit, and a second base section including a second contact member that is contactable with the placement surface in both the first form and the second form, the display unit includes a first hole section provided at the first position, and a second hole section provided at the second position, in the first form, the first supporting unit is mounted on the display unit by inserting the first attaching section into the first hole section, and the second supporting unit is mounted on the display unit by inserting the second attaching section into the second hole section, and in the second form, the second supporting unit is mounted on the display unit by inserting the second attaching section into the first hole section, and the first supporting unit is mounted on the display unit by inserting the first attaching section into the second hole section.

11. A supporting body that supports a display unit to cause the display unit to stand on a placement surface, the display unit having a display surface that spreads in each of a horizontal direction and a vertical direction, and having a center position in the horizontal direction, and a first edge and a second edge that are positioned opposite to each other in the horizontal direction with the center position interposed therebetween, the supporting body comprising:

a first supporting unit that is detachably provided on the display unit; and a second supporting unit that is detachably provided on the display unit as a body different from the first supporting unit, wherein a first form and a second form are configured to be selectable, the first form in which the first supporting unit is mounted at a first position between the center position and the first edge in the horizontal direction of the display unit, and the second supporting unit is mounted at a second position between the center position and the second edge in the horizontal direction of the display unit, and the second form in which the second supporting unit is mounted at the first position or a third position between the center position and the first edge in the horizontal direction of the display unit, and the first supporting unit is mounted at the second position or a fourth position between the center position and the second edge in the horizontal direction of the display unit, the first supporting unit includes a first attaching section detachably formed on the display unit, and a first base section including a first contact member that is contactable with the placement surface in both the first form and the second form, the second supporting unit includes a second attaching section detachably formed on the display unit, and a second base section including a second contact member that is contactable with the placement surface in both the first form and the second form, and a first height in the vertical direction from the placement surface to a lower end of the display unit in the first form is higher than a second height in the vertical direction from the placement surface to the lower end of the display unit in the second form.

12. A supporting body that supports a display unit to cause the display unit to stand on a placement surface, the display unit having a display surface that spreads in each of a horizontal direction and a vertical direction, and having a center position in the horizontal direction, and a first edge and a second edge that are positioned opposite to each other in the horizontal direction with the center position interposed therebetween, the supporting body comprising:

a first supporting unit that is detachably provided on the display unit; and a second supporting unit that is detachably provided on the display unit as a body different from the first supporting unit, wherein a first form and a second form are configured to be selectable, the first form in which the first supporting unit is mounted at a first position between the center position and the first edge in the horizontal direction of the display unit, and the second supporting unit is mounted at a second position between the center position and the second edge in the horizontal direction of the display unit, and the second form in which the second supporting unit is mounted at the first position or a third position between the center position and the first edge in the horizontal direction of the display unit, and the first supporting unit is mounted at the second position or a fourth position between the center position and the second edge in the horizontal direction of the display unit, the first supporting unit includes a first attaching section detachably formed on the display unit, and a first base section including a first contact member that is contactable with the placement surface in both the first form and the second form, the second supporting unit includes a second attaching section detachably formed on the display unit, and a second base section including a second contact member that is contactable with the placement surface in both the first form and the second form, the first attaching section is provided to be fixable at the first position by three or more first fasteners arranged on a first straight line in the first form, and be fixable at the second position by three or more second fasteners arranged on a second straight line in the second form, and the second attaching section is provided to be fixable at the second position by the three or more second fasteners arranged on the second straight line in the first form, and be fixable at the first position by the three or more first fasteners on the first straight line in the second form.

13. The supporting body according to claim 11, wherein a contact portion of the first contact member with the placement surface in the first form is different from a contact portion of the first contact member with the placement surface in the second form.

14. The supporting body according to claim 11, wherein
a contact area between the placement surface and the first contact member in the first form is narrower than a contact area between the placement surface and the first contact member in the second form, and
a contact area between the placement surface and the second contact member in the first form is narrower than a contact area between the placement surface and the second contact member in the second form.

15. A supporting body that supports a display unit to cause the display unit to stand on a placement surface, the display unit having a display surface that spreads in each of a horizontal direction and a vertical direction, and having a center position in the horizontal direction, and a first edge and a second edge that are positioned opposite to each other in the horizontal direction with the center position interposed therebetween, the supporting body comprising:
a first supporting unit that is detachably provided on the display unit;
a second supporting unit that is detachably provided on the display unit as a body different from the first supporting unit;
a first attaching section detachably formed at the first position of the display unit; and
a second attaching section detachably formed at the second position of the display unit,
wherein a first form and a second form are configured to be selectable,
the first form in which the first supporting unit is mounted at a first position between the center position and the first edge in the horizontal direction of the display unit, and the second supporting unit is mounted at a second position between the center position and the second edge in the horizontal direction of the display unit, and
the second form in which the second supporting unit is mounted at the first position or a third position between the center position and the first edge in the horizontal direction of the display unit, and the first supporting unit is mounted at the second position or a fourth position between the center position and the second edge in the horizontal direction of the display unit,
the first supporting unit includes a first base section that is coupled to the first attaching section in the first form and is coupled to the second attaching section in the second form,
the second supporting unit includes a second base section that is coupled to the second attaching section in the first form and is coupled to the first attaching section in the second form,
the first base section is attachable in a first attitude to the first attaching section detachably provided at the first position of the display unit, and is attachable in a second attitude to the second attaching section detachably provided at the second position of the display unit, and
the second base section is attachable in a third attitude to the first attaching section detachably provided at the first position of the display unit, and is attachable in a fourth attitude to the second attaching section detachably provided at the second position of the display unit.

16. The supporting body according to claim 15, wherein
in the first form, the first base section is attached to the first attaching section in the first attitude, and the second base section is attached to the second attaching section in the fourth attitude, and
in the second form, the second base section is attached to the first attaching section in the third attitude, and the first base section is attached to the second attaching section in the second attitude.

17. A supporting body that supports a display unit to cause the display unit to stand on a placement surface, the display unit having a display surface that spreads in each of a horizontal direction and a vertical direction, and having a center position in the horizontal direction, and a first edge and a second edge that are positioned opposite to each other in the horizontal direction with the center position interposed therebetween, the supporting body comprising:
a first supporting unit that is detachably provided on the display unit;
a second supporting unit that is detachably provided on the display unit as a body different from the first supporting unit;
a first attaching section detachably formed at the first position of the display unit; and
a second attaching section detachably formed at the second position of the display unit,
wherein a first form and a second form are configured to be selectable,
the first form in which the first supporting unit is mounted at a first position between the center position and the first edge in the horizontal direction of the display unit, and the second supporting unit is mounted at a second position between the center position and the second edge in the horizontal direction of the display unit, and the second form in which the second supporting unit is mounted at the first position or a third position between the center position and the first edge in the horizontal direction of the display unit, and the first supporting unit is mounted at the second position or a fourth position between the center position and the second edge in the horizontal direction of the display unit, the first supporting unit includes a first base section that is coupled to the first attaching section in the first form and is coupled to the second attaching section in the second form, the second supporting unit includes a second base section that is coupled to the second attaching section in the first form and is coupled to the first attaching section in the second form, and a first height in the vertical direction from the placement surface to a lower end of the display unit in the first form is higher than a second height in the vertical direction from the placement surface to the lower end of the display unit in the second form.

18. The supporting body according to claim 17, wherein a ratio of a dimension in the vertical direction to a dimension in the horizontal direction of a portion below the first attaching section of the first base section in the first form is larger than a ratio of a dimension in the vertical direction to a dimension in the horizontal direction of a portion below the second attaching section of the first base section in the second form, and a ratio of a dimension in the vertical direction to a dimension in the horizontal direction of a portion below the second attaching section of the second base section in the first form is larger than a ratio of a dimension in the vertical direction to a dimension in the horizontal direction of a portion below the first attaching section of the second base section in the second form.

19. The supporting body according to claim 15, wherein the first base section includes a first coupling section that is connectable to the first attaching section in the first attitude and is connectable to the second attaching section in the second attitude, and the second base section includes a second coupling section that is connectable to the second attaching section in the fourth attitude and is connectable to the first attaching section in the third attitude.

20. A supporting body that supports a display unit to cause the display unit to stand on a placement surface, the display unit having a display surface that spreads in each of a horizontal direction and a vertical direction, and having a center position in the horizontal direction, and a first edge and a second edge that are positioned opposite to each other in the horizontal direction with the center position interposed therebetween, the supporting body comprising:

a first supporting unit that is detachably provided on the display unit;

a second supporting unit that is detachably provided on the display unit as a body different from the first supporting unit;

a first attaching section detachably formed at the first position of the display unit; and a second attaching section detachably formed at the second position of the display unit, wherein a first form and a second form are configured to be selectable, the first form in which the first supporting unit is mounted at a first position between the center position and the first edge in the horizontal direction of the display unit, and the second supporting unit is mounted at a second position between the center position and the second edge in the horizontal direction of the display unit, and the second form in which the second supporting unit is mounted at the first position or a third position between the center position and the first edge in the horizontal direction of the display unit, and the first supporting unit is mounted at the second position or a fourth position between the center position and the second edge in the horizontal direction of the display unit, the first supporting unit includes a first base section that is coupled to the first attaching section in the first form and is coupled to the second attaching section in the second form, the second supporting unit includes a second base section that is coupled to the second attaching section in the first form and is coupled to the first attaching section in the second form, the first base section includes a first contact member that is contactable with the placement surface in both the first form and the second form, the second base section includes a second contact member that is contactable with the placement surface in both the first form and the second form, and a contact portion of the first contact member with the placement surface in the first form is different from a contact portion of the first contact member with the placement surface in the second form.

21. A supporting body that supports a display unit to cause the display unit to stand on a placement surface, the display unit having a display surface that spreads in each of a horizontal direction and a vertical direction, and having a center position in the horizontal direction, and a first edge and a second edge that are positioned opposite to each other in the horizontal direction with the center position interposed therebetween, the supporting body comprising:

a first supporting unit that is detachably provided on the display unit;

a second supporting unit that is detachably provided on the display unit as a body different from the first supporting unit;

a first attaching section detachably formed at the first position of the display unit; and a second attaching section detachably formed at the second position of the display unit, wherein a first form and a second form are configured to be selectable, the first form in which the first supporting unit is mounted at a first position between the center position and the first edge in the horizontal direction of the display unit, and the second supporting unit is mounted at a second position between the center position and the second edge in the horizontal direction of the display unit, and the second form in which the second supporting unit is mounted at the first position or a third position between the center position and the first edge in the horizontal direction of the display unit, and the first supporting unit is mounted at the second position or a fourth position between the center position and the second edge in the horizontal direction of the display unit, the first supporting unit includes a first base section that is coupled to the first attaching section in the first form and is coupled to the second attaching section in the second form, the second supporting unit includes a second base section that is coupled to the second attaching section in the first form and is coupled to the first attaching section in the second form, the first base section includes a first contact member that is contactable with the placement surface in both the first form and the second form, the second base section includes a second contact member that is contactable with the placement surface in both the first form and the second form, a contact area between the placement surface and the first contact member in the first form is narrower than a contact area between the placement surface and the first contact member in the second form, and a contact area between the placement surface and the second contact member in the first form is narrower than a contact area between the placement surface and the second contact member in the second form.

22. The supporting body according to claim 15, wherein
the first base section includes a first plate-like member and a first reinforcing member, the first plate-like member having a first surface that intersects with the vertical direction in the second attitude, and the first reinforcing member being provided to stand on the first surface, and the second base section includes a second plate-like member and a second reinforcing member, the second plate-like member having a second surface that intersects with the vertical direction in the third attitude, and the second reinforcing member being provided to stand on the second surface.

23. A display apparatus provided with a display unit and a supporting body, the display unit having a display surface that spreads in each of a horizontal direction and a vertical direction, and having a center position in the horizontal direction, and a first edge and a second edge that are positioned opposite to each other in the horizontal direction with the center position interposed therebetween, and the supporting body supporting the display unit to cause the display unit to stand on a placement surface, the supporting body comprising:
a first supporting unit that is detachably provided on the display unit; and
a second supporting unit that is detachably provided on the display unit as a body different from the first supporting unit,
wherein a first form and a second form are configured to be selectable,
the first form in which the first supporting unit is mounted at a first position between the center position and the first edge in the horizontal direction of the display unit, and the second supporting unit is mounted at a second position between the center position and the second edge in the horizontal direction of the display unit, and
the second form in which the second supporting unit is mounted at the first position or a third position between the center position and the first edge in the horizontal direction of the display unit, and the first supporting unit is mounted at the second position or a fourth position between the center position and the second edge in the horizontal direction of the display unit,
the first supporting unit includes a first attaching section detachably formed on the display unit, and a first base section including a first contact member that is contactable with the placement surface in both the first form and the second form,
the second supporting unit includes a second attaching section detachably formed on the display unit, and a second base section including a second contact member that is contactable with the placement surface in both the first form and the second form, and
a first installation attitude of the first base section and the second base section with respect to the placement surface in the first form is different from a second installation attitude of the first base section and the second base section with respect to the placement surface in the second form.

* * * * *